(12) United States Patent
Bao et al.

(10) Patent No.: US 10,388,881 B2
(45) Date of Patent: Aug. 20, 2019

(54) SORTING OF CARBON NANOTUBES

(71) Applicants: BASF SE, Ludwigshafen (DE); THE BOARD OF TRUSTEES OF THE LELAND STANFORD JUNIOR UNIVERSITY, Stanford, CA (US)

(72) Inventors: Zhenan Bao, Stanford, CA (US); Ting Lei, Palo Alto, CA (US); Ying-Chih Lai, Taipeh (TW); Huiliang Wang, Mountain View, CA (US); Pascal Hayoz, Hofstetten (CH); Thomas Weitz, Ottobrunn (DE)

(73) Assignees: BASF SE, Ludwigshafen (DE); THE BOARD OF TRUSTEES OF THE LELAND STANFORD JUNIOR UNIVERSITY, Stanford, CA (US)

( * ) Notice: Subject to any disclaimer, the term of this patent is extended or adjusted under 35 U.S.C. 154(b) by 259 days.

(21) Appl. No.: 15/503,242

(22) PCT Filed: Aug. 7, 2015

(86) PCT No.: PCT/IB2015/056035
§ 371 (c)(1),
(2) Date: Feb. 10, 2017

(87) PCT Pub. No.: WO2016/024196
PCT Pub. Date: Feb. 18, 2016

(65) Prior Publication Data
US 2017/0229657 A1 Aug. 10, 2017

Related U.S. Application Data

(60) Provisional application No. 62/045,045, filed on Sep. 3, 2014, provisional application No. 62/048,812, filed on Sep. 11, 2014, provisional application No. 62/164,590, filed on May 21, 2015.

(30) Foreign Application Priority Data

Aug. 12, 2014 (EP) .................................... 14180678

(51) Int. Cl.
*H01L 51/00* (2006.01)
*H01B 1/04* (2006.01)
*C08G 61/12* (2006.01)
*C01B 32/172* (2017.01)
*C01B 32/174* (2017.01)
*C08K 3/04* (2006.01)
*B82Y 40/00* (2011.01)
*H01L 51/05* (2006.01)

(52) U.S. Cl.
CPC ........ *H01L 51/0048* (2013.01); *C01B 32/172* (2017.08); *C01B 32/174* (2017.08); *C08G 61/124* (2013.01); *C08G 61/126* (2013.01); *C08K 3/041* (2017.05); *H01B 1/04* (2013.01); *H01L 51/0007* (2013.01); *H01L 51/0036* (2013.01); *H01L 51/0043* (2013.01); *B82Y 40/00* (2013.01); *C08G 2261/122* (2013.01); *C08G 2261/124* (2013.01); *C08G 2261/1412* (2013.01); *C08G 2261/18* (2013.01); *C08G 2261/228* (2013.01); *C08G 2261/3223* (2013.01); *C08G 2261/334* (2013.01); *C08G 2261/344* (2013.01); *C08G 2261/411* (2013.01); *C08G 2261/92* (2013.01); *H01L 51/0558* (2013.01)

(58) Field of Classification Search
None
See application file for complete search history.

(56) References Cited

U.S. PATENT DOCUMENTS

2012/0104328 A1   5/2012   Park et al.
2014/0158946 A1   6/2014   Wu et al.

FOREIGN PATENT DOCUMENTS

| JP | 2013-141631 A | 7/2013 |
|---|---|---|
| JP | 2013-254912 A | 12/2013 |
| WO | 2012/060601 A2 | 5/2012 |

OTHER PUBLICATIONS

Supplementary European Search Report dated Jun. 20, 2018 in European Patent Application No. 15832571.2, 4 pages.
Zhang, X. et al. "Sorting semiconducting single walled carbon nanotubes by poly(9,9-dioctylfluorene derivatives and application for ammonia gas sensing", Carbon, vol. 94, 2015, pp. 903-910.
Wang, M. et al. "Generalized enhancement of charge injection in bottom contact/top gate polymer field-effect transistors with single-walled carbon nanotubes", Organic Electronics, vol. 15, 2014, pp. 809-817.
International Preliminary Report on Patentability and Written Opinion dated Feb. 23, 2017 in PCT/IB2015/056035.
International Search Report and Written Opinion dated Dec. 25, 2015 in PCT/IB2015/056035.

(Continued)

*Primary Examiner* — Robert T Butcher
(74) *Attorney, Agent, or Firm* — Oblon, McClelland, Maier & Neustadt, L.L.P.

(57) ABSTRACT

Provided is a process for preparing a composition comprising semiconducting single-walled carbon nanotubes, a semiconducting polymer and solvent A (composition A), which process comprises the step of separating composition A from a composition comprising semiconducting and metallic single-walled carbon nanotubes, the semiconducting polymer and solvent B (composition B), wherein the semiconducting polymer has a band gap in the range of 0.5 to 1.8 eV and solvent A and B comprise an aromatic or a heteroaromatic solvent, composition A itself, a process for forming an electronic device, which process comprises the step of forming a layer by applying composition A to a precursor of the electronic device, as well as the electronic device obtainable by this process.

18 Claims, 4 Drawing Sheets

(56) References Cited

OTHER PUBLICATIONS

Kojiro Akazaki et al., "Recognition and One-Pot Extraction of Right- and Left-Handed Semiconducting Single-Walled Carbon Nanotube Enantiomers Using Fluorene-Binaphthol Chiral Copolymers", Journal of the American Chemical Society, vol. 134, Issue 30, 2012, 12700-12707.

Nicolas Berton et al., "Copolymer-Controlled Diameter-Selective Dispersion of Semiconducting Single-Walled Carbon Nanotubes", Chemistry of Materials, vol. 23, Issue 8, 2011, pp. 2237-2249.

Nicolas Berton et al., "Selective Dispersion of Large-Diameter Semiconducting Single-Walled Carbon Nanotubes with Pyridine-Containing Copolymers", Small, vol. 10, Issue 2, 2014, pp. 360-367.

Florian Jakubka et al., "Effect of Polymer Molecular Weight and Solution Parameters on Selective Dispersion of Single-Walled Carbon Nanotubes", ACS Macro Letters, vol. 1, Issue 7, 2012, pp. 815-819.

Ting Lei et al., Diketopyrrolopyrrole (DPP)-Based Donor-Acceptor Polymers for Selective Dispersion of Large-Diameter Semiconducting Carbon Nanotubes, Small, vol. 11, Issue 24, 2015, pp. 2946-2954.

Kevin S. Mistry et al., "High-Yield Dispersions of Large-Diameter Semiconducting Single-Walled Carbon Nanotubes with Tunable Narrow Chirality Distributions", ACS Nano, vol. 7, Issue 3, 2013, pp. 2231-2239.

Adrian Nish et al., "Highly selective dispersion of single-walled carbon nanotubes using aromatic polymers", Nature Nanotechnology, vol. 2, 2007, pp. 640-646.

Long Qian et al., Electrical and Photoresponse Properties of Printed Thin-Film Transistors Based on Poly(9,9-dioctylfluorene-co-bithiophene) Sorted Large-Diameter Semiconducting Carbon Nanotubes, The Journal of Physical Chemistry, vol. 117, 2013, pp. 18243-18250.

Chad Smithson et al., "Using unsorted single-wall carbon nanotubes to enhance mobility of diketopyrrolopyrrole-quarterthiophene copolymer in thin-film transistors", Organic Electronics, vol. 15, Issue 11, Nov. 2014, pp. 2639-2646.

Masayoshi Tange et al., "Selective Extraction of Large-Diameter Single-Wall Carbon Nanotubes with Specific Chiral Indices by Poly(9,9-dioctylfluorene-alt-benzothiadiazole)", Journal of the American Chemical Society, vol. 133, Issue 31, 2011 pp. 11908-11911.

Huiliang Wang et al., "Scalable and Selective Dispersion of Semiconducting Arc-Discharged Carbon Nanotubes by Dithiafulvalene/Thiophene Copolymers for Thin Film Transistors", ACS Nano, vol. 7, Issue 3, 2013, pp. 2659-2668.

Jeong-Yuan Hwang et al., "Polymer Structure and Solvent Effects on the Selective Dispersion of Single-Walled Carbon Nanotubes", Journal of the American Chemical Society, vol. 130, Issue 11, 2008, pp. 3543-3553.

SORTING OF CARBON NANOTUBES

The present invention relates to a process for preparing a composition comprising semiconducting single-walled carbon nanotubes and a semiconducting polymer, to the composition comprising semiconducting single-walled carbon nanotubes and the semiconducting polymer, to an electronic device comprising a layer, which layer comprises semiconducting single-walled carbon nanotubes and a semiconducting polymer, and to the use of the composition comprising semiconducting single-walled carbon nanotubes and a semiconducting polymer as for forming a semiconducting layer.

Single-walled carbon nanotubes (SWNTs) show metallic or semiconducting properties depending on tube diameter and wrapping angle. A number of applications for SWNTs such as organic photovoltaic (OPV) devices and organic field effect transistors (OFETs) specifically require semiconducting SWNTs with minimal metallic SWNTs impurities. Unfortunately, all current growth methods for SWNTs such as arc discharge or laser ablation produce mixtures of semiconducting and metallic SWNTs.

Several methods of separating semiconducting SWNTs and metallic SWNTs are known, but most of them are not yet suitable for large-scale technological processes. An efficient method relies on dispersing semiconducting SWNTs and metallic SWNTs with polymer, followed by centrifugation.

Nish, A.; Hwang, J.-Y.; Doig, J.; Nicholas, R. J. Nat. Nano 2007, 2, 640-646 describes several polymers and copolymers comprising fluorene units as dispersants for SWNTs. Poly(9,9-diocylfluorenyl-2,7-diyl) (PFO) as dispersant shows the highest selectivity.

Berton, N.; Lemasson, F.; Tittmann, J.; Stürzl, N.; Hennrich, F.; Kappes, M. M.; Mayor, M. Chem. Mat. 2011, 23, 2237-2249 describes several copolymers comprising either fluorene or carbazole units separated by naphthalene, anthracene and anthraquinone spacer as dispersants for SWNTs.

Tange, M.; Okazaki, T.; Iijima, S. J. Am. Chem. Soc. 2011, 133, 11908-11911 describes poly(9,9-diocylfluorene-alt-benzothiadiazole) (F8BT) and poly(9,9-di-n-dodecylfluorene)(PFD) as dispersants for SWNTs. In particular, F8BT selectively separates large (>1.3 nm) diameter SWNTs.

Akazaki, K.; Toshimitsu, F.; Ozawa, H.; Fujigaya T.; Nakashima, N. J. Am. Chem. Soc. 2012, 134, 12700-12707 describes 12 copolymers (9,9-dioctylfluorene-2,7-diyl)$_x$ ((R)— or (S)-2,2'-dimethoxy-1,1'-binaphthalen-6,6-diyl)$_y$, where x and y are copolymer composition ratios, as dispersant for SWNTs.

Jakubka, F.; Schiessl, S. P.; Martin, S.; Englert, J. M.; Hauke, F.; Hirsch A., Zaumseil, J. ACS Marco Lett. 2012, 1, 815-819 describes poly(9,9-dioctylfluorene) and poly(9,9-dioctylfluoreneco-benzothiadiazole) as dispersants for SWNTs.

Misty, K. S.; Larsen, B. A.; Blackburn, J. L. ACS Nano 2013, 7, 2231-2239 describes poly[(9,9-dioctylfluorenyl-2,7-diyl)-alt-co-(6,6'-(2,2'-bipyridine))] and poly[(9,9-dihexylfluorenyl-2,7-diyl)-co-(9,10-anthracene)] as dispersants for laser vaporization SNWTs with average diameter of 1.3 nm.

Qian, L.; Xu, W.; Fan, X.; Wang, C.; Zhang, J.; Zhao, J.; Cui, Z. J. Phys. Chem. 2013, C$_{117, 18243}$-18250 describes 9,9-dioctylfluorene-co-bithiophene as dispersant for SWNTs in order to selectively separate large diameter SWNTs from commercial arc discharge SWNTs.

Wang, H.; Mei, J.; Liu, P.; Schmidt, K.; Jimenez-Oses, G.; Osuna, S.; Fang, L.; Tassone, C. T.; Zoombelt, A. P.; Sokolov, A. N.; Houk K. N.; Toney, M. F.; Bao, Z. ACS Nano 2013, 7, 2659-2668 describes poly(dithiafulvalene-fluorene-co-m-thiophene) as dispersants for separating semiconducting SWNTs from arc-discharged 1.1-1.8 nm SWNTs.

Berton, N.; Lemasson, F.; Poschlad, A.; Meded, V.; Tristram F.; Wenzel, W.; Hennrich, F.; Kappes, M. M.; Mayor, M. Small 2014, 10, 360-367 describes poly(fluorene-alt-pyridine) copolymers each with 2,7-fluorene units but varying by the connectivity of the pyridyl group as well as a poly(carbazole-alt-pyridine) copolymer as dispersant for SWNTs to selectively separate large (>1 nm and up to 1.3 nm) diameter SWNTs.

Semiconducting polymers as dispersant for SWNTs in separation processes based on centrifugation are particularly useful, as the product of the centrifugation process comprising the semiconducting polymer and the semiconducting SWNT can be used directly in the preparation of organic devices such as organic field effect transitors (OFETs).

Lee, H. W.; Yoon, Y.; Park, S.; Oh, J. H.; Hong, S.; Liyanage, L. S.; Wan, H.; Morishita, S.; Patil, N.; Park, Y. J.; Park, J. J.; Spakowitz, A.; Galli, G.; Gygi, F.; Wong, P. H.-S.; Tok, J. B.-H.; Kim, J. M.; Bao, Z. Nat. Commun. 2011, 2, 541-548 describes regioregular poly(3-alkylthiophene), which is commonly used as semiconducting material in organic electronic devices such as organic field effect transistors (OFETs), as dispersant for SWNTs. A transistor is described comprising regioregular poly(3-alkylthiophene) and semiconducting SWNT.

US 2012/0104328 describes a polythiophene derivative including a thiophene ring and a hydrocarbon sidechain linked to the thiophene ring. A transistor is described comprising the polythiophene derivative and semiconducting SWNTs.

Smithson, C; Wu, Y.; Wigglesworth, T.; Gardner, S.; Thu, S.; Nie H.-Y. Organic Electronics 2014, 15, 2639-2646 describes the fabrication of an organic thin film transistor using a semiconductor copolymer of diketppyrrolopyrrole-quarterthiophene and unsorted SWNTs.

It was the object of the present invention to provide a process for the preparation of a composition comprising semiconducting single-walled carbon nanotubes and a semiconducting polymer, which composition is suitable for forming a semiconducting layer in an electronic device, preferably in an organic field effect transistor (OFET), and leading to OFETs showing a high charge carrier mobility and a high on/off ratio.

This object is solved by the process of claim 1, the composition of claim 14, the process of claim 15, the electronic device of claim 16 and the use of claim 18.

The process of the present invention is a process for preparing a composition comprising semiconducting single-walled carbon nanotubes, a semiconducting polymer and solvent A (composition A), which process comprises the step of separating composition A from a composition comprising semiconducting and metallic single-walled carbon nanotubes, the semiconducting polymer and solvent B (composition B), wherein the semiconducting polymer has a band gap in the range of 0.5 to 1.8 eV, and solvent A and solvent B comprise an aromatic or a heteroaromatic solvent.

The band gap is the energy difference between the highest occupied molecular orbital (HOMO) and the lowest unoccupied molecular orbital (LUMO). The band gap ($Eg^{opt}$) is determined from the absorption onset ($\lambda$ onset) of the semiconducting polymer using the following equation:

$$Eg^{opt} \text{ [eV]} = \text{Planck constant [eV s]} \times \text{speed of light [nm s}^{-1}\text{]} / \lambda \text{ onset [nm]},$$

wherein the absorption onset (λ onset) of the semiconducting polymer is determined from the thin film UV-Vis-NIR spectra of the semiconducting polymer at 25° C. and represents the wavelength at the intersection of the tangent at the most red shifted point of inflection of the absorption curve and the baseline (absorption =0).

FIG. 5 illustrates how to determine the absorption onset (λ onset) of the semiconducting polymer from the thin film UV-Vis-NIR spectra of the semiconducting polymer at 25° C.

Preferably, the semiconducting polymer has a band gap in the range of 0.6 to 1.7 eV. Even more preferably, the semiconducting polymer has a band gap in the range of 0.8 to 1.6 eV. Most preferably, the semiconducting polymer has a band gap in the range of 1.0 to 1.5 eV Aromatic solvents can be selected from the group consisting of benzene, naphthalene, biphenyl and mixtures thereof, which benzene, naphthalene and biphenyl can be substituted with one to four substitutents independently selected from the group consisting of halogen, $C_{1-20}$-alkyl, $C_{2-20}$-alkenyl, $C_{2-20}$-alkynyl, $C_{5-12}$-cycloalkyl, CN, $NO_2$, OH, SH, $NR^{1000}R^{2000}$, CHO, CO—$C_{1-20}$-alkyl, COO—$C_{1-20}$-alkyl, $CONR^{1000}R^{2000}$, O—$C_{1-20}$-alkyl, S—$C_{1-20}$-alkyl, O—$C_{2-20}$-alkenyl and O—$C_{2-20}$-alkynyl, and which benzene, naphthalene and biphenyl can be annulated with an —$CH_2$—$CH_2$—$CH_2$— or —$CH_2$—$CH_2$—$CH_2$—$CH_2$—, which —$CH_2$—$CH_2$—$CH_2$— or —$CH_2$—$CH_2$—$CH_2$—$CH_2$— can be substituted with $C_{1-20}$-alkyl or O—$C_{1-20}$-alkyl, or wherein one or two of the $CH_2$ groups of —$CH_2$—$CH_2$—$CH_2$— or —$CH_2$—$CH_2$—$CH_2$—$CH_2$— can be replaced by O, S or N—$R^{1000}$, wherein $R^{1000}$ and $R^{2000}$ are independently and at each occurrence H or $C_{1-20}$-alkyl, wherein $C_{1-20}$-alkyl can be substituted with one or more halogen.

Examples of aromatic solvents are benzene, toluene, o-xylene, m-xylene, p-xylene, 1,3,5-trimethylbenzene (mesitylene), 1,2,3-trimethylbenzene, 1,2,4-trimethylbenzene, chlorobenzene, 1,2-dichlorobenzene (ortho-dichlorobenzene), 1,3-dichlorobenzene, 1,2,4-trichlorobenzene, indane, tetraline, methoxybenzene (anisol), ethylbenzene, 1,2-diethylbenzene, 1,3-diethylbenzene, 1,4-diethylbenzene, propyl-benzene, butyl-benzene, tert-butyl-benzene, isopropylbenzene, 1-methylnaphthalene, 2-methylnaphthalene and 1-chloronaphthalene.

Heteroaromatic solvents can be selected from the group consisting of thiophene, furan, pyridine, pyrrole, pyrimidine and mixtures thereof, which thiophene, furan, pyridine, pyrrole and pyrimidine can be substituted with one to four substitutents independently selected from the group consisting of halogen, $C_{1-20}$-alkyl, $C_{2-20}$-alkenyl, $C_{2-20}$-alkynyl, $C_{5-12}$-cycloalkyl, CN, $NO_2$, OH, SH, $NR^{1000}R^{2000}$, CHO, CO—$C_{1-20}$-alkyl, COO—$C_{1-20}$-alkyl, $CONR^{1000}R^{2000}$, O—$C_{1-20}$-alkyl, S—$C_{1-20}$-alkyl, O—$C_{2-20}$-alkenyl and O—$C_{2-20}$-alkynyl, and which thiophene, furan, pyridine, pyrrole and pyrimidine can be annulated with an —$CH_2$—$CH_2$—$CH_2$— or —$CH_2$—$CH_2$—$CH_2$—$CH_2$—, which —$CH_2$—$CH_2$—$CH_2$— and $CH_2$—$CH_2$—$CH_2$—$CH_2$— can be substituted with $C_{1-20}$-alkyl or O—$C_{1-20}$-alkyl, or wherein one or two of the $CH_2$ groups of —$CH_2$—$CH_2$—$CH_2$— and $CH_2$—$CH_2$—$CH_2$—$CH_2$— can be replaced by O, S or N—$R^{1000}$, wherein $R^{1000}$ and $R^{2000}$ are independently and at each occurrence H or $C_{1-20}$-alkyl, wherein $C_{1-20}$-alkyl can be substituted with one or more halogen.

Examples of heteroaromatic solvents are thiophene, 2-methyl-thiophene, 3-methyl-thiophene, pyridine, 2-methyl-pyridine, 3-methyl-pyridine, 4-methyl-pyridine, 2,4-dimethyl-pyridine and 2,4,6-trimethylpyridine.

Preferably, solvent B comprises an aromatic solvent.

More preferably, solvent B comprises at least 40% by weight of an aromatic solvent based on the weight of solvent B, which aromatic solvent is selected from the group consisting of benzene, toluene, o-xylene, m-xylene, p-xylene, 1,3,5-trimethylbenzene (mesitylene), 1,2,3-trimethylbenzene, 1,2,4-trimethylbenzene, chloro-benzene, 1,2-dichlorobenzene (ortho-dichlorobenzene), 1,3-dichlorobenzene, 1,2,4-trichlorobenzene, indane, tetraline, methoxybenzene (anisol), ethylbenzene, propyl-benzene, butyl-benzene, tert-butyl-benzene, isopropylbenzen and mixtures thereof.

Even more preferably, solvent B comprises at least 60% by weight of an aromatic solvent based on the weight of solvent B, which aromatic solvent is selected from the group consisting of toluene, o-xylene, m-xylene, p-xylene, 1,3,5-trimethylbenzene (mesitylene), chloro-benzene, 1,2-dichlorobenzene (ortho-dichlorobenzene), indane, tetraline, methoxybenzene (anisol) and mixtures thereof.

Most preferably, solvent B comprises at least 80% by weight of an aromatic solvent based on the weight of solvent B, which aromatic solvent is selected from the group consisting of toluene, mesitylene, chlorobenzene, ortho-dichlorobenzene, methoxybenzene (ansiol) and mixtures thereof.

In particular, solvent B is toluene.

Preferably, composition B contains 20 to 95% by weight of semiconducting single-walled carbon nanotubes and 80-5% by weight of metallic single-walled carbon nanotubes based on the sum of the weight of semiconducting and metallic single-walled carbon nanotubes.

More preferably, composition B contains 50 to 90% by weight of semiconducting single-walled carbon nanotubes and 50-10% by weight of metallic single-walled carbon nanotubes based on the sum of the weight of semiconducting and metallic single-walled carbon nanotubes.

Most preferably, composition B contains 60 to 80% by weight of semiconducting single-walled carbon nanotubes and 40-20% by weight of metallic single-walled carbon nanotubes based on the sum of the weight of semiconducting and metallic single-walled carbon nanotubes.

In particular, composition B contains 65 to 85% by weight of semiconducting single-walled carbon nanotubes and 35-25% by weight of metallic single-walled carbon nanotubes based on the sum of the weight of semiconducting and metallic single-walled carbon nanotubes.

Preferably, the diameter of the semiconducting and metallic single-walled carbon nanotubes in composition B is in the range of 0.5 to 5 nm. More preferably, the diameter of the semiconducting and metallic single-walled carbon nanotubes in composition B is in the range of 0.8 to 2.5 nm. Most preferably, the diameter of the semiconducting and metallic single-walled carbon nanotubes in composition B is in the range of 1.0 to 2.0 nm.

Preferably, the concentration of the sum of semiconducting and metallic single-walled carbon nanotubes in composition B is in the range of 0.001 to 3% by weight based on the weight of composition B. More preferably, the concentration of the sum of semiconducting and metallic single-walled carbon nanotubes in composition B is in the range of 0.01 to 2% by weight based on the weight of composition B. Most preferably, the concentration of the sum of semiconducting and metallic single-walled carbon nanotubes in composition B is in the range of 0.1 to 1% by weight based on the weight of composition B.

Preferably, the weight ratio of the sum of semiconducting and metallic single-walled carbon nanotubes/semiconducting polymer in composition B is in the range of 0.01/1 to 10/1. Preferably, the weight ratio of the sum of semiconducting and metallic single-walled carbon nanotubes/semiconducting polymer in composition B is in the range of 0.05/1 to 5/1. More preferably, the weight ratio of the sum of semiconducting and metallic single-walled carbon nanotubes/semiconducting polymer in composition B is in the range of 0.25/1 to 3/1.

For example, composition B can be prepared by mixing solvent B with the mixture of semiconducting and metallic single-walled carbon nanotubes. The mixture of semiconducting and metallic single-walled carbon nanotubes can be prepared by methods known in the art such as arc discharge, laser ablation or catalytic decomposition of carbon bearing molecules (CVD).

Preferably, the mixture of semiconducting and metallic single-walled carbon nanotubes is prepared by arc discharge.

Usually, composition B is mixed using ultrasonification before the separation step.

Preferably, composition A is separated from composition B by a centrifugation process. Preferably, the angular velocity used in the centrifugation process is in the range of 1'000 to 100'000 rpm. More preferably, the angular velocity used in the centrifugation process is in the range of 5'000 to 50'000 rpm. Even more preferably, the angular velocity used in the centrifugation process is in the range of 10'000 to 30'000 rpm. Most preferably, the angular velocity used in the centrifugation process is in the range of 12'000 to 25'000 rpm.

Any suitable type of centrifuge can be used in the centrifugation process such as microcentrifuge, high-speed centrifuge and ultracentrifuge. Preferably, a high-speed centrifuge is used.

Usually, the centrifugation process is performed at a temperature of 0 to 100° C., more preferably 0 to 50° C., even more preferably 0 to 30° C., most preferably 5 to 20° C., and in particular 10 to 20° C.

Preferably, the centrifugation process is followed by the collection of the supernatant liquid, which can optionally be diluted with a solvent, in order to obtain composition A.

Preferably, solvent A comprises an aromatic solvent.

More preferably, solvent A comprises at least 40% by weight of an aromatic solvent based on the weight of solvent A, which aromatic solvent is selected from the group consisting of benzene, toluene, o-xylene, m-xylene, p-xylene, 1,3,5-trimethylbenzene (mesitylene), 1,2,3-trimethylbenzene, 1,2,4-trimethylbenzene, chloro-benzene, 1,2-dichlorobenzene (ortho-dichlorobenzene), 1,3-dichlorobenzene, 1,2,4-trichlorobenzene, indane, tetraline, methoxybenzene (anisol), ethylbenzene, propyl-benzene, butyl-benzene, tert-butyl-benzene, isopropylbenzen and mixtures thereof.

Even more preferably, solvent A comprises at least 60% by weight of an aromatic solvent based on the weight of solvent A, which aromatic solvent is selected from the group consisting of toluene, o-xylene, m-xylene, p-xylene, 1,3,5-trimethylbenzene (mesitylene), chloro-benzene, 1,2-dichlorobenzene (ortho-dichlorobenzene), indane, tetraline, methoxybenzene (anisol) and mixtures thereof.

Most preferably, solvent A comprises at least 80% by weight of an aromatic solvent based on the weight of solvent A, which aromatic solvent is selected from the group consisting of toluene, mesitylene, chlorobenzene, ortho-dichlorobenzene, methoxybenzene (ansiol) and mixtures thereof.

In particular, solvent A is toluene.

Composition A contains either essentially no metallic single-walled carbon nanotubes or, if metallic single-walled carbon nanotubes are present in composition A, the weight ratio of semiconducting single-walled carbon nanotubes/ metallic single-walled carbon nanotubes of composition A is larger than the weight ratio of semiconducting single-walled carbon nanotubes/metallic single-walled carbon nanotubes of composition B.

Preferably, the semiconducting polymer is a polymer comprising at least one unit of formula

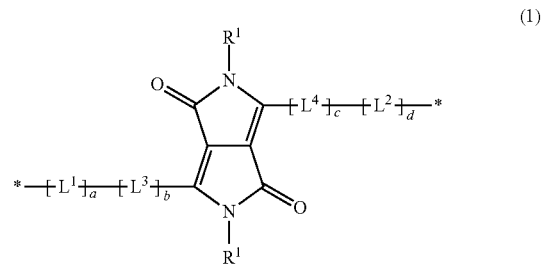

or of formula

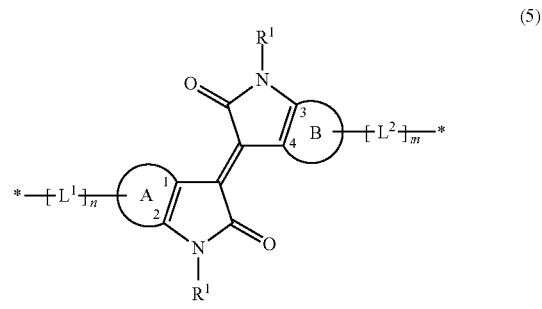

wherein
b and c are independently from each other 1, 2, 3, 4, 5 or 6,
a and d are independently from each other 0, 1, 2, 3 or 4,
n and m are independently from each other 0, 1, 2, 3 or 4,
$R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-15}$-aryl, a 5 to 20 membered heteroaryl, C(O)—$C_{1-100}$-alkyl, C(O)—$C_{5-12}$-cycloalkyl and C(O)—$OC_{1-100}$-alkyl,
  wherein
  $C_{1-100}$-alkyl, $C_{2-100}$-alkenyl and $C_{2-100}$-alkynyl can be substituted with one to forty substituents independently selected from the group consisting of $C_{5-8}$-cycloalkyl, $C_{6-14}$-aryl, 5 to 14 membered heteroaryl, $OR^a$, OC(O)—$R^a$, C(O)—$OR^a$, C(O)—$R^a$, $NR^aR^b$, $NR^a$—C(O)$R^b$, C(O)—$NR^aR^b$, N[C(O)$R^a$][C(O)$R^b$], $SR^a$, Si($R^{Sia}$)($R^{Sib}$)($R^{Sic}$), —O—Si($R^{Sia}$)($R^{Sib}$)($R^{Sic}$), halogen, CN, and $NO_2$; and at least two $CH_2$-groups, but not adjacent $CH_2$-groups, of $C_{1-100}$-alkyl, $C_{2-100}$-alkenyl and $C_{2-100}$-alkynyl can be replaced by O or S,
  $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, OC(O)—$R^a$, C(O)—$OR^a$, C(O)—$R^a$, $NR^aR^b$, $NR^a$—C(O)$R^b$, C(O)—$NR^aR^b$, N[C(O)$R^a$][C(O)$R^b$], $SR^a$, Si($R^{Sia}$)($R^{Sib}$)($R^{Sic}$), —O—Si($R^{Sia}$)($R^{Sib}$)($R^{Sic}$), halogen, CN, and $NO_2$; and one or two $CH_2$-groups, but not adjacent $CH_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^aR^b$, $NR^a$—$C(O)R^b$, $C(O)$—$NR^aR^b$, $N[C(O)R^a][C(O)R^b]$, $SR^a$, $Si(R^{Sia})(R^{Sib})(R^{Sic})$, —O—$Si(R^{Sia})(R^{Sib})(R^{Sic})$, halogen, CN, and $NO_2$, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sid}R^{Sie}]_o$—$R^{Sif}$, $NR^5R^6$, halogen and O—C(O)—$R^5$, wherein o is an integer from 1 to 50, $R^{Sid}$, $R^{Sie}$, $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, O—$C_{6-14}$-aryl, O-5 to 14 membered heteroaryl, —[O—$SiR^{Sig}R^{Sih}]_p$—$R^{Sii}$, $NR^{50}R^{60}$, halogen and O—C(O)—$R^{50}$;

wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{500}R^{600}$, halogen and O—C(O)—$R^{500}$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$ halogen, CN, and $NO_2$; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$ halogen, CN, and $NO_2$; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^cR^d$, $NR^c$—$C(O)R^d$, $C(O)$—$NR^cR^d$, $N[C(O)R^c][C(O)R^d]$, $SR^c$, $Si(R^{Sij})(R^{Sik})(R^{Sil})$, —O—$Si(R^{Sij})(R^{Sik})(R^{Sil})$, halogen, CN and $NO_2$;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{6-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{6-6}$-cycloalkyl, O—$C_{6-10}$-aryl, O-5 to 10 membered heteroaryl, $NR^7R^8$, halogen, and O—C(O)—$R^7$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{6-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{6-6}$-cycloalkyl, O—$C_{6-10}$-aryl, O-5 to 10 membered heteroaryl, —[O—$SiR^{Sip}R^{Siq}]_r$—$R^{Sir}$, $NR^{70}R^{80}$, halogen, and O—C(O)—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{6-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{6-6}$-cycloalkyl, O—$C_{6-10}$-aryl, O-5 to 10 membered heteroaryl, O—$Si(CH_3)_3$, $NR^{700}R^{800}$, halogen and O—C(O)—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{6-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen, CN and $NO_2$, $L^1$ and are $L^2$ are independently from each other and at each occurrence selected from the group consisting of $C_{6-18}$-arylene, 5 to 20 membered heteroarylene,

wherein $C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, $NR^{31}$—$C(O)R^{32}$, $C(O)$—$NR^{31}R^{32}$, $N[C(O)R^{31}][C(O)R^{32}]$, $SR^{31}$, halogen, CN, $SiR^{Siv}R^{Siw}R^{Six}$ and OH, and wherein

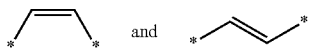

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $C(O)—R^{41}$, $C(O)—NR^{41}R^{42}$, $C(O)—OR^{41}$ and CN, wherein
$R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, $OC(O)—R^i$, $C(O)—OR^i$, $C(O)—R^i$, $NR^iR^j$, $NR^i—C(O)R^j$, $C(O)—NR^iR^j$, $N[C(O)R^i][C(O)R^j]$, $SR^i$, halogen, CN, $SiR^{Siv}R^{Siw}R^{Six}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, $OC(O)—R^i$, $C(O)—OR^i$, $C(O)—R^i$, $NR^iR^j$, $NR^i—C(O)R^j$, $C(O)—NR^iR^j$, $N[C(O)R^i][C(O)R^j]$, $SR^i$, halogen, CN, $SiR^{Siv}R^{Siw}R^{Six}$ and $NO_2$; and one or two $CH_2$-groups, but not adjacent $CH_2$-groups, of $C_{5-12}$-cycloalkyl can be replaced by O, S, OC(O), CO, $NR^i$ or $NR^i—CO$, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)—R^j$, $C(O)—OR^i$, $C(O)—R^i$, $NR^iR^j$, $NR^i—C(O)R^j$, $C(O)—NR^iR^j$, $N[C(O)R^i][C(O)R^j]$, $SR^i$, halogen, CN, $SiR^{Siv}R^{Siw}R^{Six}$ and $NO_2$, wherein
$R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and $O—Si(CH_3)_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)—R^l$, $C(O)—OR^k$, $C(O)—R^k$, $NR^kR^l$, $NR^k—C(O)R^l$, $C(O)—NR^kR^l$, $N[C(O)R^k][C(O)R^l]$, $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)—R^l$, $C(O)—OR^k$, $C(O)—R^k$, $NR^kR^l$, $NR^k—C(O)R^l$, $C(O)—NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)—R^l$, $C(O)—OR^k$, $C(O)—R^k$, $NR^kR^l$, $NR^k—C(O)R^l$, $C(O)—NR^kR^l$, $N[C(O)R^k][C(O)R^l]$, $SR^k$, halogen, CN, and $NO_2$;

wherein
$R^k$ and $R^l$ are independently selected from the group consisting of H, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and $NO_2$, $L^3$ and are $L^4$ are independently from each other and at each occurrence selected from the group consisting of $C_{6-18}$-arylene and 5 to 20 membered heteroarylene wherein
$C_{6-18}$-arylene and 5 to 20 membered heteroarylene can be substituted with one to six substituents $R^9$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{91}$, $OC(O)—R^{91}$, $C(O)—OR^{91}$, $C(O)—R^{91}$, $NR^{91}R^{92}$, $NR^{91}—C(O)R^{92}$, $C(O)—NR^{91}R^{92}$, $N[C(O)R^{91}][C(O)R^{92}]$, $SR^{91}$, halogen, CN, $SiR^{Siy}R^{Siz}R^{Siaa}$ and OH, and wherein
$R^{91}$ and $R^{92}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^m$, $OC(O)—R^m$, $C(O)—OR^m$, $C(O)—R^m$, $NR^mR^n$, $NR^m—C(O)R^n$, $C(O)—NR^mR^n$, $N[C(O)R^m][C(O)R^n]$, $SR^n$, halogen, CN, $SiR^{Siy}R^{Siz}R^{Siaa}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^m$, $OC(O)—R^m$, $C(O)—OR^m$, $C(O)—R^m$, $NR^mR^n$, $NR^m—C(O)R^n$, $C(O)—NR^mR^n$, $N[C(O)R^m][C(O)R^n]$, $SR^m$, halogen, CN, $SiR^{Siy}R^{Siz}R^{Siaa}$ and $NO_2$; and one or two $CH_2$-groups, but not adjacent $CH_2$-groups, of $C_{5-12}$-cycloalkyl can be replaced by O, S, OC(O), CO, $NR^m$ or $NR^m—CO$, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^m$, $OC(O)—R^m$, $C(O)—OR^m$, $C(O)—R^m$, $NR^mR^n$, NR'''—C(O)R'', C(O)—NR'''R'', N[C(O)R'''][C(O)R''], SR''', halogen, CN, SiR$^{Siy}$R$^{Siz}$, S$^{Siaa}$ and NO$_2$, R$^{Siy}$, R$^{Siz}$, R$^{Siaa}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, wherein R''' and R'' are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^{o}$, OC(O)—R$^{o}$, C(O)—OR$^{o}$, C(O)—R$^{o}$, NR$^{o}$R$^{p}$, NR$^{o}$—C(O)R$^{p}$, C(O)—NR$^{o}$R$^{p}$, N[C(O)R$^{o}$][C(O)R$^{p}$], SR$^{o}$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^{o}$, OC(O)—R$^{o}$, C(O)—OR$^{o}$, C(O)—R$^{o}$, NR$^{o}$R$^{p}$, NR$^{o}$—C(O)R$^{p}$, C(O)—NR$^{o}$R$^{p}$, N[C(O)R$^{o}$][C(O)R$^{p}$], SR$^{o}$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^{o}$, OC(O)—R$^{o}$, C(O)—OR$^{o}$, C(O)—R$^{o}$, NR$^{o}$R$^{p}$, NR$^{o}$—C(O)R$^{p}$, C(O)—NR$^{o}$R$^{p}$, N[C(O)R$^{o}$][C(O)R$^{p}$], SR$^{o}$, halogen, CN, and NO$_2$;

wherein

R$^{o}$ and R$^{p}$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, A is selected from the group consisting of

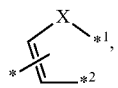 A1

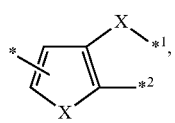 A2

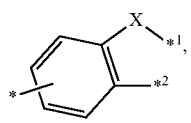 A3

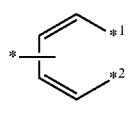 A4

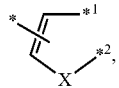 A5

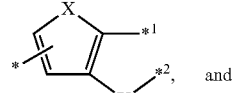 A6 and

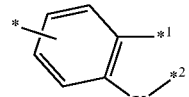 A7 and

B is selected from the group consisting of

 B1

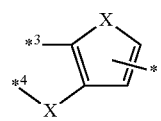 B2

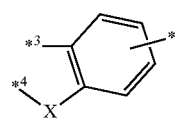 B3

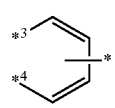 B4

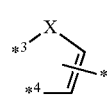 B45

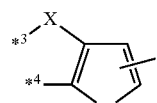 B6 and

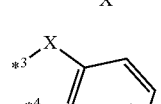 B7 wherein

X is at each occurrence O, S or NR$^1$,

A1, A2, A3, A4, A5, A6, A7, B1, B2, B3, B4, B5, B6 or B7 can be substituted with one to three substituents R$^2$, R$^2$ is at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl, 5 to 20 membered heteroaryl, OR$^{21}$, OC(O)—R$^{21}$, C(O)—OR$^{21}$, C(O)—R$^{21}$, NR$^{21}$R$^{22}$, NR$^{21}$—C(O)R$^{22}$, C(O)—NR$^{21}$R$^{22}$, N[C(O)R$^{21}$][C(O)R$^{22}$], SR$^{21}$, halogen, CN, SiR$^{Sis}$R$^{Sit}$R$^{Siu}$ and OH, wherein R$^{21}$ and R$^{22}$ and are independently selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, $OC(O)—R^e$, $C(O)—OR^e$, $C(O)—R^e$, $NR^eR^f$, $NR^e—C(O)R^f$, $C(O)—NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^e$, $OC(O)—R^e$, $C(O)—OR^e$, $C(O)—R^e$, $NR^eR^f$, $NR^e—C(O)R^f$, $C(O)—NR^eR^f$, $N[C(O)R^e][C(O)R^f]$, $SR^e$, halogen, CN, $SiR^{Sis}R^{Sit}R^{Siu}$ and $NO_2$; and one or two $CH_2$-groups, but not adjacent $CH_2$-groups, of $C_{5-12}$-cycloalkyl can be replaced by O, S, OC(O), CO, $NR^e$ or $NR^e—CO$, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^e$, $OC(O)—R^e$, $C(O)—OR^e$, $C(O)—R^e$, $NR^eR^f$, $NR^e—C(O)R^f$, $C(O)—NR^eR^f$, $N[C(O)R^e][C(O)R^f]$, $SR^e$, halogen, CN, $SiR^{Sis}R^{Sit}R^{Siu}$ and $NO_2$, $R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and $O—Si(CH_3)_3$, wherein
$R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)—R^g$, $C(O)—OR^g$, $C(O)—R^g$, $NR^gR^h$, $NR^g—C(O)R^h$, $C(O)—NR^gR^h$, $N[C(O)R^g][C(O)R^h]$, $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)—R^g$, $C(O)—OR^g$, $C(O)—R^g$, $NR^gR^h$, $NR^g—C(O)R^h$, $C(O)—NR^gR^h$, $N[C(O)R^g][C(O)R^h]$, $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)—R^g$, $C(O)—OR^g$, $C(O)—R^g$, $NR^gR^h$, $NR^g—C(O)R^h$, $C(O)—NR^gR^h$, $N[C(O)R^g][C(O)R^h]$, $SR^g$, halogen, CN, and $NO_2$;

wherein
$R^g$ and $R^h$ are independently selected from the group consisting of H, $C_{1-10}$-alkyl, $C_{2-10}$-alkenyl and $C_{2-10}$-alkynyl, wherein
$C_{1-10}$-alkyl, $C_{2-10}$-alkenyl and $C_{2-10}$-alkynyl can be substituted with one to five substituents selected from the group consisting of halogen, CN and $NO_2$.

Halogen can be F, Cl, Br and I.

$C_{1-4}$-alkyl, $C_{1-10}$-alkyl, $C_{1-20}$-alkyl, $C_{1-30}$-alkyl, $C_{1-36}$-alkyl, $C_{1-50}$-alkyl, $C_{1-60}$-alkyl and $C_{1-100}$-alkyl can be branched or unbranched. Examples of $C_{1-4}$-alkyl are methyl, ethyl, n-propyl, isopropyl, n-butyl, sec-butyl, isobutyl and tert-butyl. Examples of $C_{1-10}$-alkyl are $C_{1-4}$-alkyl, n-pentyl, neopentyl, isopentyl, n-(1-ethyl)propyl, n-hexyl, n-heptyl, n-octyl, n-(2-ethyl)hexyl, n-nonyl and n-decyl. Examples of $C_{1-20}$-alkyl are $C_{1-10}$-alkyl and n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$). Examples of $C_{1-30}$-alkyl, $C_{1-36}$-alkyl, $C_{1-60}$-alkyl, $C_{1-60}$-alkyl and $C_{1-100}$-alkyl are $C_{1-20}$-alkyl and n-docosyl ($C_{22}$), n-tetracosyl ($C_{24}$), n-hexacosyl ($C_{26}$), n-octacosyl ($C_{28}$) and n-triacontyl ($C_{30}$).

$C_{2-10}$-alkenyl, $C_{2-20}$-alkenyl, $C_{2-30}$-alkenyl, $C_{2-60}$-alkenyl and $C_{2-100}$-alkenyl can be branched or unbranched. Examples of $C_{2-10}$-alkenyl are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl and docenyl. Examples of $C_{2-20}$-alkenyl are $C_{2-10}$-alkenyl and linoleyl ($C_{18}$), linolenyl ($C_{18}$), oleyl ($C_{18}$), and arachidonyl ($C_{20}$). Examples of $C_{2-30}$-alkenyl, $C_{2-60}$-alkenyl and $C_{2-100}$-alkenyl are $C_{2-20}$-alkenyl and erucyl ($C_{22}$).

$C_{2-10}$-alkynyl, $C_{2-20}$-alkynyl, $C_{2-30}$-alkynyl, $C_{2-60}$-alkynyl and $C_{2-100}$-alkynyl can be branched or unbranched. Examples of $C_{2-10}$-alkynyl are ethynyl, 2-propynyl, 2-butynyl, 3-butynyl, pentynyl, hexynyl, heptynyl, octynyl, nonynyl and decynyl. Examples of $C_{2-20}$-alkynyl, $C_{2-30}$-alkenyl, $C_{2-60}$-alkynyl and $C_{2-100}$-alkynyl are $C_{2-10}$-alkynyl and undecynyl, dodecynyl, undecynyl, dodecynyl, tridecynyl, tetradecynyl, pentadecynyl, hexadecynyl, heptadecynyl, octadecynyl, nonadecynyl and icosynyl ($C_{20}$).

Examples of $C_{5-6}$-cycloalkyl are cyclopentyl and cyclohexyl. Examples of $C_{5-8}$-cycloalkyl are $C_{5-6}$-cycloalkyl and cycloheptyl and cyclooctyl. $C_{5-12}$-cycloalkyl are $C_{5-8}$-cycloalkyl and cyclononyl, cyclodecyl, cycloundecyl and cyclododecyl.

Examples of $C_{6-10}$-aryl are phenyl,

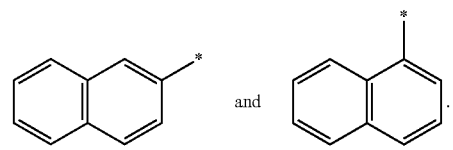 [SMILES: *c1ccc2ccccc2c1 ; *c1cccc2ccccc12]

Examples of $C_{6-14}$-aryl are $C_{6-10}$-aryl and

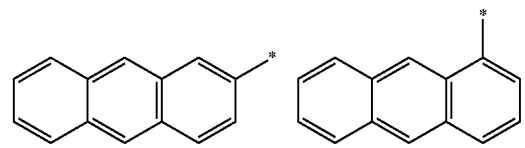

-continued

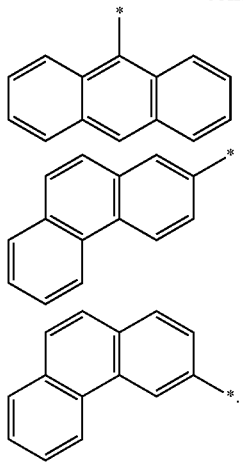

and

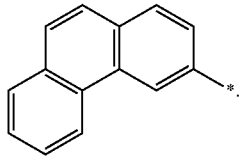

Examples of $C_{6-18}$-aryl are $C_{6-14}$-aryl and

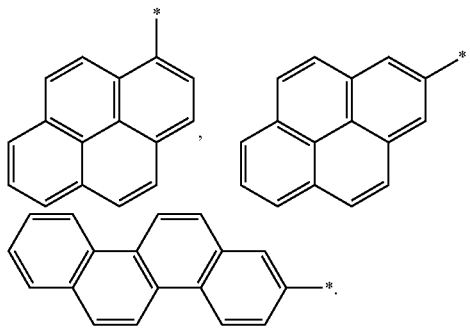

5 to 10 membered heteroaryl are 5 to 10 membered monocyclic or polycyclic, such as dicyclic, tricyclic or tetracyclic, ring systems, which comprise at least one heteroaromatic ring, and which may also comprise non-aromatic rings, which may be substituted by =O.

5 to 14 membered heteroaryl are 5 to 14 membered monocyclic or polycyclic, such as dicyclic, tricyclic or tetracyclic, ring systems, which comprise at least one heteroaromatic ring, and which may also comprise non-aromatic rings, which may be substituted by =O.

5 to 20 membered heteroaryl are 5 to 20 membered monocyclic or polycyclic, such as dicyclic, tricyclic or tetracyclic, ring systems, which comprise at least one heteroaromatic ring, and which may also comprise non-aromatic rings, which may be substituted by =O.

Examples of 5 to 10 membered heteroaryl are

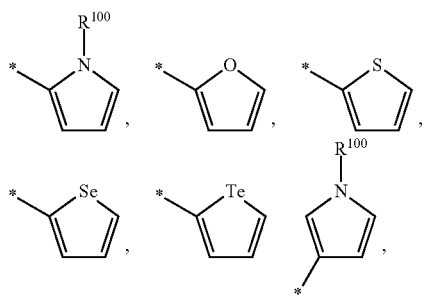

-continued

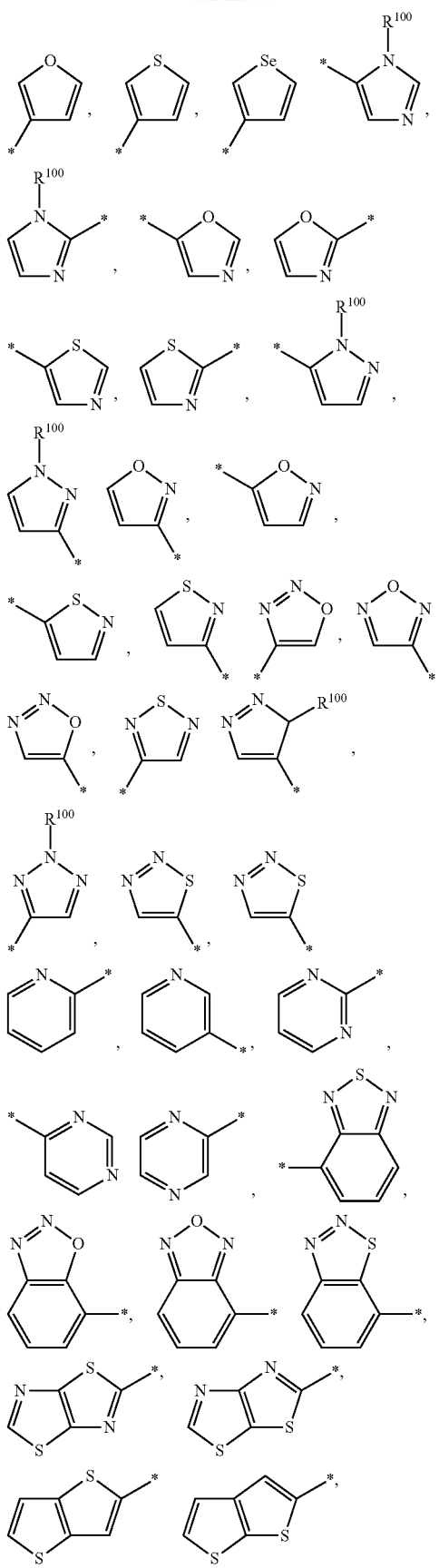

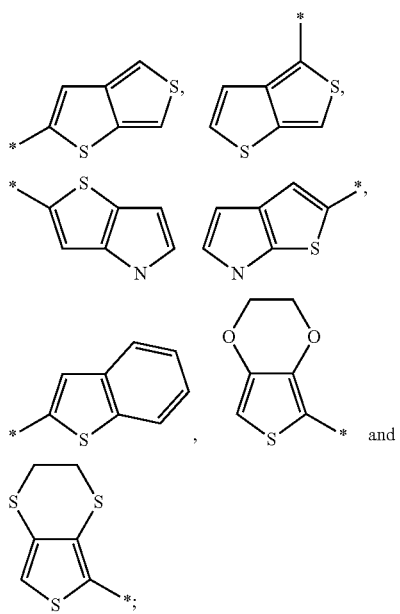
examples of 5 to 14 membered heteroaryl are the examples given for the 5 to 10 membered heteroaryl and
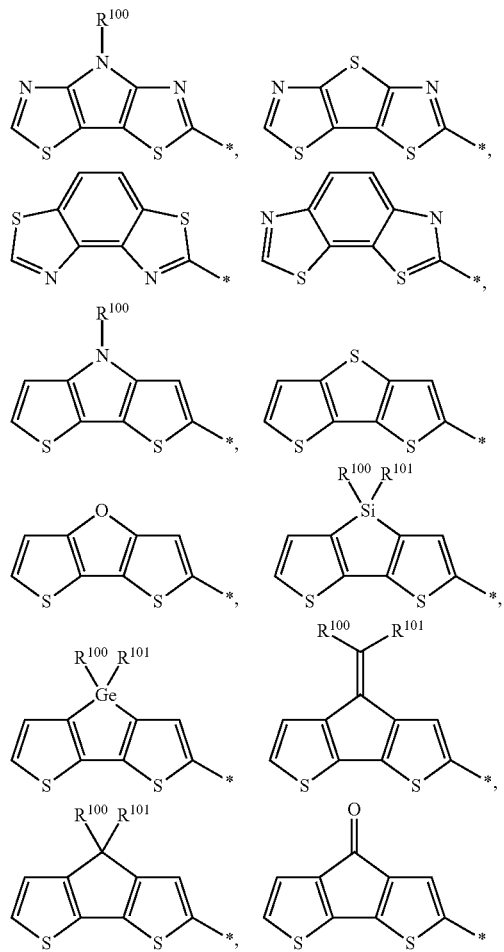
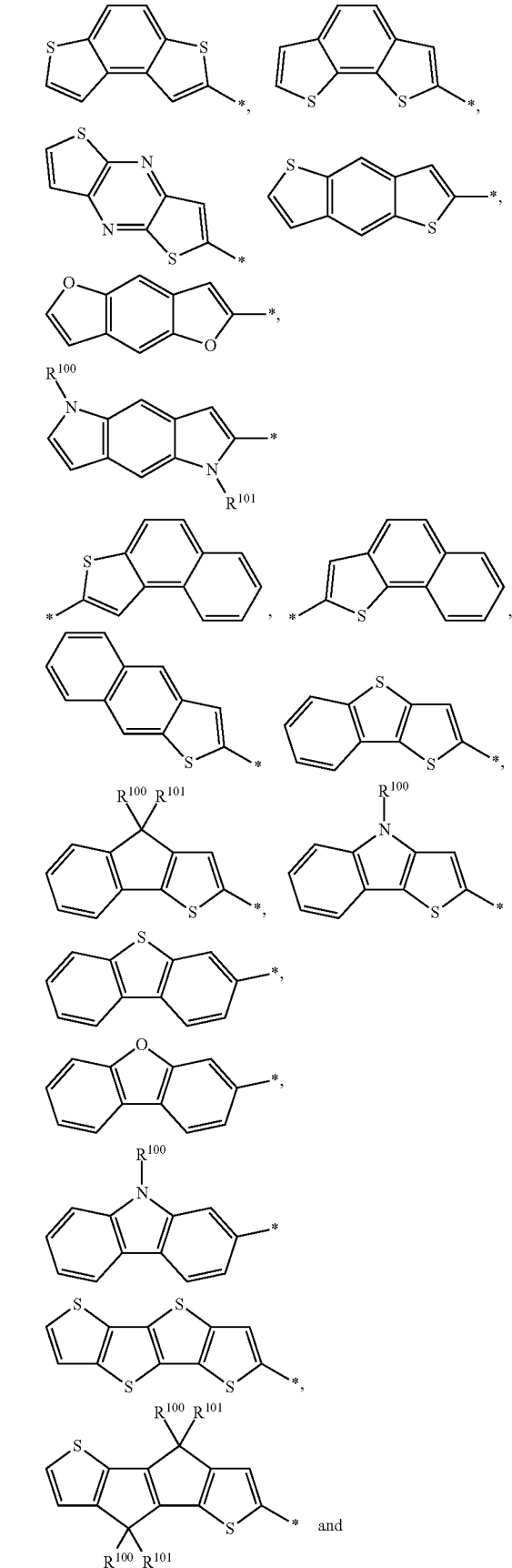

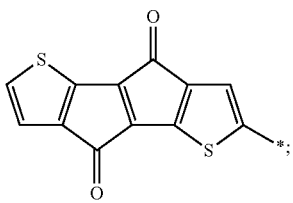

examples of 5 to 20 membered heteroaryl are the examples given for the 5 to 14 membered heteroaryl and

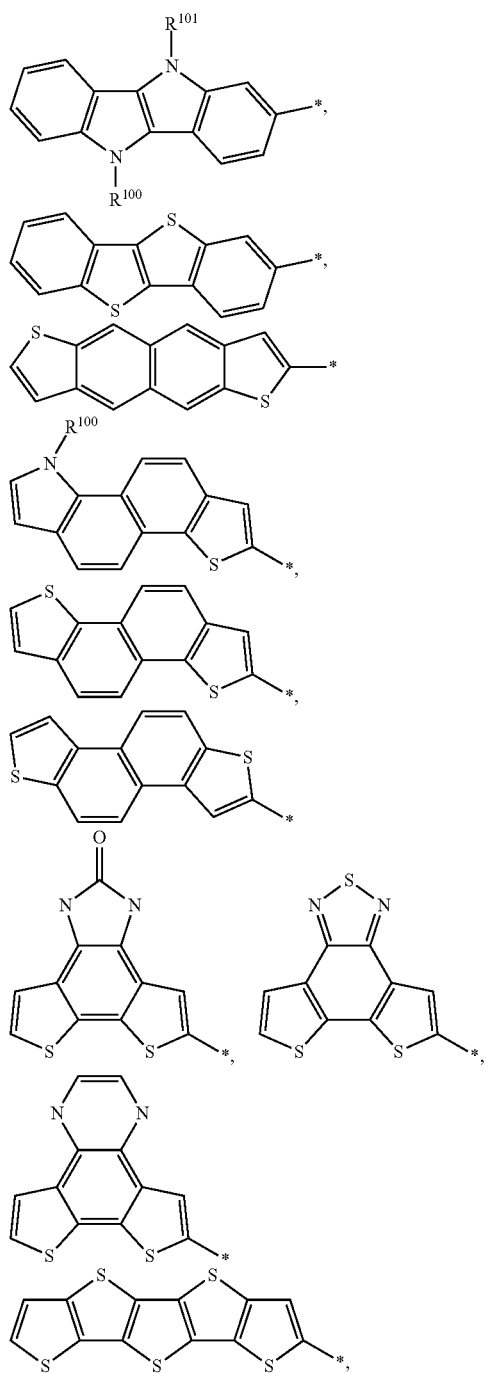

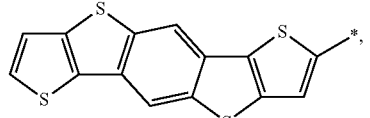
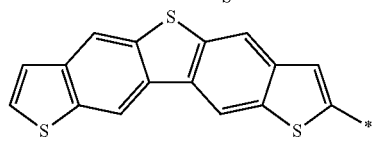
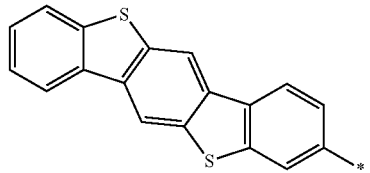
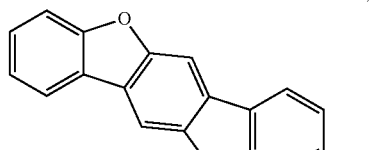
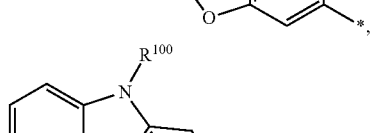
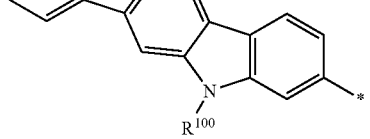
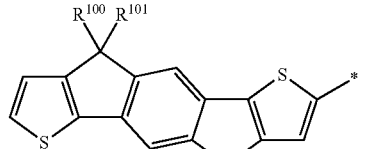

and

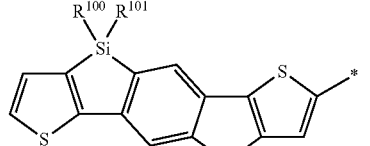

wherein
$R^{100}$ and $R^{101}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{100}$ and $R^{101}$, if attached to the same atom, together with the atom, to which they are attached, form a 5 to 12 membered ring system,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^q$, OC(O)—$R^q$, C(O)—$OR^q$, C(O)—$R^q$, $NR^qR^r$, $NR^q$—C(O)$R^r$, C(O)—$NR^qR^r$, N[C(O)$R^q$][C(O)$R^r$], $SR^q$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)$—$R^q$, $C(O)$—$OR^q$, $C(O)$—$R^q$, $NR^qR^r$, $NR^q$—$C(O)R^r$, $C(O)$—$NR^qR^r$, $N[C(O)R^q][C(O)R^r]$, $SR^q$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)$—$R^q$, $C(O)$—$OR^q$, $C(O)$—$R^q$, $NR^qR^r$, $NR^q$—$C(O)R^r$, $C(O)$—$NR^qR^r$, $N[C(O)R^q][C(O)R^r]$, $SR^q$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^q$, $OC(O)$—$R^q$, $C(O)$—$OR^q$, $C(O)$—$R^q$, $NR^qR^r$, $NR^q$—$C(O)R^r$, $C(O)$—$NR^qR^r$, $N[C(O)R^q][C(O)R^r]$, $SR^q$, halogen, CN, and $NO_2$;

wherein
$R^q$ and $R^r$ are independently selected from the group consisting of H, $C_{1-10}$-alkyl, $C_{2-10}$-alkenyl and $C_{2-10}$-alkynyl, wherein
$C_{1-10}$-alkyl, $C_{2-10}$-alkenyl and $C_{2-10}$-alkynyl can be substituted with one to five substituents selected from the group consisting of halogen, CN and $NO_2$.

$C_{6-18}$-arylene is a 6 to 18 membered monocyclic or polycyclic, such as dicyclic, tricyclic or tetracyclic, ring system, which comprises at least one C-aromatic ring, and which may also comprise non-aromatic rings, which may be substituted by =O.

Examples of $C_{6-18}$-arylene are

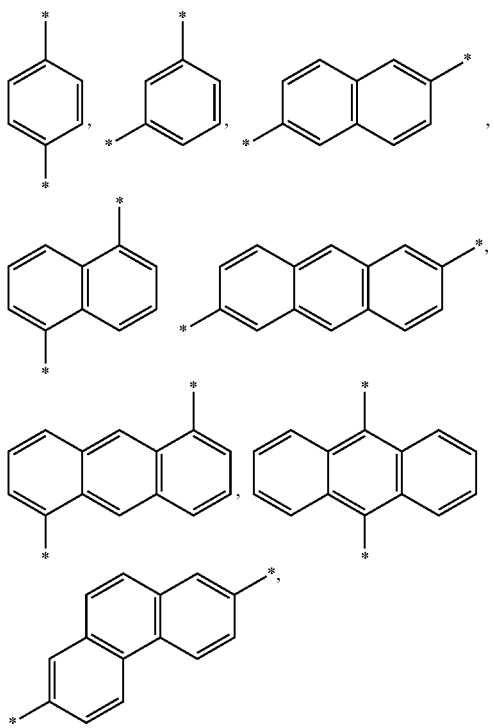

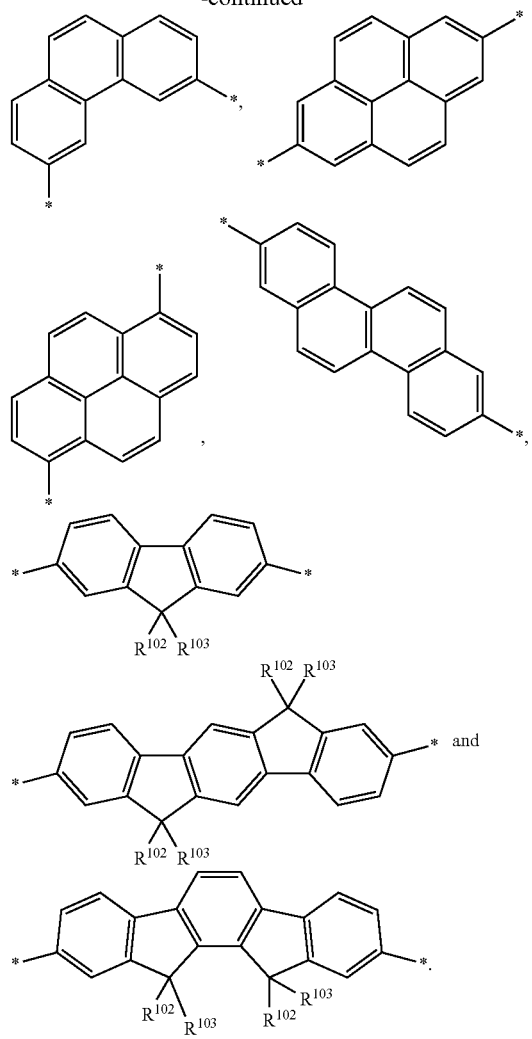

wherein
$R^{102}$ and $R^{103}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{102}$ and $R^{103}$, if attached to the same atom, together with the atom, to which they are attached, form a 5 to 12 membered ring system, wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^s$, $OC(O)$—$R^t$, $C(O)$—$OR^s$, $C(O)$—$R^s$, $NR^sR^t$, $NR^s$—$C(O)R^t$, $C(O)$—$NR^sR^t$, $N[C(O)R^s][C(O)R^t]$, $SR^s$, halogen, CN, and $NO_2$;

wherein $R^s$ and $R^t$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

5 to 20 membered heteroarylene is a 5 to 20 membered monocyclic or polycyclic, such as dicyclic, tricyclic or tetracyclic, ring system, which comprises at least one heteroaromatic ring, and which may also comprise non-aromatic rings, which may be substituted by =O.

Examples of 5 to 20 membered heteroarylene are

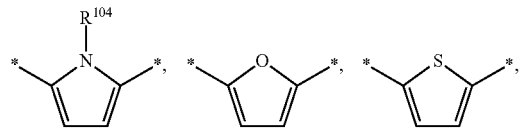

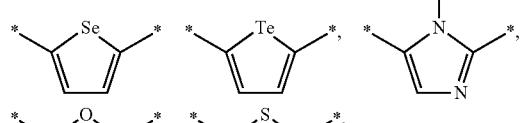

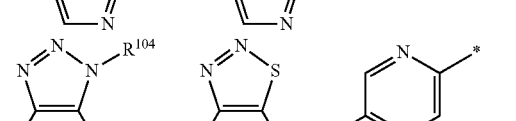

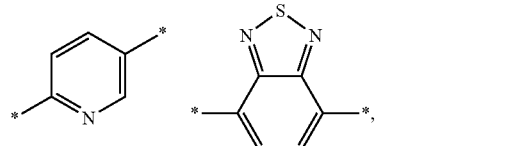

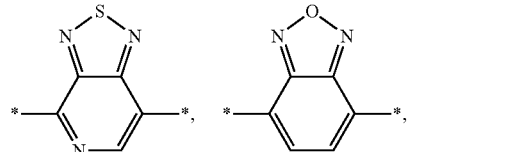

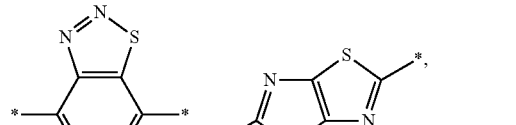

-continued

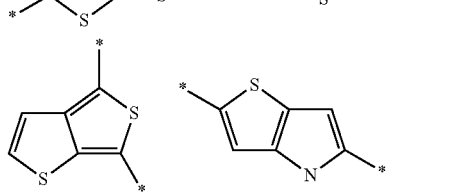

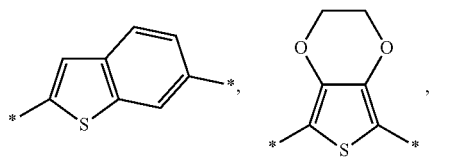

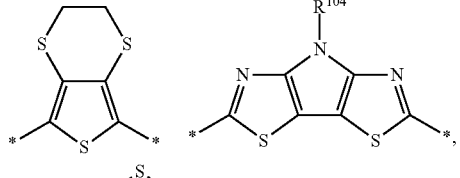

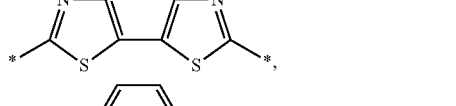

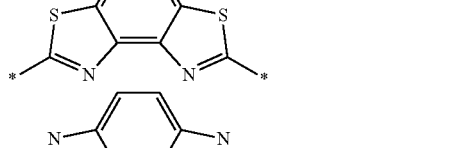

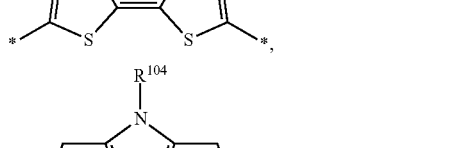

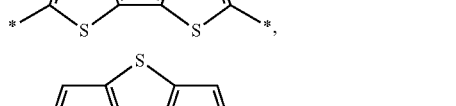

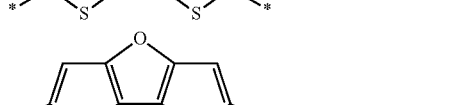

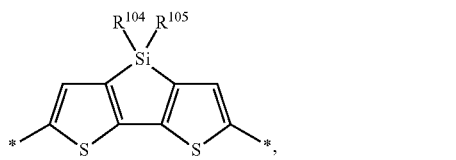

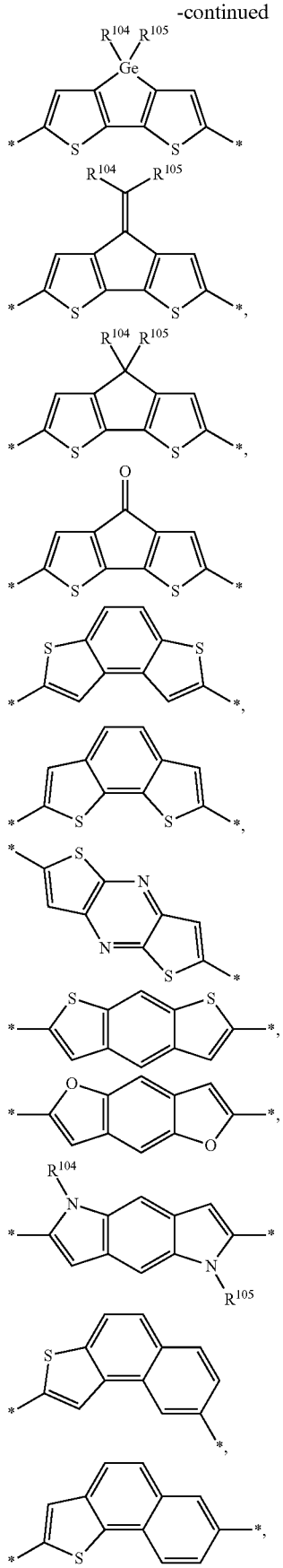
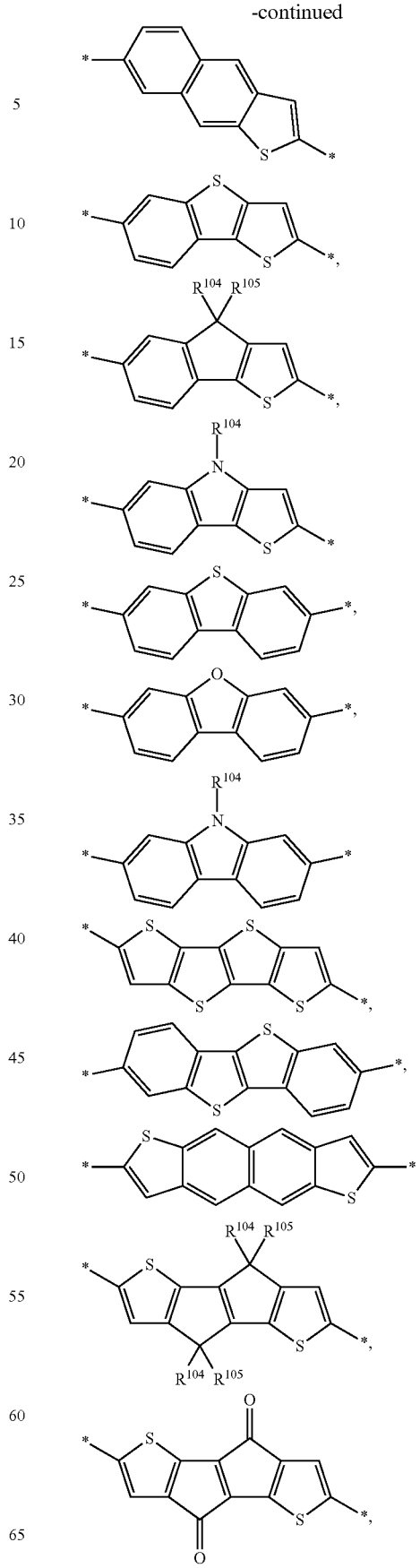

-continued

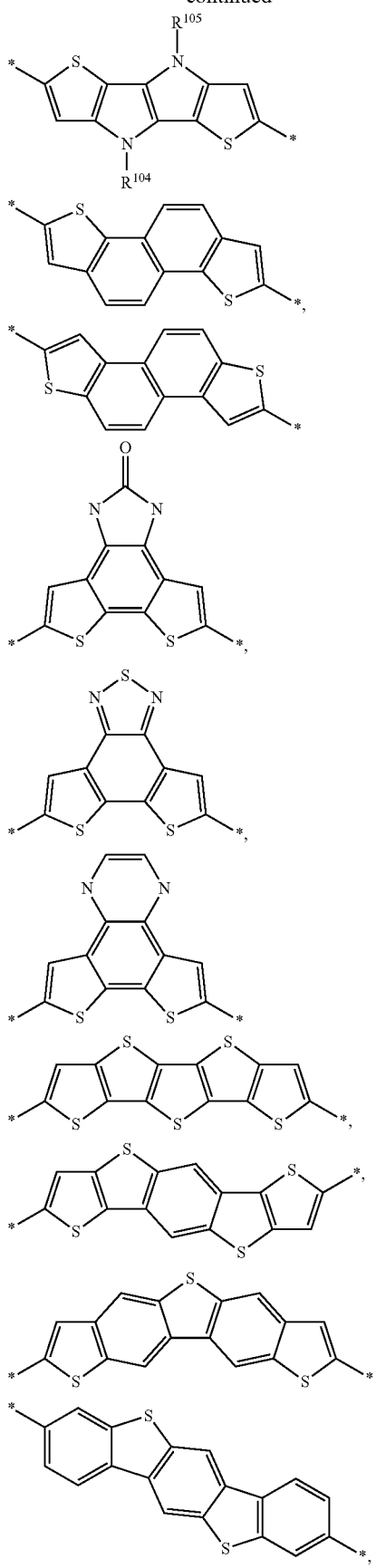

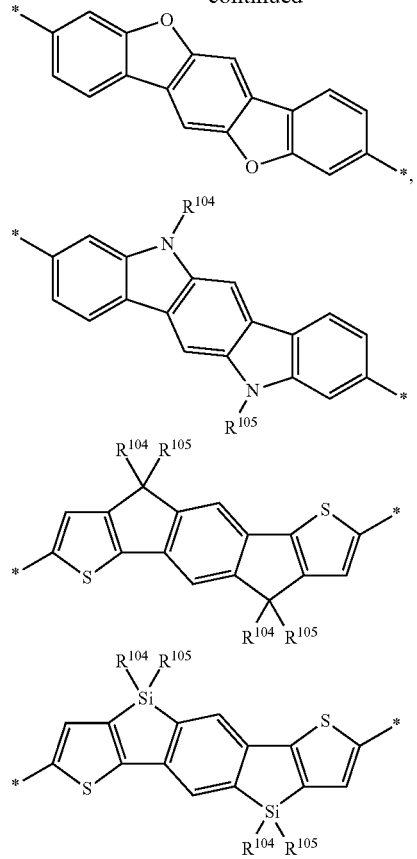

wherein
R[104] and R[105] are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or R[104] and R[105], if attached to the same atom, together with the atom, to which they are attached, form a 5 to 12 membered ring system, wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^v$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and $NO_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^u$, $OC(O)$—$R^u$, $C(O)$—$OR^u$, $C(O)$—$R^u$ $NR^uR^v$, $NR^u$—$C(O)R^v$, $C(O)$—$NR^uR^v$, $N[C(O)R^u][C(O)R^v]$, $SR^u$, halogen, CN, and $NO_2$;

wherein $R^u$ and $R^v$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

The 5 to 12 membered ring system can contain, in addition to the atom, to which $R^{100}$ and $R^{101}$, respectively $R^{102}$ and $R^{103}$, respectively $R^{104}$ and $R^{105}$, are attached, ring members selected from the group consisting of $CH_2$, O, S and $NR^w$, wherein $R^w$ is at each occurrence selected from the group consisting of H, $C_{1-10}$-alkyl, $C_{2-10}$-alkenyl and $C_{2-10}$-alkynyl.

Preferably, the semiconducting polymer having a band gap in the range of 0.5 to 1.8 eV comprises at least 60% by weight of the units of formula (1) and/or (5), based on the weight of the polymer.

More preferably, the semiconducting polymer having a band gap in the range of 0.5 to 1.8 eV comprises at least 80% by weight of the units of formula (1) and/or (5), based on the weight of the polymer.

Even more preferably, the semiconducting polymer having a band gap in the range of 0.5 to 1.8 eV comprises at least 95% by weight of the units of formula (1) and/or (5), based on the weight of the polymer.

Most preferably, the semiconducting polymer essentially consists of the units of formula (1) and/or (5).

Preferably, b and c are independently from each other 1, 2, 3 or 4. More preferably, b and c are independently from each other 1, 2 or 3.

Preferably, a and d are independently from each other 0, 1, 2 or 3. More preferably, a and d are independently from each other 0, 1 or 2. Even more preferably, a and d are independently from each other 0 or 1. Most preferably, a and d are 0.

Preferably, n is 0, 1 or 2, and m is 0, 1 or 2. More preferably, n is 0 or 1, and m is 0, 1 or 2. Most preferably, n is 0, and m is 0, 1 or 2.

Preferably, $R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, and a 5 to 20 membered heteroaryl, wherein $C_{1-100}$-alkyl, $C_{2-100}$-alkenyl and $C_{2-100}$-alkynyl can be substituted with one to forty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—Si$(R^{Sia})(R^{Sib})(R^{Sic})$ halogen and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—Si$(R^{Sia})(R^{Sib})(R^{Sic})$, halogen, and CN; and one or two $CH_2$-groups, but not adjacent $CH_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—Si$(R^{Sia})(R^{Sib})(R^{Sic})$, halogen, and CN, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{1-60}$-alkyl, O—$C_{2-60}$-alkenyl, O—$C_{2-60}$-alkynyl, O—$C_{5-8}$-cycloalkyl, —[O—SiR$^{Sid}$R$^{Sie}$]$_o$—R$^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sig}$R$^{Sih}$]$_p$—R$^{Sii}$, wherein p is an integer from 1 to 50, $R^{Sig}$ $R^{Sih}$ and $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si$(CH_3)_3$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$,) halogen, and CN; and at least two $CH_2$-groups, but not adjacent $CH_2$-groups, of $C_{1-60}$-alkyl, $C_{2-60}$-alkenyl and $C_{2-60}$-alkynyl can be replaced by 0 or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —O—Si$(R^{Sij})(R^{Sik})(R^{Sil})$halogen, and CN; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—

$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —$O$—$Si(R^{Sij})(R^{Sik})(R^{Sil})$halogen and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —$[O$—$SiR^{Sim}R^{Sin}]_q$—$R^{Sio}$ wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —$[O$—$SiR^{Sip}R^{Siq}]_r$—$R^{Sir}$, $NR^{70}R^{80}$, halogen, and O—$C(O)$—$R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—$C(O)$—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

More preferably, $R^1$ is at each occurrence selected from the group consisting of $C_{1-100}$-alkyl, $C_{2-100}$-alkenyl and $C_{2-100}$-alkynyl, wherein $C_{1-100}$-alkyl, $C_{2-100}$-alkenyl and $C_{2-100}$-alkynyl can be substituted with one to forty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —$O$—$Si(R^{Sia})(R^{Sib})(R^{Sic})$halogen, and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —$[O$—$SiR^{Sid}R^{Sie}]_o$—$R^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, wherein p is an integer from 1 to 50, $R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —$O$—$Si(R^{Sij})(R^{Sik})(R^{Sil})$halogen, and CN; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, —$O$—$Si(R^{Sij})(R^{Sik})(R^{Sil})$halogen, and CN; and one or two $CH_2$-groups, but not adjacent $CH_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)$—$R^c$, $C(O)$—$OR^c$, $C(O)$—$R^c$, $NR^c$—$C(O)R^d$, $C(O)$—$NR^cR^d$, $SR^c$, $Si(R^{Sij})(R^{Sik})(R^{Sil})$, O—$Si(R^{Sij})(R^{Sik})(R^{Sil})$halogen, and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —$[O$—$SiR^{Sim}R^{Sin}]_q$—$R^{Sio}$ wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —$[O$—$SiR^{Sip}R^{Siq}]_r$—$R^{Sir}$, wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$, $R^7$, $R^8$, $R^{70}$, $R^{80}$, $R^{700}$ and $R^{800}$ are independently selected from the group consisting of H, $C_{1-30}$- alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

Even more preferably, $R^1$ is at each occurrence selected from the group consisting of $C_{1-50}$-alkyl, $C_{2-50}$-alkenyl and $C_{2-50}$-alkynyl, wherein $C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, —O—$Si(R^{Sia})(R^{Sib})(R^{Sic})$ halogen, and CN; and at least two $CH_2$-groups, but not adjacent $CH_2$-groups, of $C_{1-50}$-alkyl, $C_{2-50}$-alkenyl and $C_{2-50}$-alkynyl can be replaced by O or S, wherein $R^a$ and $R^b$ are independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl, $R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sid}R^{Sie}]_o$—$R^{Sif}$, wherein o is an integer from 1 to 50, $R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sig}R^{Sih}]_p$—$R^{Sii}$, wherein p is an integer from 1 to 50, $R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$, $R^5$, $R^6$, $R^{50}$, $R^{60}$, $R^{500}$ and $R^{600}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

Most preferably, $R^1$ is at each occurrence selected from the group consisting of $C_{1-36}$-alkyl, $C_{2-36}$-alkenyl and $C_{2-36}$-alkynyl, wherein $C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, —O—$Si(R^{Sia})(R^{Sib})(R^{Sic})$ halogen, and CN; and at least two $CH_2$-groups, but not adjacent $CH_2$-groups, of $C_{1-36}$-alkyl, $C_{2-36}$-alkenyl and $C_{2-36}$-alkynyl can be replaced by O or S, wherein $R^a$ and $R^b$ are independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl $R^{Sia}$, $R^{Sib}$ and $R^{Sic}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, —[O—$SiR^{Sid}R^{Sie}]_o$—$R^{Sif}$, wherein o is an integer from 1 to 50, $R^{Sid}$, $R^{Sie}$, $R^{Sif}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, —[O—$SiR^{Sig}R^{Sih}]_p$—$R^{Sii}$, wherein p is an integer from 1 to 50, $R^{Sig}$, $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, O—$Si(CH_3)_3$, $R^5$, $R^6$, $R^{50}$, $R^{60}$, $R^{500}$ and $R^{600}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, and 5 to 10 membered heteroaryl, $C_{1-20}$-alkyl, $C_{2-20}$-alkenyl and $C_{2-20}$-alkynyl can be substituted with one to ten substituents selected from the group consisting of halogen and CN.

In particular, $R^1$ is at each occurrence unsubstituted $C_{1-36}$-alkyl.

Preferably, $L^1$ and $L^2$ are independently from each other and at each occurrence selected from the group consisting of $C_{6-18}$-arylene, 5 to 20 membered heteroarylene, and

*⁀*, wherein $C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, $NR^{31}$—$C(O)R^{32}$, $C(O)$—$NR^{31}R^{32}$, $SR^{31}$, halogen, CN, $SiR$—$^{Siv}R^{Siw}R^{Six}$ and OH, and wherein

*⁀* can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $C(O)R^{41}$, $C(O)$—$NR^{41}R^{42}$, $C(O)$—$OR^{41}$ and CN, wherein $R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and wherein $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and one or two $CH_2$-groups, but not adjacent $CH_2$-groups, of $C_{5-12}$-cycloalkyl can be replaced by O, S, OC(O), CO, $NR^i$ or $NR^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

wherein $R^k$ and $R^l$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$ More preferably, $L^1$ and $L^2$ are independently from each other and at each occurrence selected from the group consisting of 5 to 20 membered heteroarylene, and

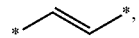

wherein 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$, $OC(O)$—$R^{31}$, $C(O)$—$OR^{31}$, $C(O)$—$R^{31}$, $NR^{31}R^{32}$, $NR^{31}$—$C(O)R^{32}$, $C(O)$—$NR^{31}R^{32}$, $SR^{31}$, halogen, CN, $SiR^{Siv}R^{Siw}R^{Six}$ and OH, and wherein

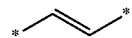

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $C(O)$—$R^{41}$, $C(O)$—$NR^{41}R^{42}$, $C(O)$—$OR^{41}$ and CN, wherein $R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and wherein $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$; and one or two $CH_2$-groups, but not adjacent $CH_2$-groups, of $C_{5-12}$-cycloalkyl can be replaced by O, S, OC(O), CO, $NR^i$ or $NR^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, $OC(O)$—$R^j$, $C(O)$—$OR^i$, $C(O)$—$R^i$, $NR^iR^j$, $NR^i$—$C(O)R^j$, $C(O)$—$NR^iR^j$, $N[C(O)R^i][C(O)R^j]$, $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein

- $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;
- $C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;
- $C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, $OC(O)$—$R^l$, $C(O)$—$OR^k$, $C(O)$—$R^k$, $NR^kR^l$, $NR^k$—$C(O)R^l$, $C(O)$—$NR^kR^l$, $N[C(O)R^k][C(O)R^l]$, $SR^k$, halogen, CN, and $NO_2$;

wherein

- $R^k$ and $R^l$ are independently selected from the group consisting of H, $C_{1-10}$-alkyl, $C_{2-10}$-alkenyl and $C_{2-10}$-alkynyl, wherein

- $C_{1-10}$-alkyl and $C_{2-10}$-alkenyl and $C_{2-10}$-alkynyl can be substituted with one to five substituents selected from the group consisting of halogen, CN and $NO_2$ Even more preferably, $L^1$ and $L^2$ are independently from each other and at each occurrence selected from the group consisting of 5 to 20 membered heteroarylene, and

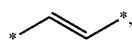

wherein 5 to 20 membered heteroarylene is selected from the group consisting of

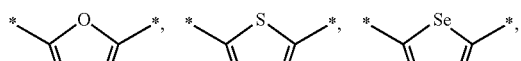

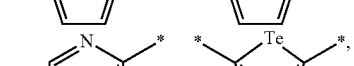

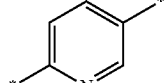

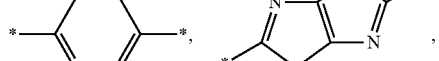

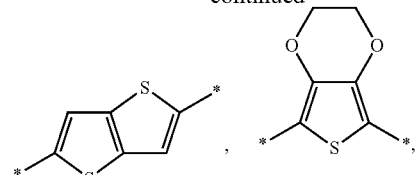

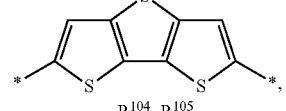

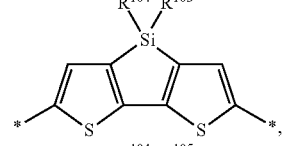

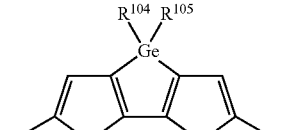

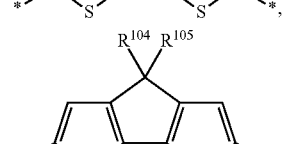

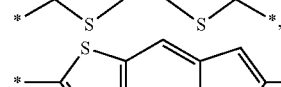

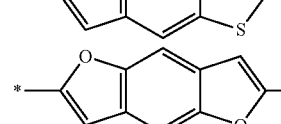

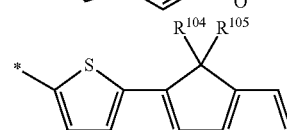

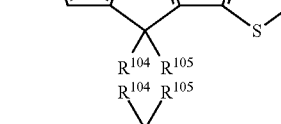

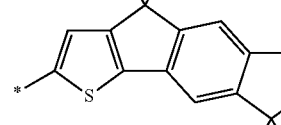

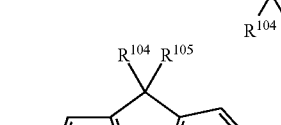

and

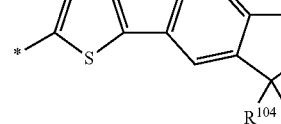

wherein

- $R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and R$^{105}$, if attached to the same atom, together with the atom, to which they are attached, form a 5 to 12 membered ring system,
wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;
wherein R$^u$ and R$^v$ are independently selected from the group consisting of H, C$_{1-10}$-alkyl, C$_{2-10}$-alkenyl and C$_{2-10}$-alkynyl,
wherein C$_{1-10}$-alkyl, C$_{2-10}$-alkenyl and C$_{2-10}$-alkynyl can be substituted with one to five substituents selected from the group consisting of halogen, CN and NO$_2$, wherein 5 to 20 membered heteroarylene can be substituted with one to four substituents R$^3$ at each occurrence selected from the group consisting of C$_{1-30}$-alkyl and halogen, and
wherein

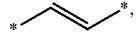

can be substituted with one or two substituents R$^4$ at each occurrence selected from the group consisting of C$_{1-30}$-alkyl, C(O)—R$^{41}$, C(O)—OR$^{41}$ and CN,
wherein R$^{41}$ is at each occurrence C$_{1-30}$-alkyl.

Even more preferably, L$^1$ and L$^2$ are independently from each other and at each occurrence selected from the group consisting of 5 to 20 membered heteroarylene,
and

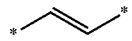

wherein 5 to 20 membered heteroarylene is selected from the group consisting of

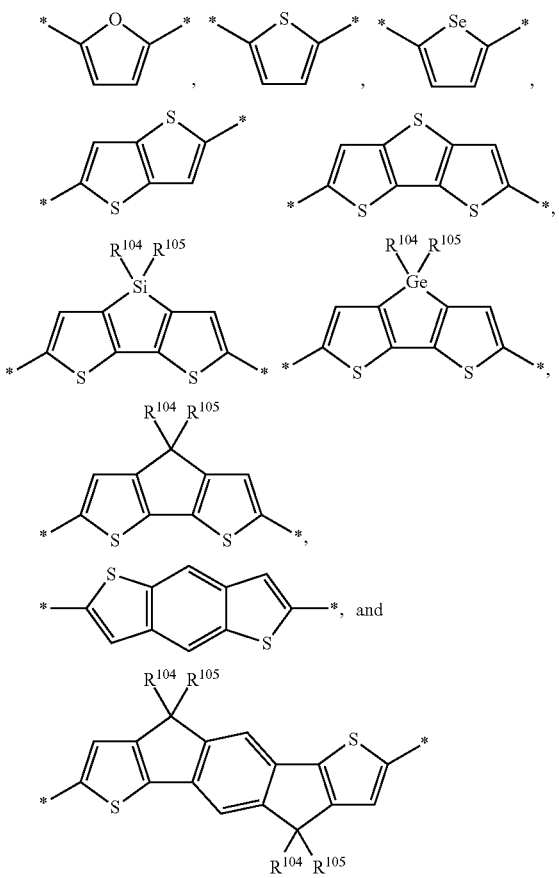

wherein

R$^{104}$ and R$^{105}$ are independently and at each occurrence selected from the group consisting of H and C$_{1-20}$-alkyl, wherein 5 to 20 membered heteroarylene can be substituted with one to four substituents R$^3$ at each occurrence selected from the group consisting of C$_{1-30}$-alkyl and halogen, and wherein

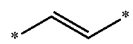

is unsubstituted.

Most preferably, L$^1$ and L$^2$ are independently from each other and at each occurrence selected from the group consisting of 5 to 20 membered heteroarylene,
and wherein 5 to 20 membered heteroarylene is

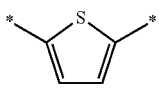 [SMILES: *c1ccc(*)s1]

wherein
5 to 20 membered heteroarylene is unsubstituted, and
wherein

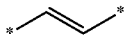

is unsubstituted.

In particular, $L^1$ and $L^2$ are independently from each other and at each occurrence 5 to 20 membered heteroarylene, wherein 5 to 20 membered heteroarylene is

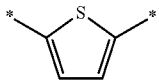

wherein
5 to 20 membered heteroarylene is unsubstituted.

Preferably, $L^3$ and are $L^4$ are independently from each other and at each occurrence selected from the group consisting of $C_{6-18}$-arylene and 5 to 20 membered heteroarylene
wherein
$C_{6-18}$-arylene and 5 to 20 membered heteroarylene can be substituted with one to six substituents $R^9$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{91}$, $OC(O)$—$R^{91}$, $C(O)$—$OR^{91}$, $C(O)$—$R^{91}$, $NR^{91}R^{92}$, $NR^{91}$—$C(O)R^{92}$, $C(O)$—$NR^{91}R^{92}$, $SR^{91}$, halogen, CN, $SiR^{Siy}R^{Siz}R$—$^{Siaa}$ and OH, and
wherein
$R^{91}$ and $R^{92}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
wherein
$C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^m$, $OC(O)$—$R^m$, $C(O)$—$OR^m$, $C(O)$—$R^m$, $NR^mR^n$, $NR^m$—$C(O)R^n$, $C(O)$—$NR^mR^n$, $N[C(O)R^n]$ $[C(O)R^m]$, $SR^n$, halogen, CN, $SiR^{Siy}R^{Siz}R^{Siaa}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S,
$C_{5-12}$-cycloalkyl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^m$, $OC(O)$—$R^m$, $C(O)$—$OR^m$, $C(O)$—$R^m$, $NR^mR^n$, $NR^m$—$C(O)R^n$, $C(O)$—$NR^mR^n$, $N[C(O)R^m][C(O)R^n]$, $SR^m$, halogen, CN, $SiR^{Siy}R^{Siz}R^{Siaa}$ and $NO_2$; and one or two $CH_2$-groups, but not adjacent $CH_2$-groups, of $C_{5-12}$-cycloalkyl can be replaced by O, S, OC(O), CO, $NR^m$ or $NR^m$—CO,
$C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^m$, $OC(O)$—$R^m$, $C(O)$—$OR^m$, $C(O)$—$R^m$, $NR^mR^n$, $NR^m$—$C(O)R^n$, $C(O)$—$NR^mR^n$, $N[C(O)R^m][C(O)R^n]$, $SR^m$, halogen, CN, $SiR^{Siy}R^{Siz}R^{Siaa}$ and $NO_2$,
$R^{Siy}$, $R^{Siz}$, $R^{Siaa}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$,
wherein
$R^m$ and $R^n$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^o$, $OC(O)$—$R^o$, $C(O)$—$OR^o$, $C(O)$—$R^o$, $NR^oR^p$, $NR^o$—$C(O)R^p$, $C(O)$—$NR^oR^p$, $N[C(O)R^o][C(O)R^p]$, $SR^o$, halogen, CN, and $NO_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, $OC(O)$—$R^o$, $C(O)$—$OR^o$, $C(O)$—$R^o$, $NR^oR^p$, $NR^o$—$C(O)R^p$, $C(O)$—$NR^oR^p$, $N[C(O)R^o][C(O)R^p]$, $SR^o$, halogen, CN, and $NO_2$;
$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, $OC(O)$—$R^o$, $C(O)$—$OR^o$, $C(O)$—$R^o$, $NR^oR^p$, $NR^o$—$C(O)R^p$, $C(O)$—$NR^oR^p$, $N[C(O)R^o][C(O)R^p]$, $SR^o$, halogen, CN, and $NO_2$;
wherein
$R^o$ and $R^p$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and $NO_2$ More preferably, $L^3$ and are $L^4$ are independently from each other and at each occurrence 5 to 20 membered heteroarylene
wherein
5 to 20 membered heteroarylene can be substituted with one to six substituents $R^9$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{91}$, $OC(O)$—$R^{91}$, $C(O)$—$OR^{91}$, $C(O)$—$R^{91}$, $NR^{91}R^{92}$, $NR^{91}$—$C(O)R^{92}$, $C(O)$—$NR^{91}R^{92}$, $SR^{91}$, halogen, CN, $SiR^{Siy}R^{Siz}R^{Siaa}$ and OH, and
wherein
$R^{91}$ and $R^{92}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
$C_{1-30}$-alkyl, $C_{2-30}$-alkenyl and $C_{2-30}$-alkynyl can be substituted with one to ten substituents independently selected from the group consisting of $C_{5-8}$- cycloalkyl, $C_{6-14}$-aryl, 5 to 14 membered heteroaryl, $OR^m$, $OC(O)—R^m$, $C(O)—OR^m$, $C(O)—R^m$, $NR^mR^n$, $NR^m—C(O)R^n$, $C(O)—NR^nR^m$, $N[C(O)R^n][C(O)R^m]$, $SR^n$, halogen, CN, $SiR^{Siy}R^{Siz}R^{Siaa}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^m$, $OC(O)—R^m$, $C(O)—OR^m$, $C(O)—R^m$, $NR^mR^n$, $NR^m—C(O)R^n$, $C(O)—NR^mR^n$, $N[C(O)R^m][C(O)R^n]$, $SR^m$, halogen, CN, $SiR^{Siy}R^{Siz}R^{Siaa}$ and $NO_2$; and one or two $CH_2$-groups, but not adjacent $CH_2$-groups, of $C_{5-12}$-cycloalkyl can be replaced by O, S, OC(O), CO, $NR^m$ or $NR^m—CO$, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^m$, $OC(O)—R^m$, $C(O)—OR^m$, $C(O)—R^m$, $NR^mR^n$, $NR^m—C(O)R^n$, $C(O)—NR^mR^n$, $N[C(O)R^m][C(O)R^n]$, $SR^m$, halogen, CN, $SiR^{Siy}R^{Siz}R^{Siaa}$ and $NO_2$, $R^{Siy}$, $R^{Siz}$, $R^{Siaa}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and $O—Si(CH_3)_3$, wherein $R^m$ and $R^n$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^o$, $OC(O)—R^o$, $C(O)—OR^o$, $C(O)—R^o$, $NR^oR^p$, $NR^o—C(O)R^p$, $C(O)—NR^oR^p$, $N[C(O)R^o][C(O)R^p]$, $SR^o$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, $OC(O)—R^o$, $C(O)—OR^o$, $C(O)—R^o$, $NR^oR^p$, $NR^o—C(O)R^p$, $C(O)—NR^oR^p$, $N[C(O)R^o][C(O)R^p]$, $SR^o$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, $OC(O)—R^o$, $C(O)—OR^o$, $C(O)—R^o$, $NR^oR^p$, $NR^o—C(O)R^p$, $C(O)—NR^oR^p$, $N[C(O)R^o][C(O)R^p]$, $SR^o$, halogen, CN, and $NO_2$;

wherein $R^o$ and $R^p$ are independently selected from the group consisting of H, $C_{2-10}$-alkenyl and $C_{2-10}$-alkynyl, wherein $C_{2-10}$-alkenyl and $C_{2-10}$-alkynyl can be substituted with one to five substituents selected from the group consisting of halogen, CN and $NO_2$ Even more preferably, $L^3$ and are $L^4$ are independently from each other and at each occurrence 5 to 20 membered heteroarylene, wherein 5 to 20 membered heteroarylene is selected from the group consisting of

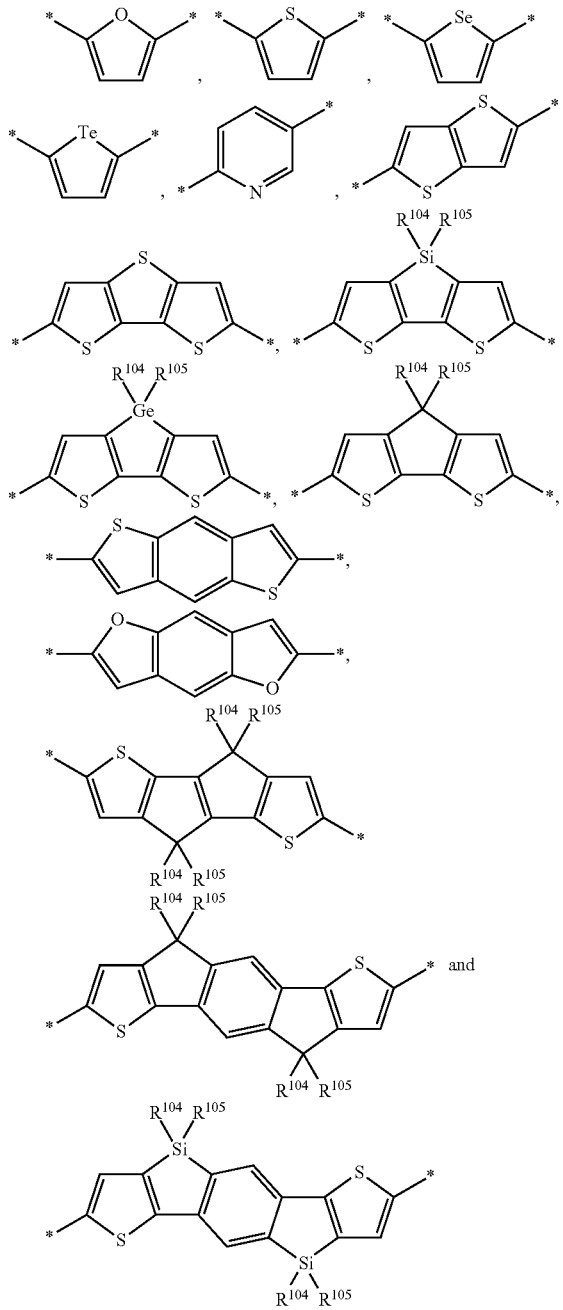

wherein $R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and $R^{105}$, if attached to the same atom, together with the atom, to which they are attached, form a 5 to 12 membered ring system, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$- aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

wherein

R$^u$ and R$^v$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and NO$_2$, wherein 5 to 20 membered heteroarylene can be substituted with one to three substituents R$^9$ at each occurrence selected from the group consisting of $C_{1-30}$-alkyl and halogen.

Most preferably, L$^3$ and L$^4$ are independently from each other and at each occurrence 5 to 20 membered heteroarylene, wherein 5 to 20 membered heteroarylene is selected from the group consisting of

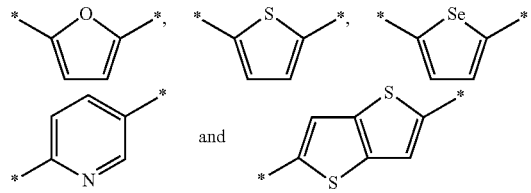

and wherein 5 to 20 membered heteroarylene can be substituted with one substituent R$^9$ at each occurrence selected from the group consisting of $C_{1-30}$-alkyl and halogen.

In particular, L$^3$ and L$^4$ are independently from each other and at each occurrence 5 to 20 membered heteroarylene, wherein 5 to 20 membered heteroarylene is

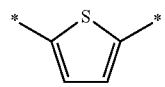 [SMILES: *c1ccc(*)s1]

wherein
5 to 20 membered heteroarylene is unsubstituted.

Preferably, A is selected from the group consisting of

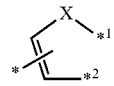

A1

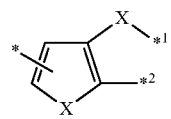

A2

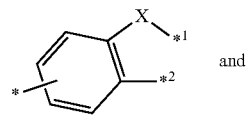

A3 and

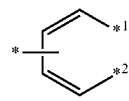

A4 wherein

X is at each occurrence O, S or NR$^1$, and

A1, A2, A3 and A4 can be substituted with one to three substituents R$^2$.

More preferably, A is

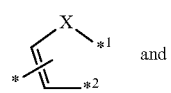

A1 and

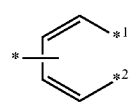

A4 wherein

X is at each occurrence S or NR$^1$, and

A1 and A4 can be substituted with one to three substituents R$^2$.

Most preferably, A is

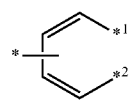

A4 wherein

A4 is not substituted.

Preferably, B is selected from the group consisting of

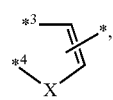

B1

-continued

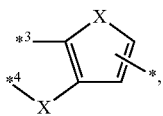
B2

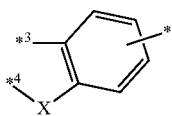
B3
and

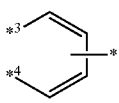
B4 wherein
X is at each occurrence O, S or NR¹, and
B1, B2, B3 and B4 can be substituted with one to three substituents R².
More preferably, B is

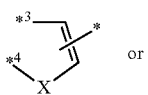
B1 or

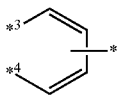
B4 wherein
X is at each occurrence S or NR¹, and
B1 and B4 can be substituted with one to three substituents R².
Most preferably, B is

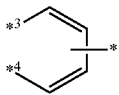
B4 wherein
B4 is not substituted.
Preferably, R² is at each occurrence selected from the group consisting of $C_{1-30}$-alkyl and halogen,
wherein
$C_{1-30}$-alkyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl can be replaced by O or S,
wherein
$R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and $O$—$Si(CH_3)_3$,
$R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

wherein
$R^g$ and $R^h$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and $NO_2$.

More preferably, R² is at each occurrence selected from the group consisting of unsubstituted $C_{1-30}$-alkyl and halogen.

In preferred polymers comprising at least one unit of formula

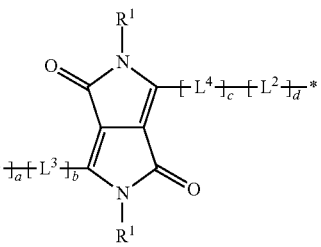
(1)

or of formula

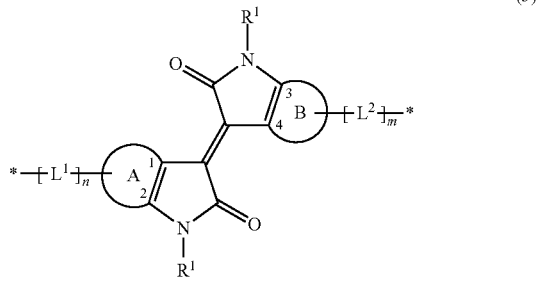
(5)

b and c are independently from each other 1, 2, 3, 4, 5 or 6,
a and d are independently from each other 0, 1, 2, 3 or 4,
n and m are independently from each other 0, 1, 2, 3 or 4, $R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, and a 5 to 20 membered heteroaryl, wherein $C_{1-100}$-alkyl, $C_{2-100}$-alkenyl and $C_{2-100}$-alkynyl can be substituted with one to forty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—Si$(R^{Sia})(R^{Sib})(R^{Sic})$halogen and CN; and at least two CH$_2$-groups, but not adjacent CH$_2$-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—Si$(R^{Sia})(R^{Sib})/R^{Sio}$ k), halogen, and CN; and one or two CH$_2$-groups, but not adjacent CH$_2$-groups, of $C_{5-12}$-cycloalkyl can be replaced by O, S, OC(O), CO, $NR^a$ or $NR^a$—CO, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—Si$(R^{Sia})(R^{Sib})(R^{Sic})$, halogen, and CN, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, O—$C_{2-60}$-alkenyl, O—$C_{2-60}$-alkynyl, O—$C_{5-8}$-cycloalkyl, —[O—SiR$^{Sid}$R$^{Sie}$]$_o$—R$^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, wherein p is an integer from 1 to 50, $R^{Sig}$ $R^{Sih}$ and $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, OC(O)—$R^c$, C(O)—$OR^c$, C(O)—$R^c$, $NR^c$—C(O)$R^d$, C(O)—$NR^cR^d$, $SR^c$, $Si(R^{Sij})(R^{Sik})(R^{Sil})$, O) halogen, and CN; and at least two CH$_2$-groups, but not adjacent CH$_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, OC(O)—$R^c$, C(O)—$OR^c$, C(O)—$R^c$, $NR^c$—C(O)$R^d$, C(O)—$NR^cR^d$, $SR^c$, $Si(R^{Sij})(R^{Sik})(R^{Sil})$, —O—Si$(R^{Sij})(R^{Sik})(R^{Sil})$halogen, and CN; and one or two CH$_2$-groups, but not adjacent CH$_2$-groups, of $C_{5-8}$-cycloalkyl can be replaced by O, S, OC(O), CO, $NR^c$ or $NR^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, OC(O)—$R^c$, C(O)—$OR^c$, C(O)—$R^c$, $NR^c$—C(O)$R^d$, C(O)—$NR^cR^d$, $SR^c$, $Si(R^{Sij})(R^{Sik})(R^{Sil})$, —O—Si$(R^{Sij})(R^{Sik})(R^{Sil})$halogen and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sim}$R$^{Sin}$]$_q$—R$^{Sio}$ wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, —[O—SiR$^{Sip}$R$^{Siq}$]$_r$—R$^{Sir}$, NR$^{70}$R$^{80}$, halogen, and O—C(O)—R$^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, O—$C_{1-30}$-alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—Si(CH$_3$)$_3$, NR$^{700}$R$^{800}$, halogen and O—C(O)—R$^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN, $L^1$ and $L^2$ are independently from each other and at each occurrence selected from the group consisting of $C_{6-18}$-arylene, 5 to 20 membered heteroarylene, and

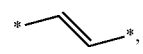

wherein
C$_{6-18}$-arylene and 5 to 20 membered heteroarylene can be substituted with one to six substituents R$^3$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, OR$^{31}$, OC(O)—R$^{31}$, C(O)—OR$^{31}$, C(O)—R$^{31}$, NR$^{31}$R$^{32}$, NR$^{31}$—C(O)R$^{32}$, C(O)—NR$^{31}$R$^{32}$, SR$^{31}$, halogen, CN, SiR—$^{Siv}$R$^{Siw}$R$^{Six}$ and OH, and wherein

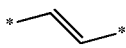

can be substituted with one or two substituents R$^4$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, C(O)—R$^{41}$, C(O)—NR$^{41}$R$^{42}$, C(O)—OR$^{41}$ and CN, wherein R$^{31}$, R$^{32}$, R$^{41}$ and R$^{42}$ are independently from each other and at each occurrence selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and wherein C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of C$_{5-12}$-cycloalkyl can be replaced by O, S, OC(O), CO, NR$^i$ or NR$^i$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$, wherein R$^{Siv}$, R$^{Siw}$, R$^{Six}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, R$^i$ and R$^j$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, wherein C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;

wherein

R$^k$ and R$^l$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, L$^3$ and are L$^4$ are independently from each other and at each occurrence selected from the group consisting of C$_{6-18}$-arylene and 5 to 20 membered heteroarylene wherein C$_{6-18}$-arylene and 5 to 20 membered heteroarylene can be substituted with one to six substituents R$^9$ at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, OR$^{91}$, OC(O)—R$^{91}$, C(O)—OR$^{91}$, C(O)—R$^{91}$, NR$^{91}$R$^{92}$, NR$^{91}$—C(O)R$^{92}$, C(O)—NR$^{91}$R$^{92}$, SR$^{91}$, halogen, CN, SiR$^{Siy}$R$^{Siz}$R—$^{Siaa}$ and OH, and wherein R$^{91}$ and R$^{92}$ are independently from each other and at each occurrence selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and wherein C$_{1-30}$-alkyl, C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^m$, OC(O)—R$^m$, C(O)—OR$^m$, C(O)—R$^m$, NR$^m$R$^n$, NR$^m$—C(O)R$^n$, C(O)—NR$^n$R$^m$, N[C(O)R$^n$][C(O)R$^m$], SR$^n$, halogen, CN, SiR$^{Siy}$R$^{Siz}$R$^{Siaa}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^m$, OC(O)—R$^m$, C(O)—OR$^m$, C(O)—R$^m$, NR$^m$R$^n$, NR$^m$—C(O)R$^n$, C(O)—NR$^m$R$^n$, N[C(O)R$^m$][C(O)R$^n$], SR$^m$, halogen, CN, SiR$^{Siy}$R$^{Siz}$R$^{Siaa}$ and NO$_2$; and one or two CH$_2$-groups, but not adjacent CH$_2$-groups, of C$_{5-12}$-cycloalkyl can be replaced by O, S, OC(O), CO, NR$^m$ or NR$^m$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^m$, OC(O)—R$^m$, C(O)—OR$^m$, C(O)—R$^m$, NR$^m$R$^n$, NR$^m$—C(O)R$^n$, C(O)—NR$^m$R$^n$, N[C(O)R$^m$][C(O)R$^n$], SR$^m$, halogen, CN, SiR$^{Siy}$, R$^{Siz}$, R$^{Siaa}$ and NO$_2$, R$^{Siy}$, R$^{Siz}$, R$^{Siaa}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, wherein R$^m$ and R$^n$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^o$, OC(O)—R$^o$, C(O)—OR$^o$, C(O)—R$^o$, NR$^o$R$^p$, NR$^o$—C(O)R$^p$, C(O)—NR$^o$R$^p$, N[C(O)R$^o$][C(O)R$^p$], SR$^o$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^o$, OC(O)—R$^o$, C(O)—OR$^o$, C(O)—R$^o$, NR$^o$R$^p$, NR$^o$—C(O)R$^p$, C(O)—NR$^o$R$^p$, N[C(O)R$^o$][C(O)R$^p$], SR$^o$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^o$, OC(O)—R$^o$, C(O)—OR$^o$, C(O)—R$^o$, NR$^o$R$^p$, NR$^o$—C(O)R$^p$, C(O)—NR$^o$R$^p$, N[C(O)R$^o$][C(O)R$^p$], SR$^o$, halogen, CN, and NO$_2$;

wherein

R$^o$ and R$^p$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, A is selected from the group consisting of

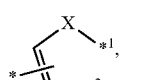
A1

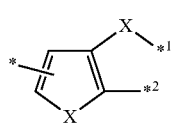
A2

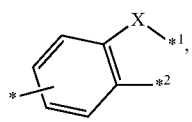
A3

-continued

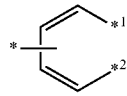
A4

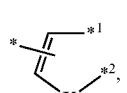
A5

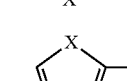
A6 and

A7 and

B is selected from the group consisting of

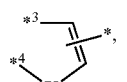
B1

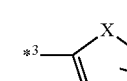
B2

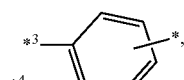
B3

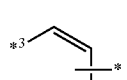
B4

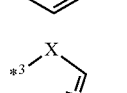
B5

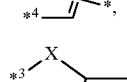
B6 and

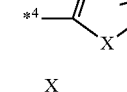
B7 wherein

X is at each occurrence O, S or NR$^1$,

A1, A2, A3, A4, A5, A6, A7, B1, B2, B3, B4, B5, B6 or B7 can be substituted with one to three substituents R$^2$, R$^2$ is at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl, 5 to 20 membered heteroaryl, OR$^{21}$, OC(O)—R$^{21}$, C(O)—OR$^{21}$, $C(O)$—$R^{21}$, $NR^{21}R^{22}$, $NR^{21}$—$C(O)R^{22}$, $C(O)$—$NR^{21}R^{22}$, $N[C(O)R^{21}][C(O)R^{22}]$, $SR^{21}$, halogen, CN, $SiR^{Sis}R^{Sit}R^{Siu}$ and OH, wherein
- $R^{21}$ and $R^{22}$ and are independently selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
- $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl, $C_{2-30}$-alkenyl and $C_{2-30}$-alkynyl can be replaced by O or S,
- $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and one or two $CH_2$-groups, but not adjacent $CH_2$-groups, of $C_{5-12}$-cycloalkyl can be replaced by O, S, OC(O), CO, $NR^e$ or $NR^e$—CO,
- $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$,
- $R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, wherein
- $R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
- $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;
- $C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;
- $C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

wherein
- $R^g$ and $R^h$ are independently selected from the group consisting of H, $C_{1-10}$-alkyl, $C_{2-10}$-alkenyl and $C_{2-10}$-alkynyl, wherein
- $C_{1-10}$-alkyl, $C_{2-10}$-alkenyl and $C_{2-10}$-alkynyl can be substituted with one to five substituents selected from the group consisting of halogen, CN and $NO_2$.

In more preferred polymers comprising at least one unit of formula

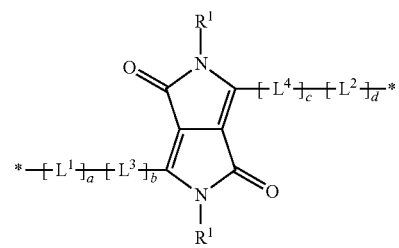

(1)

or of formula

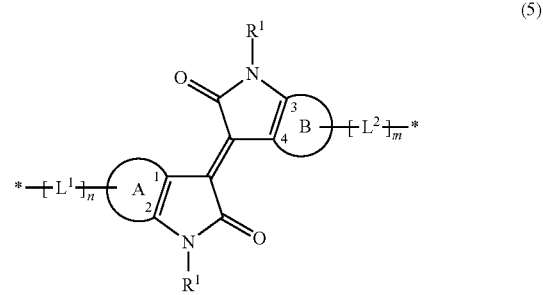

(5)

b and c are independently from each other 1, 2, 3, 4, 5 or 6,
a and d are independently from each other 0, 1, 2 or 3,
n and m are independently from each other 0, 1, 2, 3 or 4,
$R^1$ is at each occurrence selected from the group consisting of $C_{1-100}$-alkyl, $C_{2-100}$-alkenyl and $C_{2-100}$-alkynyl, wherein
- $C_{1-100}$-alkyl, $C_{2-100}$-alkenyl and $C_{2-100}$-alkynyl can be substituted with one to forty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—$Si(R^{Sia})(R^{Sib})(R^{Sic})$, halogen, and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S, wherein
- $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sid}$R$^{Sie}$]$_o$—R$^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sig}$R$^{Sih}$]$_p$—R$^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN; and at least two CH$_2$-groups, but not adjacent CH$_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$)halogen, and CN; and one or two CH$_2$-groups, but not adjacent CH$_2$-groups, of $C_{5-8}$-cycloalkyl can be replaced by O, S, OC(O), CO, NR$^c$ or NR$^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$)halogen, and CN;

wherein

R$^c$ and R$^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sim}$R$^{Sin}$]$_q$—R$^{Sio}$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sip}$R$^{Siq}$]$_r$—R$^{Sir}$, wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN, $L^1$ and $L^2$ are independently from each other and at each occurrence selected from the group consisting of 5 to 20 membered heteroarylene, and

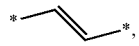, wherein 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, OR$^{31}$, OC(O)—R$^{31}$, C(O)—OR$^{31}$, C(O)—R$^{31}$, NR$^{31}$R$^{32}$, NR$^{31}$—C(O)R$^{32}$, C(O)—NR$^{31}$R$^{32}$, SR$^{31}$, halogen, CN, SiR$^{Siv}$R$^{Siw}$R$^{Six}$ and OH, and wherein

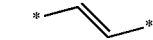

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, C(O) R$^{41}$, C(O)—NR$^{41}$R$^{42}$, C(O)—OR$^{41}$ and CN, wherein $R^{31}$, $R^{32}$, $R^{41}$ and $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and wherein $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$ $R^{Six}$ and $NO_2$; and one or two $CH_2$-groups, but not adjacent $CH_2$-groups, of $C_{5-12}$-cycloalkyl can be replaced by O, S, OC(O), CO, $NR^i$ or $NR^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, OC(O)—$R^j$, C(O)—$OR^i$, C(O)—$R^i$, $NR^iR^j$, $NR^i$—C(O)$R^j$, C(O)—$NR^iR^j$, N[C(O)$R^i$][C(O)$R^j$], $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, OC(O)—$R^l$, C(O)—$OR^k$, C(O)—$R^k$, $NR^kR^l$, $NR^k$—C(O)$R^l$, C(O)—$NR^kR^l$, N[C(O)$R^k$][C(O)$R^l$], $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, OC(O)—$R^l$, C(O)—$OR^k$, C(O)—$R^k$, $NR^kR^l$, $NR^k$—C(O)$R^l$, C(O)—$NR^kR^l$, N[C(O)$R^k$][C(O)$R^l$], $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, OC(O)—$R^l$, C(O)—$OR^k$, C(O)—$R^k$, $NR^kR^l$, $NR^k$—C(O)$R^l$, C(O)—$NR^kR^l$, N[C(O)$R^k$][C(O)$R^l$], $SR^k$, halogen, CN, and $NO_2$;

wherein $R^k$ and $R^l$ are independently selected from the group consisting of H, $C_{1-10}$-alkyl, $C_{2-10}$-alkenyl and $C_{2-10}$-alkynyl, wherein $C_{2-10}$-alkenyl and $C_{2-10}$-alkynyl can be substituted with one to five substituents selected from the group consisting of halogen, CN and $NO_2$, $L^3$ and are $L^4$ are independently from each other and at each occurrence 5 to 20 membered heteroarylene wherein 5 to 20 membered heteroarylene can be substituted with one to six substituents $R^9$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{91}$, OC(O)—$R^{91}$, C(O)—$OR^{91}$, C(O)—$R^{91}$, $NR^{91}R^{92}$, $NR^{91}$—C(O)$R^{92}$, C(O)—$NR^{91}R^{92}$, $SR^{91}$, halogen, CN, $SiR^{Siy}R^{Siz}R^{Siaa}$ and OH, and wherein $R^{91}$ and $R^{92}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^m$, OC(O)—$R^m$, C(O)—$OR^m$, C(O)—$R^m$, $NR^mR^n$, $NR^m$—C(O)$R^n$, C(O)—$NR^mR^n$, N[C(O)$R^m$][C(O)$R^m$], $SR^m$, halogen, CN, $SiR^{Siy}R^{Siz}R^{Siaa}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^m$, OC(O)—$R^m$, C(O)—$OR^m$, C(O)—$R^m$, $NR^mR^n$, $NR^m$—C(O)$R^n$, C(O)—$NR^mR^n$, N[C(O)$R^m$][C(O)$R^n$], $SR^m$, halogen, CN, $SiR^{Siy}R^{Siz}R^{Siaa}$ and $NO_2$; and one or two $CH_2$-groups, but not adjacent $CH_2$-groups, of $C_{5-12}$-cycloalkyl can be replaced by O, S, OC(O), CO, $NR^m$ or $NR^m$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^m$, OC(O)—$R^m$, C(O)—$OR^m$, C(O)—$R^m$, $NR^mR^n$, $NR^m$—C(O)$R^n$, C(O)—$NR^mR^n$, N[C(O)$R^m$][C(O)$R^n$], $SR^m$, halogen, CN, $SiR^{Siy}R^{Siz}R^{Siaa}$ and $NO_2$, $R^{Siy}$, $R^{Siz}$, $R^{Siaa}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, wherein $R^m$ and $R^n$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^o$, OC(O)—$R^o$, C(O)—$OR^o$, C(O)—$R^o$, $NR^oR^p$, $NR^o$—C(O)$R^p$, C(O)—$NR^oR^p$, N[C(O)$R^o$][C(O)$R^p$], $SR^o$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, OC(O)—$R^o$, C(O)—$OR^o$, C(O)—$R^o$, $NR^oR^p$, $NR^o$—C(O)$R^p$, C(O)—$NR^oR^p$, N[C(O)$R^o$][C(O)$R^p$], $SR^o$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, OC(O)—$R^o$, C(O)—$OR^o$, C(O)—$R^o$, $NR^oR^p$, $NR^o$—C(O)$R^p$, C(O)—$NR^oR^p$, N[C(O)$R^o$][C(O)$R^p$], $SR^o$, halogen, CN, and $NO_2$;

wherein $R^o$ and $R^p$ are independently selected from the group consisting of H, $C_{1-10}$-alkyl, $C_{2-10}$-alkenyl and $C_{2-10}$-alkynyl, wherein
C$_{1-10}$-alkyl, C$_{2-10}$-alkenyl and C$_{2-10}$-alkynyl can be substituted with one to five substituents selected from the group consisting of halogen, CN and NO$_2$, A is selected from the group consisting of

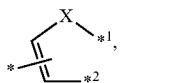

A1

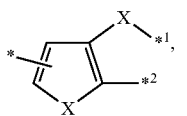

A2

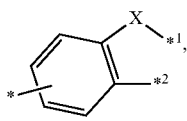

A3

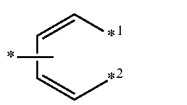

A4

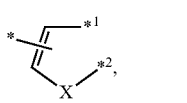

A5

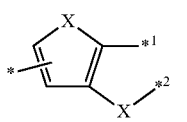

A6 and

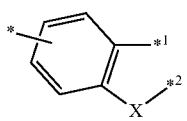

A7 and

B is selected from the group consisting of

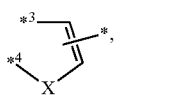

B1

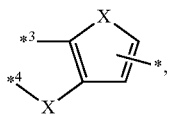

B2

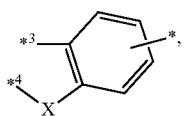

B3

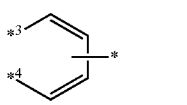

B4

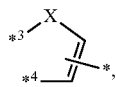

B5

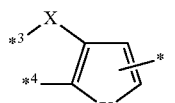

B6 and

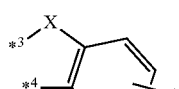

B7 wherein
X is at each occurrence O, S or NR$^1$,
A1, A2, A3, A4, A5, A6, A7, B1, B2, B3, B4, B5, B6 or B7 can be substituted with one to three substituents R$^2$,
R$^2$ is at each occurrence selected from the group consisting of C$_{1-30}$-alkyl, C$_{2-30}$-alkenyl, C$_{2-30}$-alkynyl, C$_{5-12}$-cycloalkyl, C$_{6-18}$-aryl, 5 to 20 membered heteroaryl, OR$^{21}$, OC(O)—R$^{21}$, C(O)—OR$^{21}$, C(O)—R$^{21}$, NR$^{21}$R$^{22}$, NR$^{21}$—C(O)R$^{22}$, C(O)—NR$^{21}$R$^{22}$, N[C(O)R$^{21}$][C(O)R$^{22}$], SR$^{21}$, halogen, CN, SiR$^{Sis}$R$^{Sit}$R$^{Siu}$ and OH, wherein
R$^{21}$ and R$^{22}$ and are independently selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and
C$_{1-30}$-alkyl, C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and at least two CH$_2$-groups, but not adjacent CH$_2$-groups, of C$_{1-30}$-alkyl, C$_{2-30}$-alkenyl and C$_{2-30}$-alkynyl can be replaced by O or S,
C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and one or two CH$_2$-groups, but not adjacent CH$_2$-groups, of C$_{5-12}$-cycloalkyl can be replaced by O, S, OC(O), CO, NR$^e$ or NR$^e$—CO,
C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$,
R$^{Sis}$, R$^{Sit}$ and R$^{Siu}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, wherein
- $R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
- $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;
- $C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;
- $C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;
  wherein
  $R^g$ and $R^h$ are independently selected from the group consisting of H, $C_{1-10}$-alkyl, $C_{2-10}$-alkenyl and $C_{2-10}$-alkynyl,
  wherein
  $C_{1-10}$-alkyl, $C_{2-10}$-alkenyl and $C_{2-10}$-alkynyl can be substituted with one to five substituents selected from the group consisting of halogen, CN and $NO_2$.

In the even more preferred polymers comprising at least one unit of formula (1)

or of formula (5)

b and c are independently from each other 1, 2, 3 or 4,
a and d are independently from each other 0, 1 or 2,
n and m are independently from each other 0, 1 or 2,
$R^1$ is at each occurrence selected from the group consisting of $C_{1-50}$-alkyl, $C_{2-50}$-alkenyl and $C_{2-50}$-alkynyl,
  wherein
  $C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, $OR^a$, $SR^a$, $Si(R^{Sia})(R^{Sib})(R^{Sic})$, $O$—$Si(R^{Sia})(R^{Sib})(R^{Sic})$halogen, and CN; and at least two $CH_2$-groups, but not adjacent $CH_2$-groups, of $C_{1-50}$-alkyl, $C_{2-50}$-alkenyl and $C_{2-50}$-alkynyl can be replaced by O or S,
wherein
$R^a$ and $R^b$ are independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl,
$R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sid}R^{Sie}]_o$—$R^{Sif}$,
wherein
o is an integer from 1 to 50,
$R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—$SiR^{Sig}R^{Sih}]_p$—$R^{Sii}$,
wherein
p is an integer from 1 to 50,
$R^{Sig}$, $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—$Si(CH_3)_3$,
$R^5$, $R^6$, $R^{50}$, $R^{60}$, $R^{500}$ and $R^{600}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl,
$C_{1-30}$-alkyl, $C_{2-30}$-alkenyl and $C_{2-30}$-alkynyl can be substituted with one to ten substituents selected from the group consisting of halogen and CN,
$L^1$ and $L^2$ are independently from each other and at each occurrence selected from the group consisting of 5 to 20 membered heteroarylene,
and wherein 5 to 20 membered heteroarylene is selected from the group consisting of

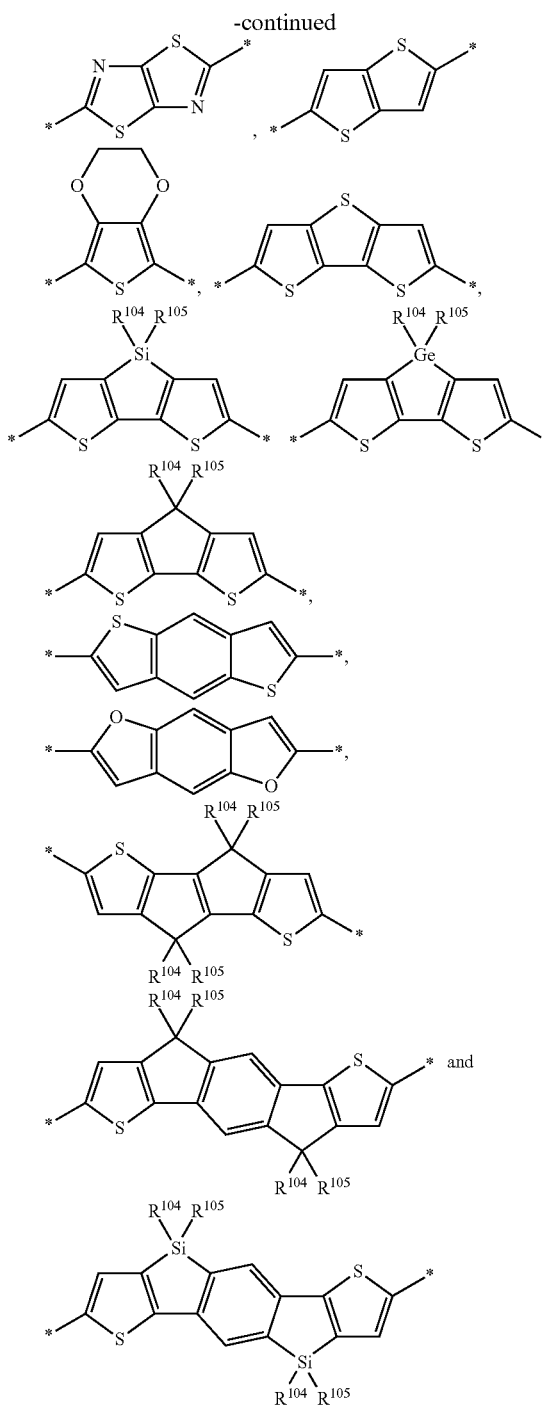

wherein
R¹⁰⁴ and R¹⁰⁵ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or R¹⁰⁴ and R¹⁰⁵, if attached to the same atom, together with the atom, to which they are attached, form a 5 to 12 membered ring system,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO₂;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO₂;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO₂;

5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO₂;
wherein
R$^u$ and R$^v$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and NO₂,
wherein
5 to 20 membered heteroarylene can be substituted with one to four substituents R³ at each occurrence selected from the group consisting of $C_{1-30}$-alkyl and halogen, and
wherein

can be substituted with one or two substituents R⁴ at each occurrence selected from the group consisting of $C_{1-30}$-alkyl, C(O)—R⁴¹, C(O)—OR⁴¹ and CN,
wherein
R⁴¹ is at each occurrence $C_{1-30}$-alkyl,
L³ and are L⁴ are independently from each other and at each occurrence 5 to 20 membered heteroarylene, wherein 5 to 20 membered heteroarylene is selected from the group consisting of

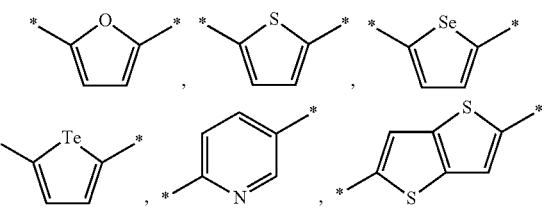

-continued

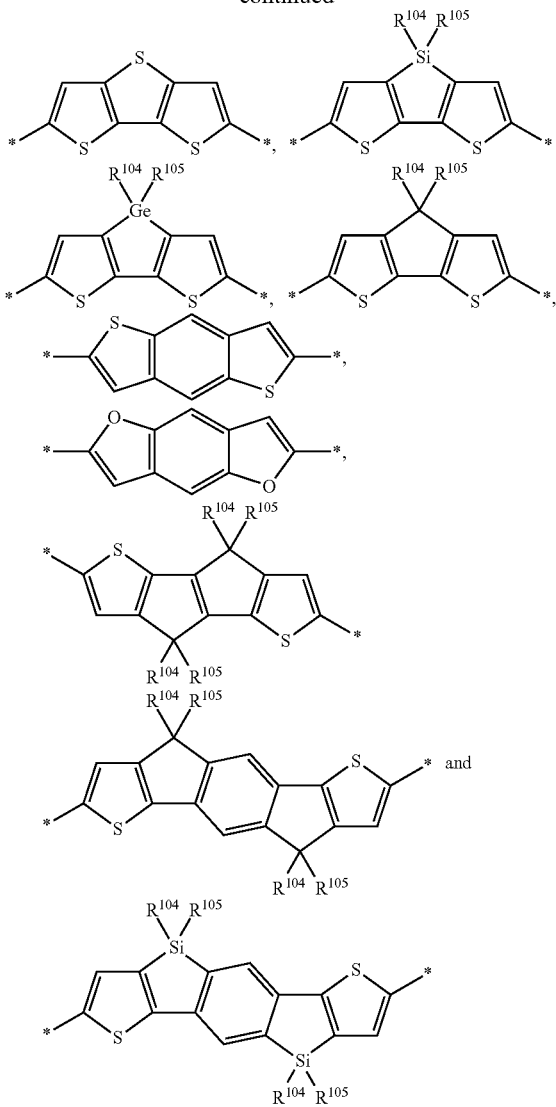

wherein
$R^{104}$ and $R^{105}$ are independently and at each occurrence selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, or $R^{104}$ and $R^{105}$, if attached to the same atom, together with the atom, to which they are attached, form a 5 to 12 membered ring system,
wherein
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^u$, $OC(O)$—$R^u$, $C(O)$—$OR^u$, $C(O)$—$R^u$, $NR^uR^v$, $NR^u$—$C(O)R^v$, $C(O)$—$NR^uR^v$, $N[C(O)R^u][C(O)R^v]$, $SR^u$, halogen, CN, and $NO_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^u$, $OC(O)$—$R^u$, $C(O)$—$OR^u$, $C(O)$—$R^u$, $NR^uR^v$, $NR^u$—$C(O)R^v$, $C(O)$—$NR^uR^v$, $N[C(O)R^u][C(O)R^v]$, $SR^u$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^u$, $OC(O)$—$R^u$, $C(O)$—$OR^u$, $C(O)$—$R^u$, $NR^uR^v$, $NR^u$—$C(O)R^v$, $C(O)$—$NR^uR^v$, $N[C(O)R^u][C(O)R^v]$, $SR^u$, halogen, CN, and $NO_2$;
5 to 12 membered ring system can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^u$, $OC(O)$—$R^u$, $C(O)$—$OR^u$, $C(O)$—$R^u$, $NR^uR^v$, $NR^u$—$C(O)R^v$, $C(O)$—$NR^uR^v$, $N[C(O)R^u][C(O)R^v]$, $SR^u$, halogen, CN, and $NO_2$;
wherein
$R^u$ and $R^v$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and $NO_2$,
wherein
5 to 20 membered heteroarylene can be substituted with one to three substituents $R^9$ at each occurrence selected from the group consisting of $C_{1-30}$-alkyl and halogen,
A is selected from the group consisting of

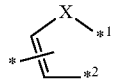  A1

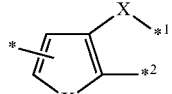  A2

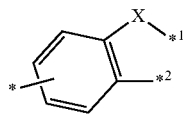  A3
and

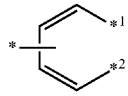  A4 wherein
X is at each occurrence O, S or $NR^1$, and
A1, A2, A3 and A4 can be substituted with one to three substituents $R^2$,
B is selected from the group consisting of

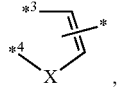  B1

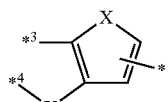  B2

-continued

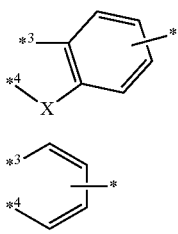

B3 and

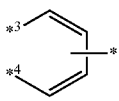

B4 wherein

X is at each occurrence O, S or NR$^1$, and

B1, B2, B3 and B4 can be substituted with one to three substituents R$^2$, wherein R$^2$ is at each occurrence selected from the group consisting of C$_{1-30}$-alkyl and halogen, wherein C$_{1-30}$-alkyl can be substituted with one to ten substituents independently selected from the group consisting of C$_{5-8}$-cycloalkyl, C$_{6-14}$-aryl, 5 to 14 membered heteroaryl, OR$^e$, OC(O)—R$^e$, C(O)—OR$^e$, C(O)—R$^e$, NR$^e$R$^f$, NR$^e$—C(O)R$^f$, C(O)—NR$^e$R$^f$, N[C(O)R$^e$][C(O)R$^f$], SR$^e$, halogen, CN, SiR$^{Sis}$R$^{Sit}$R$^{Siu}$ and NO$_2$; and at least two CH$_2$-groups, but not adjacent CH$_2$-groups, of C$_{1-30}$-alkyl can be replaced by O or S, wherein R$^{Sis}$, R$^{Sit}$ and R$^{Siu}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, R$^e$ and R$^f$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^g$, OC(O)—R$^g$, C(O)—OR$^g$, C(O)—R$^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;

wherein

R$^g$ and R$^h$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$.

In the even more preferred polymers comprising at least one unit of formula

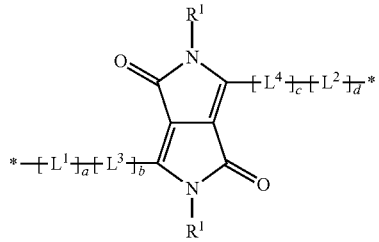

(1)

or of formula

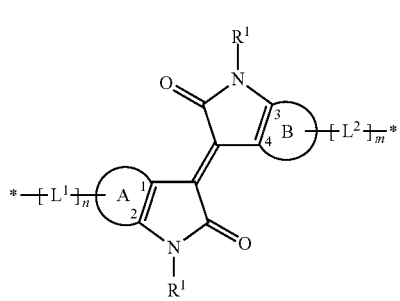

(5)

b and c are independently from each other 1, 2 or 3, a and d are independently from each other 0 or 1, n is 0 or 1, m is 0, 1 or 2, R$^1$ is at each occurrence selected from the group consisting of C$_{1-36}$-alkyl, C$_{2-36}$-alkenyl and C$_{2-36}$-alkynyl, wherein C$_{1-36}$-alkyl, C$_{2-36}$-alkenyl and C$_{2-36}$-alkynyl can be substituted with one to twenty substituents independently selected from the group consisting of C$_{5-6}$-cycloalkyl, C$_{6-10}$-aryl, 5 to 10 membered heteroaryl, OR$^a$, SR$^a$, Si(R$^{Sia}$)(R$^{Sib}$)(R$^{Sic}$), —O—Si(R$^{Sia}$)(R$^{Sib}$)(R$^{Sic}$)halogen, and CN; and at least two CH$_2$-groups, but not adjacent CH$_2$-groups, of C$_{1-36}$-alkyl, C$_{2-36}$-alkenyl and C$_{2-36}$-alkynyl can be replaced by O or S, wherein R$^a$ and R$^b$ are independently selected from the group consisting of H, C$_{1-20}$-alkyl, C$_{2-20}$-alkenyl, C$_{2-20}$-alkynyl, C$_{5-6}$-cycloalkyl and C$_{6-10}$-aryl R$^{Sia}$, R$^{Sib}$ and R$^{Sic}$ are independently selected from the group consisting of H, C$_{1-20}$-alkyl, C$_{2-20}$-alkenyl, C$_{2-20}$-alkynyl, C$_{5-6}$-cycloalkyl, C$_{6-10}$-aryl, —[O—SiR$^{Sia}$R$^{Sie}$]$_o$—R$^{Sif}$ wherein o is an integer from 1 to 50, R$^{Sid}$, R$^{Sie}$, R$^{Sif}$ are independently selected from the group consisting of H, C$_{1-30}$-alkyl, C$_{2-20}$-alkenyl, C$_{2-20}$-alkynyl, C$_{5-6}$-cycloalkyl, C$_{6-10}$-aryl, —[O—SiR$^{Sig}$R$^{Sih}$]$_p$—R$^{Sii}$, wherein p is an integer from 1 to 50, $R^{Sig}$, $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, $O-Si(CH_3)_3$, $R^5$, $R^6$, $R^{50}$, $R^{60}$, Ram and $R^{600}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, and 5 to 10 membered heteroaryl, $C_{1-20}$-alkyl, $C_{2-20}$-alkenyl and $C_{2-20}$-alkynyl can be substituted with one to ten substituents selected from the group consisting of halogen and CN, $L^1$ and $L^2$ are independently from each other and at each occurrence selected from the group consisting of 5 to 20 membered heteroarylene, and

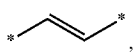

wherein 5 to 20 membered heteroarylene is selected from the group consisting of

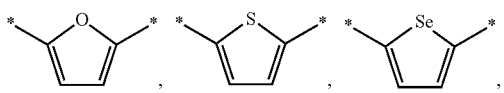

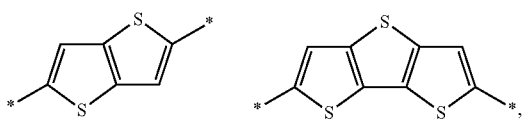

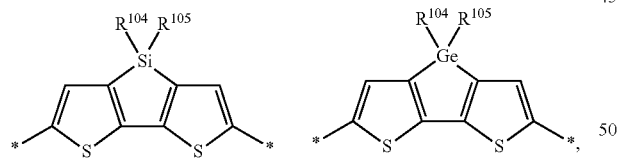

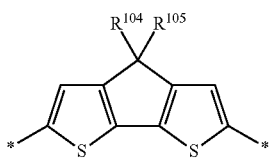

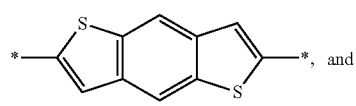, and

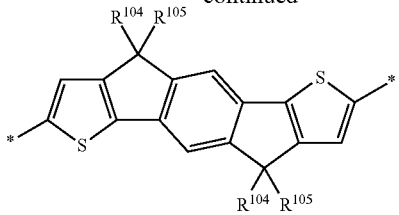

wherein $R^{104}$ and $R^{105}$ are independently and at each occurrence selected from the group consisting of H and $C_{1-20}$-alkyl, wherein 5 to 20 membered heteroarylene can be substituted with one to four substituents $R^3$ at each occurrence selected from the group consisting of $C_{1-30}$-alkyl and halogen, and wherein

is unsubstituted, $L^3$ and $L^4$ are independently from each other and at each occurrence 5 to 20 membered heteroarylene, wherein 5 to 20 membered heteroarylene is selected from the group consisting of

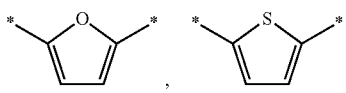

 and

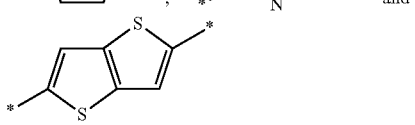

wherein 5 to 20 membered heteroarylene can be substituted with one substituent $R^9$ at each occurrence selected from the group consisting of $C_{1-30}$-alkyl and halogen, A is

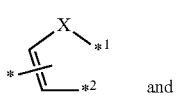 and

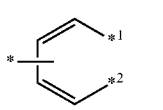

A1

A4 wherein

X is at each occurrence S or NR[1], and

A1 and A4 can be substituted with one to three substituents R[2],

B is

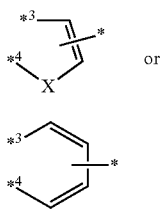

B1 or

B4 wherein

X is at each occurrence S or NR[1], and

B1 and B4 can be substituted with one to three substituents R[2], wherein

R[2] is at each occurrence selected from the group consisting of unsubstituted $C_{1-30}$-alkyl and halogen.

In the most preferred polymers comprising at least one unit of formula

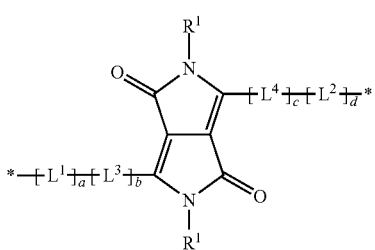

(1)

or of formula

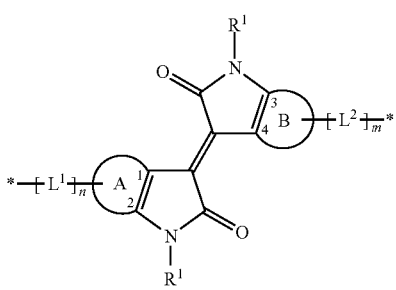

(5)

b and c are independently from each other 1, 2 or 3, a and d are 0, n is 0, m is 0, 1 or 2, R[1] is at each occurrence unsubstituted $C_{1-36}$-alkyl, L[2] is at each occurrence selected from the group consisting of 5 to 20 membered heteroarylene, and

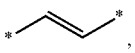

, wherein 5 to 20 membered heteroarylene is

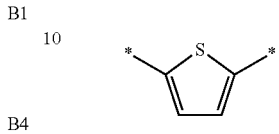

wherein 5 to 20 membered heteroarylene is unsubstituted, and wherein

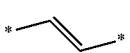

is unsubstituted,

L[3] and L[4] are independently from each other and at each occurrence 5 to 20 membered heteroarylene, wherein 5 to 20 membered heteroarylene is

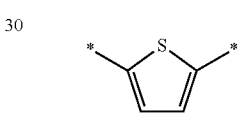

wherein 5 to 20 membered heteroarylene is unsubstituted.

A is

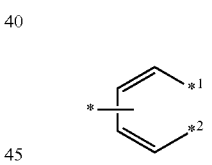

A4 wherein

A4 is not substituted,

B is

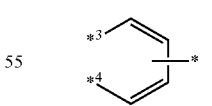

B4 wherein

B4 is not substituted.

The polymers comprising at least one unit of formula (1) are preferred to the polymers comprising at least one unit of formula (5).

The particular preferred polymers comprising a unit of formula (1) are the polymers comprising at least a unit of formulae (1a)
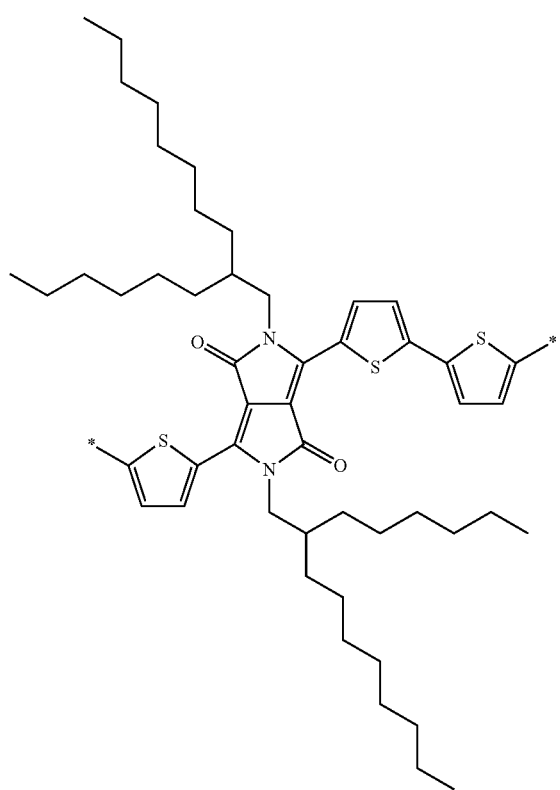
(1b)
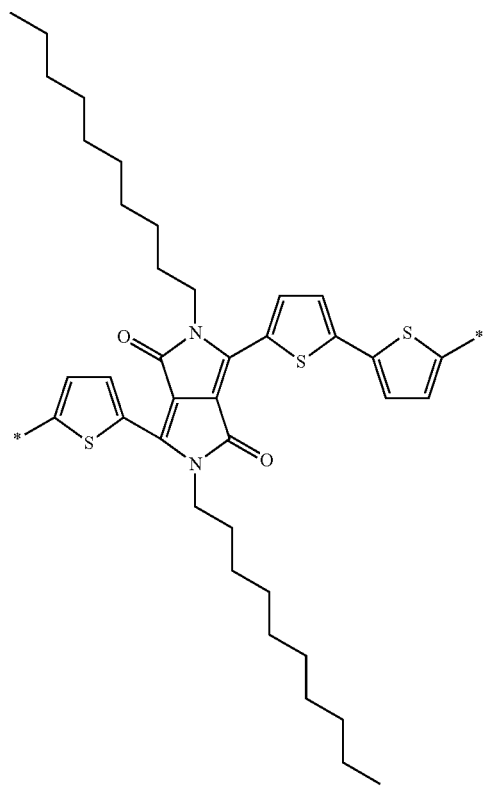
or

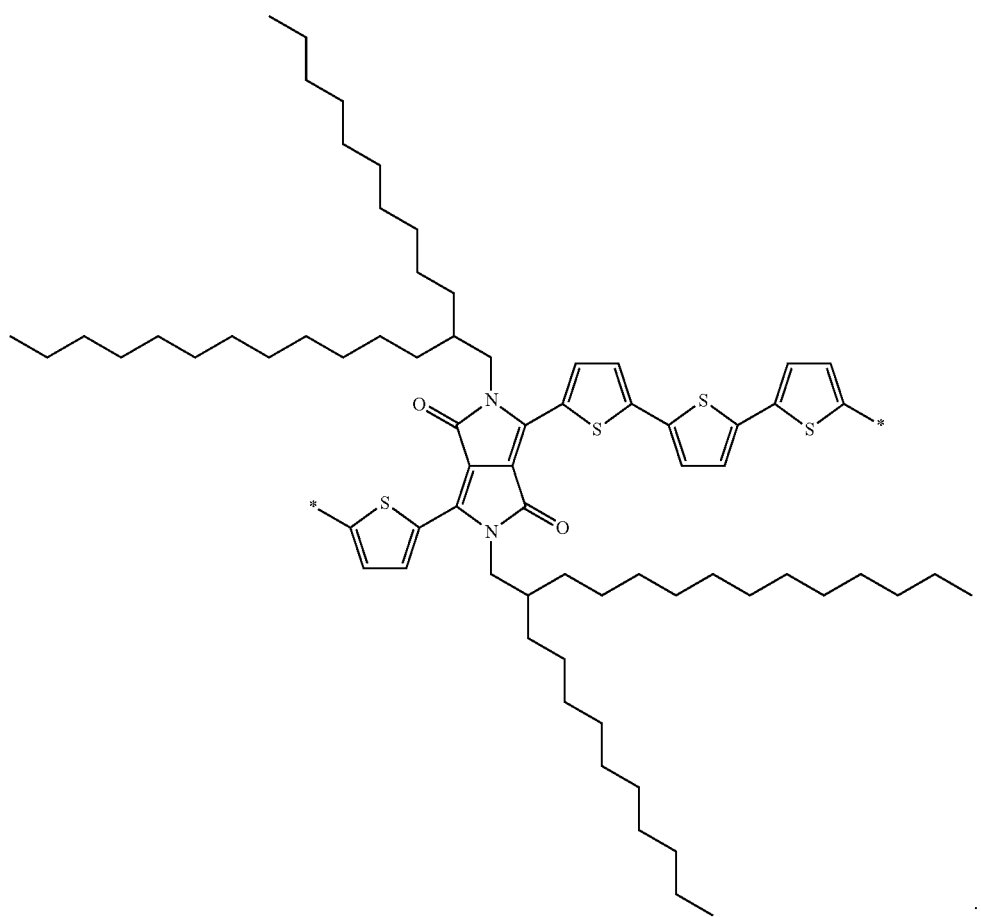
(1c)
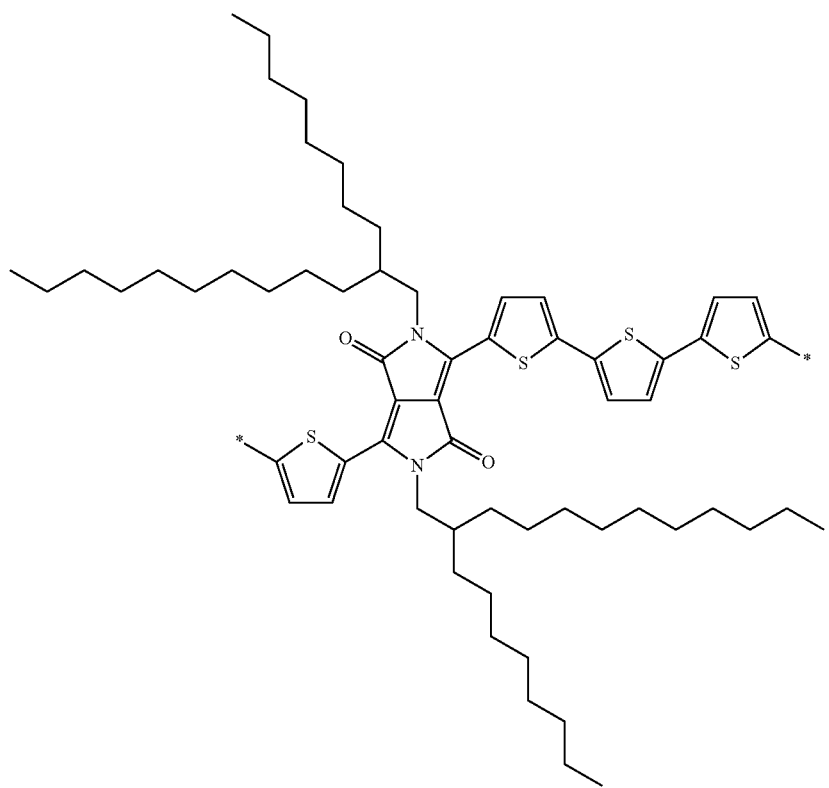
(1d)

The polymers comprising at least one unit of formula

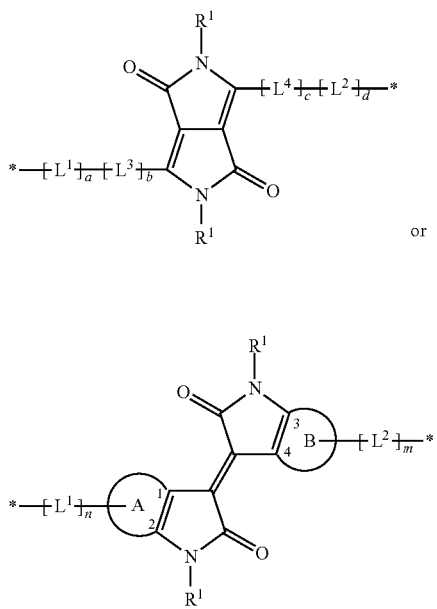

(1)

or (5)

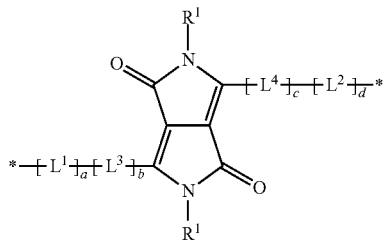

wherein a, b, c, d, n, m, $R^1$, $L^1$, $L^2$, $L^3$, $L^4$, A and B are as defined above, can be prepared by methods known in the art, for example using known Suzuki-type or Stille-type copolymerisation conditions.

For example, the polymer comprising at least a unit of formula (1)

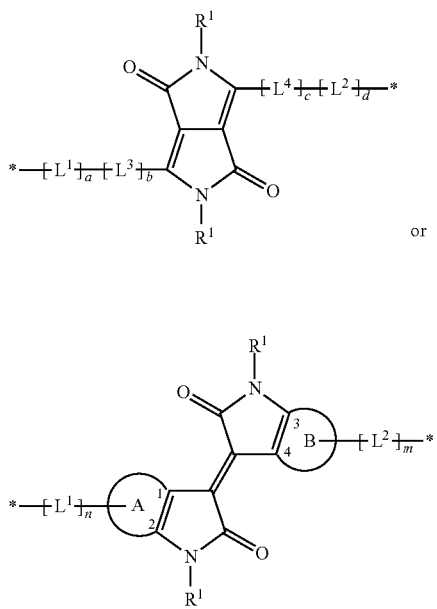

wherein a, b, c, d, $R^1$, $L^1$, $L^2$, $L^3$ and $L^4$ are as defined above, can be prepared by treating a compound of formula (3)

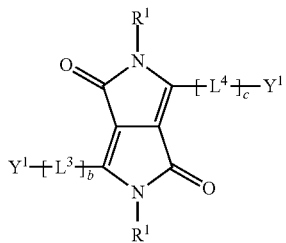

wherein b, c, $R^1$, $L^3$ and $L^4$ are as defined for the unit of formula (1), and $Y^1$ is at each occurrence I, Br, Cl or $O\text{—}S(O)_2CF_3$, with compounds of formulae $$Z^a\text{—}[L^2]_d\text{—}Z^b \quad \text{and/or} \tag{2}$$

$$Z^a\text{—}[L^1]_a\text{—}Z^b \tag{4}$$

wherein $L^1$, $L^2$, a and d is as defined for the unit of formula (1), and $Z^a$ and $Z^b$ are independently and at each occurrence selected from the group consisting of $B(OZ^1)(OZ^2)$, $SnZ^1Z^2Z^3$,

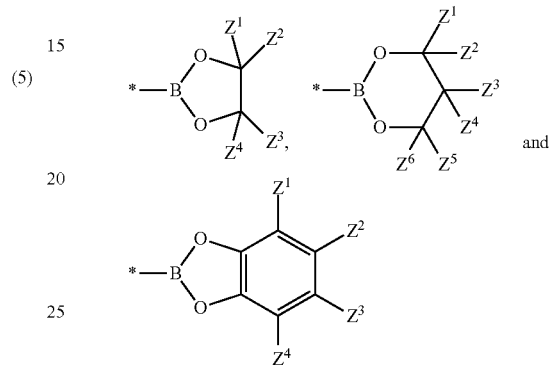

and

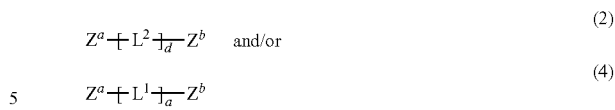

wherein $Z^1$, $Z^2$, $Z^3$, $Z^4$, $Z^5$ and $Z^6$ are independently from each other and at each occurrence H or $C_{1-4}$-alkyl.

For example, polymers comprising a unit of formula (5)

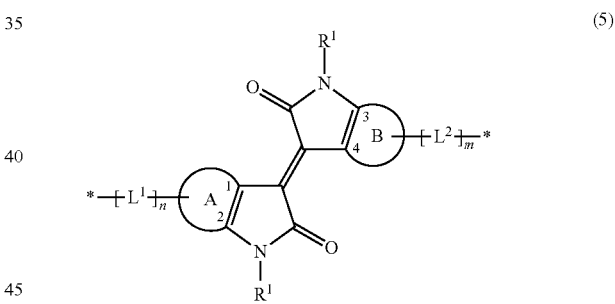

wherein n, m, $R^1$, $L^1$, $L^2$, A and B are as defined above, can be prepared by treating a compound of formula (6)

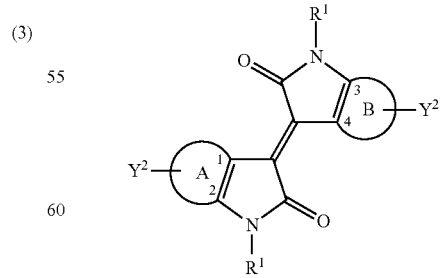

wherein n, m, $R^1$, $L^1$, $L^2$, A and B are as defined for the unit of formula (5), and $Y^2$ is at each occurrence I, Br, Cl or $O\text{—}S(O)_2CF_3$, with compounds of formulae

wherein $L^1$, $L^2$, n and m are as defined for the unit of formula (5), and $Z^a$ and $Z^b$ are independently and at each occurrence selected from the group consisting of $B(OZ^1)(OZ^2)$, $SnZ^1Z^2Z^3$,

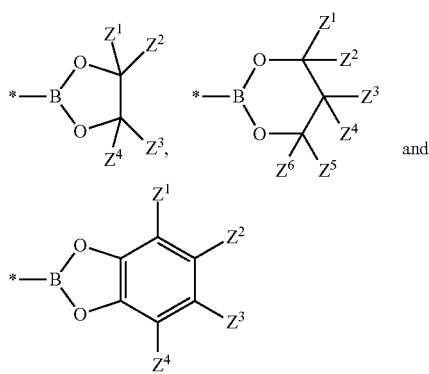

wherein $Z^1$, $Z^2$, $Z^3$, $Z^4$, $Z^5$ and $Z^6$ are independently from each other and at each occurrence H or $C_{1-4}$-alkyl.

When $Z^a$ and $Z^b$ are independently and at each occurrence selected from the group consisting of $B(OZ^1)(OZ^2)$,

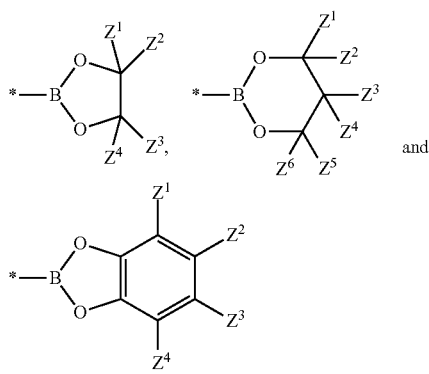

wherein $Z^1$, $Z^2$, $Z^3$, $Z^4$, $Z^5$ and $Z^6$ are independently from each other and at each occurrence H or $C_{1-4}$-alkyl,
the reaction is usually performed in the presence of a catalyst, preferably a Pd catalyst such as $Pd(P(Ph)_3)_4$, $Pd(OAc)_2$ and $Pd_2(dba)_3$, and a base such as $K_3PO_4$, $Na_2CO_3$, $K_2CO_3$, LiOH and NaOMe. Depending on the Pd catalyst, the reaction may also require the presence of a phosphine ligand such as $P(Ph)_3$, $P(o\text{-tolyl})_3$ and $P(\text{tert-Bu})_3$. The reaction is also usually performed at elevated temperatures, such as at temperatures in the range of 40 to 250° C., preferably 60 to 200° C. The reactions can be performed in the presence of a suitable solvent such as tetrahydrofuran, toluene or chlorobenzene. The reaction is usually performed under inert gas.

When $Z^a$ and $Z^b$ are independently $SnZ^1Z^2Z^3$, wherein $Z^1$, $Z^2$ and $Z^3$ are independently from each other and at each occurrence $C_{1-4}$-alkyl, the reaction is usually performed in the presence of a catalyst, preferably a Pd catalyst such as $Pd(P(Ph)_3)_4$ and $Pd_2(dba)_3$. Depending on the Pd catalyst, the reaction may also require the presence of a phosphine ligand such as $P(Ph)_3$, $P(o\text{-tolyl})_3$ and $P(\text{tert-Bu})_3$. The reaction is also usually performed at elevated temperatures, such as at temperatures in the range of 40 to 250° C., preferably 60 to 200° C. The reaction can be performed in the presence of a suitable solvent such as toluene or chlorobenzene. The reaction is usually performed under inert gas.

Also part of the present invention is a composition comprising semiconducting single-walled carbon nanotubes, a semiconducting polymer and solvent A, wherein the semiconducting polymer has a band gap in the range of 0.5 to 1.8 eV and solvent A comprises an aromatic or heteroaromatic solvent (composition A).

Preferably, composition A is obtainable by the process of the present invention.

Also part of the invention is a process for forming an electronic device, which process comprises the step of forming a layer, which layer comprises semiconducting single-walled carbon nanotubes and a semiconducting polymer, by applying a composition comprising semiconducting single-walled carbon nanotubes, the semiconducting polymer and solvent A, wherein the semiconducting polymer has a band gap in the range of 0.5 to 1.8 eV and solvent A comprises an aromatic or heteroaromatic solvent (composition A), to a precursor of the electronic device.

The layer can be formed by applying composition A to the precursor of the electronic device using any suitable liquid processing technique such as spin coating, blading, slot-die coating, drop-casting, spray-coating, ink-jetting or soaking the precursor of the electronic device in composition A. Preferably, composition A is applied by blading, slot-die coating, spray-coating or soaking the precursor of the electronic device in composition A. More preferably, composition A is applied by blading, slot-die coating or soaking the precursor of the electronic device in composition A.

The electronic device can be an organic photovoltaic device (OPVs), an organic field-effect transistor (OFETs), an organic light emitting diode (OLEDs) or an organic photodiode (OPDs).

Preferably, the electronic device is an organic photovoltaic device (OPVs), an organic field-effect transistor (OFETs) or an organic photodiode (OPDs).

More preferably, the electronic device is an organic field effect transistor (OFET).

Preferably, the electronic device is an organic field-effect transistor (OEFT) and the layer is the semiconducting layer.

Usually, an organic field effect transistor comprises a dielectric layer, a semiconducting layer and a substrate. In addition, an organic field effect transistor usually comprises a gate electrode and source/drain electrodes.

Preferably, the semiconducting layer can have a thickness of 5 to 500 nm, preferably of 10 to 100 nm, more preferably of 20 to 50 nm.

The dielectric layer comprises a dielectric material. The dielectric material can be silicon dioxide or aluminium oxide, or, an organic polymer such as polystyrene (PS), poly(methylmethacrylate) (PMMA), poly(4-vinylphenol) (PVP), poly(vinyl alcohol) (PVA), benzocyclobutene (BCB), or polyimide (PI). The dielectric layer can have a thickness of 10 to 2000 nm, preferably of 50 to 1000 nm, more preferably of 100 to 800 nm.

The dielectric layer can in addition to the dielectric material comprise a self-assembled monolayer of organic silane derivates or organic phosphoric acid derivatives. An example of an organic silane derivative is octyltrichlorosilane. An examples of an organic phosphoric acid derivative is octyldecylphosphoric acid. The self-assembled monolayer comprised in the dielectric layer is usually in contact with the semiconducting layer.

The source/drain electrodes can be made from any suitable organic or inorganic source/drain material. Examples of inorganic source/drain materials are gold (Au), silver (Ag), chromium (Cr) or copper (Cu), as well as alloys comprising at least one of these metals. The source/drain electrodes can have a thickness of 1 to 100 nm, preferably from 20 to 70 nm.

The gate electrode can be made from any suitable gate material such as highly doped silicon, aluminium (Al), tungsten (W), indium tin oxide or gold (Au), or alloys comprising at least one of these metals. The gate electrode can have a thickness of 1 to 200 nm, preferably from 5 to 100 nm.

The substrate can be any suitable substrate such as glass, or a plastic substrate such as polyethersulfone, polycarbonate, polysulfone, polyethylene terephthalate (PET) and polyethylene naphthalate (PEN). Depending on the design of the organic field effect transistor, the gate electrode, for example highly doped silicon can also function as substrate.

The organic field effect transistor can be prepared by methods known in the art.

For example, a bottom-gate top-contact organic field effect transistor can be prepared as follows: The dielectric material, for example $Al_2O_3$ or silicon dioxide, can be applied as a layer on a gate electrode such as highly doped silicon wafer, which also functions as substrate, by a suitable deposition method such as atom layer deposition or thermal evaporation. A self-assembled monolayer of an organic phosphoric acid derivative or an organic silane derivative can be applied to the layer of the dielectric material. For example, the organic phosphoric acid derivative or the organic silane derivative can be applied from solution using solution-deposition techniques. The semiconducting layer can be formed by either solution deposition such as soaking or thermal evaporation in vacuo of composition A on the self-assembled monolayer of the organic phosphoric acid derivative or the organic silane derivative. Source/drain electrodes can be formed by deposition of a suitable source/drain material, for example tantalum (Ta) and/or gold (Au), on the semiconducting layer through a shadow masks.

For example, a bottom-gate bottom-contact organic field effect transistor can be prepared as follows: The dielectric material, for example silicon dioxide, can be applied as a layer on a gate electrode such as highly doped silicon wafer, which also functions as substrate, by a suitable deposition method such as atom layer deposition or thermal evaporation. Source/drain electrodes can be formed by evaporating a suitable source/drain material, for example gold (Au) or chromium (Cr), on photo-lithographically defined electrodes on the dielectric layer. The semiconducting layer can be formed by applying composition A on the source/drain electrodes and the dielectric layer, followed by rinsing the layer with a suitable solvent such as toluene, and annealing the layer at elevated temperatures such as at a temperature in the range of 80 to 360° C.

The channel width (W) is typically in the range of 10 to 2000 µm and the channel length (L) is typically in the range of 5 to 100 µm.

Also part of the present invention is an electronic device obtainable by the process of the present invention.

Also part of the present invention is the use of a composition comprising semiconducting single-walled carbon nanotubes, a semiconducting polymer and solvent A, wherein the semiconducting polymer has a band gap in the range of 0.5 to 1.8 eV and solvent A comprises an aromatic or a heteroaromatic solvent (composition A) for forming a semiconducting layer, preferably in an electronic device.

The process of the present invention provides a composition comprising semiconducting single-walled carbon nanotubes, a semiconducting polymer and solvent A, wherein the semiconducting polymer has a band gap in the range of 0.5 to 1.8 eV and solvent A comprises an aromatic or a heteroaromatic solvent (composition A), which composition is suitable forming a semiconducting layer in an electronic device, preferably in an organic field effect transistor (OFETs).

The process of the present invention for the preparation of composition A is in particular advantageous as it is highly selective for large diameter semiconducting single-walled carbon nanotubes, for example semiconducting single-walled carbon nanotubes having a diameter in the range of 1.3 to 1.6 nm, preferably 1.4 to 1.5 nm. Compared with small-diameter (<1.3 nm) semiconducting SWNTs, large-diameter semiconducting SWNTs are highly desired for logic circuits applications due to their negligible Schottky barrier and high charge carrier mobility while maintaining high on/off ratios.

Furthermore the composition A is compatible with liquid processing techniques.

The organic field effect transistors (OFETs) of the present invention comprising a semiconducting layer formed from composition A show a high charge carrier mobility and a high on/off ratio.

Figure 1:
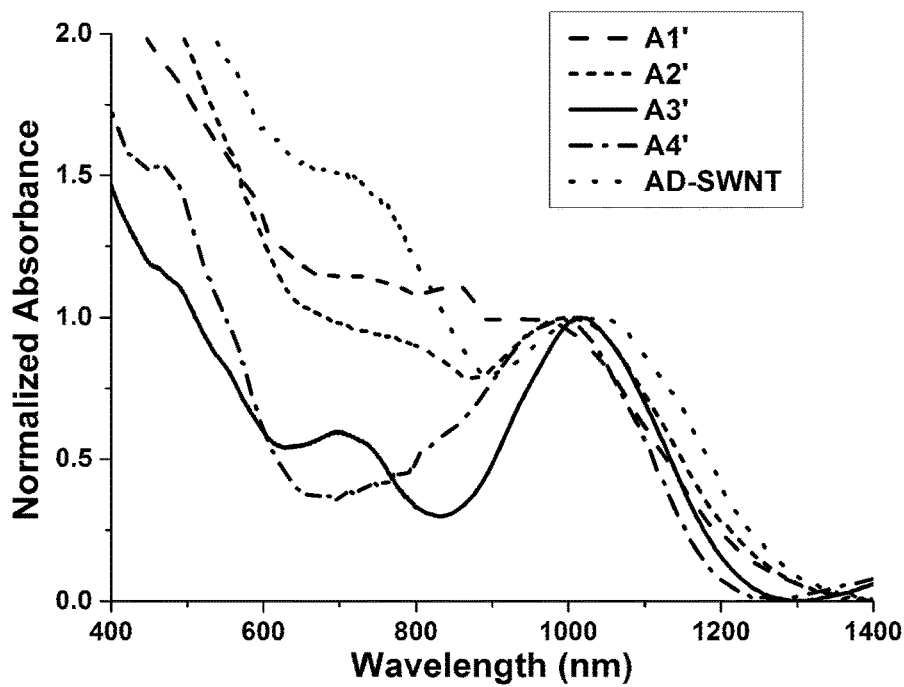
FIG. 1 shows the normalized UV-VIS spectra of compositions A-1', A-2', A-3' and A-4', all comprising semiconducting polymer removed semiconducting SWNTs, and the normalized UV-VIS spectra of SDBS-removed arc-discharged SWNTs in solid state.

EXAMPLES
Example 1
Preparation of Polymer Pc
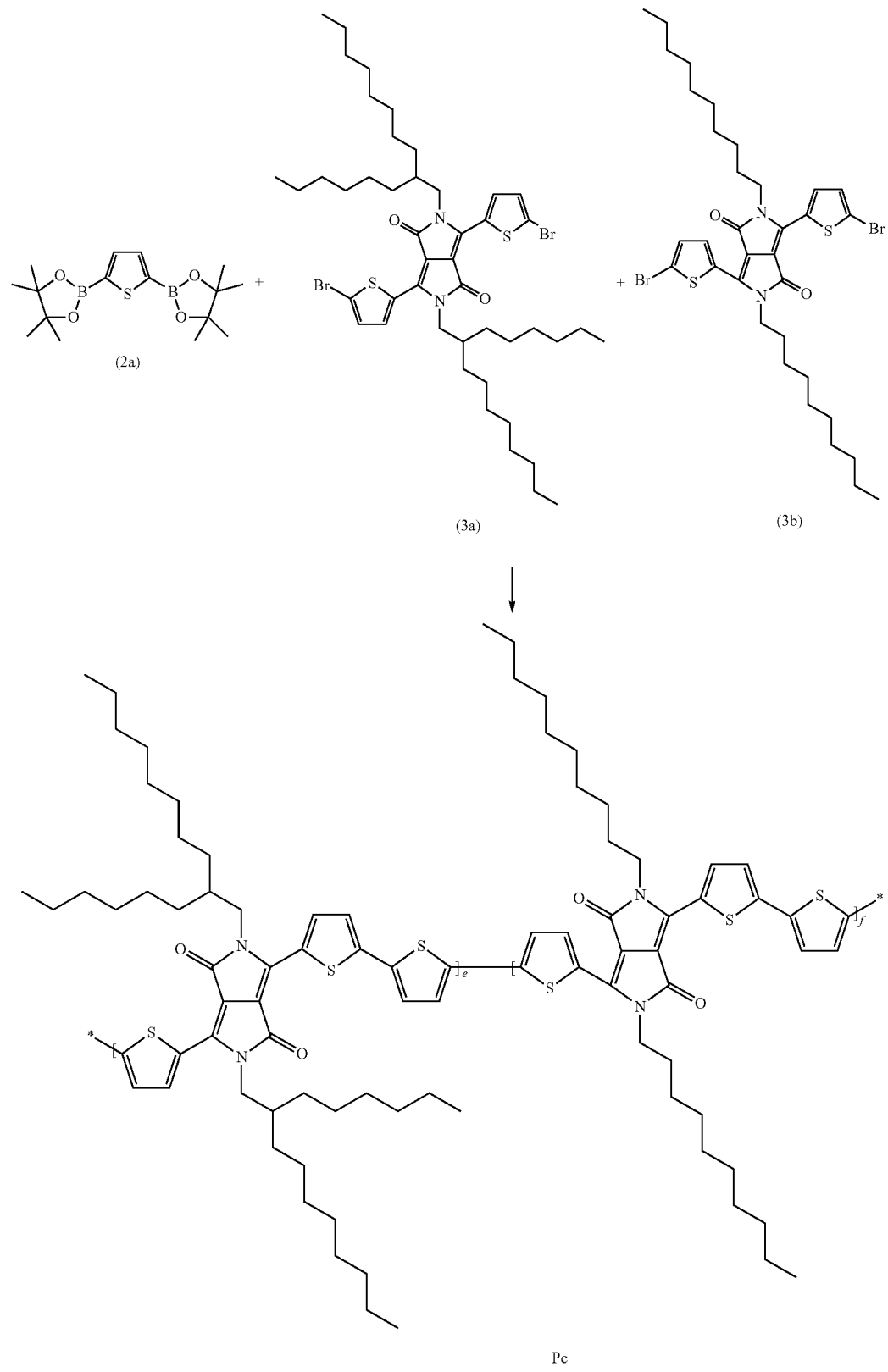

815 mg (2.423 mmol) of compound 2a, 1972 mg (2.181 mmol) of compound 3a, 179 mg (0.242 mmol) of compound 3b, 78.30 mg of tris(dibenzylideneacetone)dipalladium(0) ($Pd_2(dba)_3$) and 48.15 mg of tri-tert-butylphosphonium tetrafluoroborate (($tert$-$Bu)_3P \times HBF_4$) are placed together in 50 ml of tetrahydrofuran under Argon. The reaction mixture is heated to reflux, and then 1600 mg potassium phosphate in 5 ml of degassed water is added. The reaction mixture is refluxed overnight. Then the reaction mixture is poured on water and the precipitate is filtered and washed with water and methanol. The precipitate is then Soxhlet fractionated with heptane, tetrahydrofuran, toluene, chloroform and chlorobenzene. To remove catalyst residues, the selected fraction is evaporated and the residue is dissolved in 150 ml of chlorobenzene. Then 50 ml of a 1% NaCN aqueous solution is added and the mixture is heated and stirred overnight at reflux. The phases are separated and the organic phase is washed 3 times with 10 ml of deionized water for 3 hours at reflux. Polymer Pc is then precipitated from the organic phase by addition of methanol. The precipitated Pc is filtered, washed with methanol and dried. Polymer Pc is a random polymer. GPC (1,2,4-trichlorobenzene, 150° C., polystyrene standard): $M_n$=47.0 kDa, $M_w$=129.6 kDa, PDI=2.76. UV-VIS-absorption spectrum: $\lambda_{max}$: 840 nm (film) and 832 nm ($10^{-5}$ M solution in toluene). The film was prepared by spin-coating a solution of 5 mg Polymer Pc in 25 mL toluene on a glass substrate. Elemental analysis: C, 71.60%, H, 8.73%, N, 3.59%, S, 11.40%. Band gap $Eg^{opt}$: 1.35 eV.

Example 2

Preparation of polymer Pa

Polymer Pa is prepared in analogy to Polymer Pc in example 1, except that 733 mg (2.181 mmol) of compound 2a and 1972 mg (2.181 mmol) of compound 3a, and no compound 3b are used. Polymer Pa is a random polymer. GPC (1,2,4-trichlorobenzene, 150° C., polystyrene standard): $M_n$=36.0 kDa, $M_w$=36.0 kDa, PDI=1.82. UV-VIS-absorption spectrum: $\lambda_{max}$: 840 nm (film) and 840 nm ($10^{-5}$ M solution in toluene). The thin film was prepared by spin-coating a solution of 5 mg Polymer Pa in 25 mL toluene on a glass substrate. Elemental analysis: C, 72.50%, H 8.95%, N 3.66%, S 11.20%. Band gap $Eg^{opt}$: 1.36 eV.

Example 3

Preparation of polymer Pb

Polymer Pb is prepared in analogy to Polymer Pc in example 1, except that 722 mg (2.296 mmol) of compound 2a and 1972 mg (2.181 mmol) of compound 3a, and 85 mg (0.115 mmol) of compound 3b are used. Polymer Pb is a random polymer. GPC (1,2,4-trichlorobenzene, 150° C., polystyrene standard): $M_n$=43.7 kDa, $M_w$=150.7 kDa, PDI=3.45. UV-VIS-absorption spectrum: $\lambda_{max}$: 836 nm (film) and 828 nm ($10^{-5}$ M solution in toluene). The thin film was prepared by spin-coating a solution of 5 mg Polymer Pb in 25 mL toluene on a glass substrate. Elemental analysis: C 72.85%, H 8.69%, N 3.61%, S 11.40%. Band gap $Eg^{opt}$: 1.35 eV.

Example 4

Preparation of polymer Pd

Polymer Pd is prepared in analogy to Polymer Pc in example 1, except that 916 mg (2.726 mmol) of compound 2a and 1972 mg (2.181 mmol) of compound 3a, and 403 mg (0.545 mmol) of compound 3b are used. Polymer Pd is a random polymer. GPC (1,2,4-trichlorobenzene, 150° C., polystyrene standard): $M_n$=30.7 kDa, $M_w$=80.2 kDa, PDI=2.61. UV-VIS-absorption spectrum: $\lambda_{max}$: 844 nm (film) and 848 nm ($10^{-5}$ M solution in toluene). The thin film was prepared by spin-coating a solution of 5 mg Polymer Pd in 25 mL toluene on a glass substrate. Elemental analysis: C 72.45%, H 8.51%, N 3.79%, S 11.60%. Band gap $Eg^{opt}$: 1.35 eV.

Example 5

Preparation of Polymer Pe

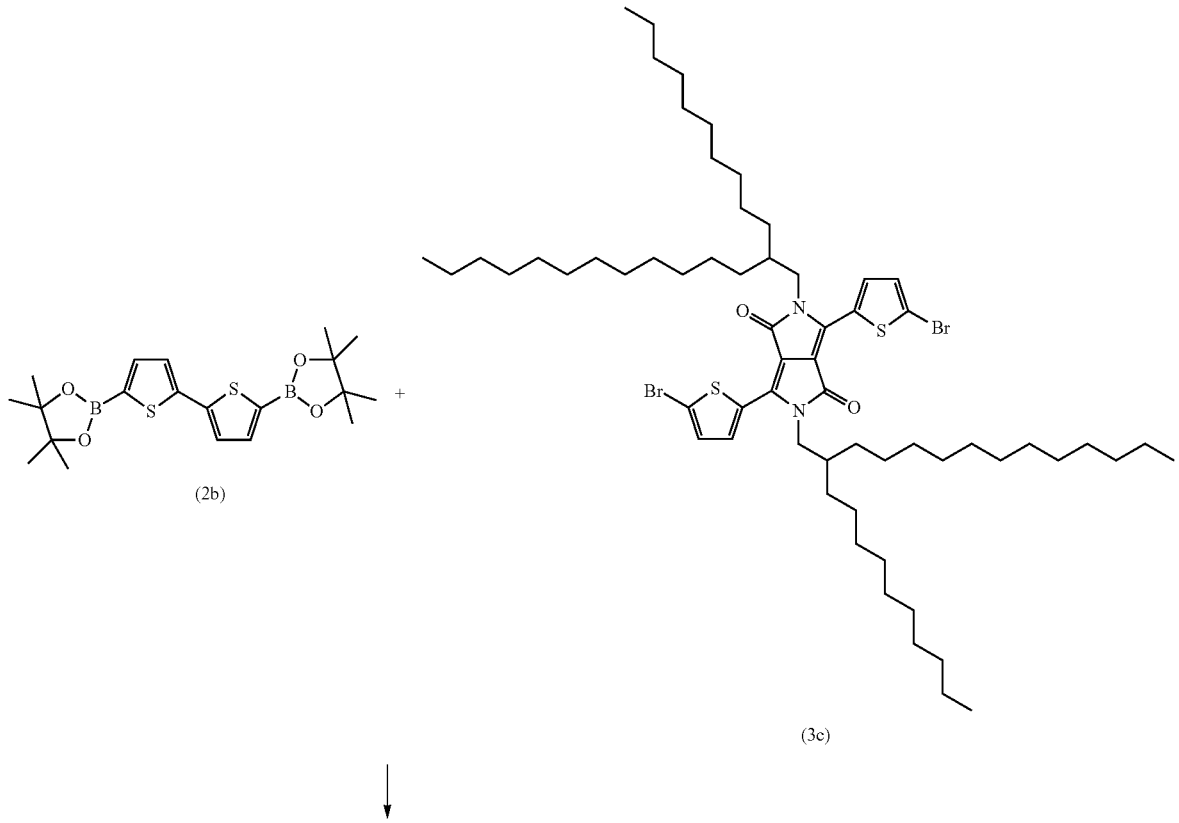

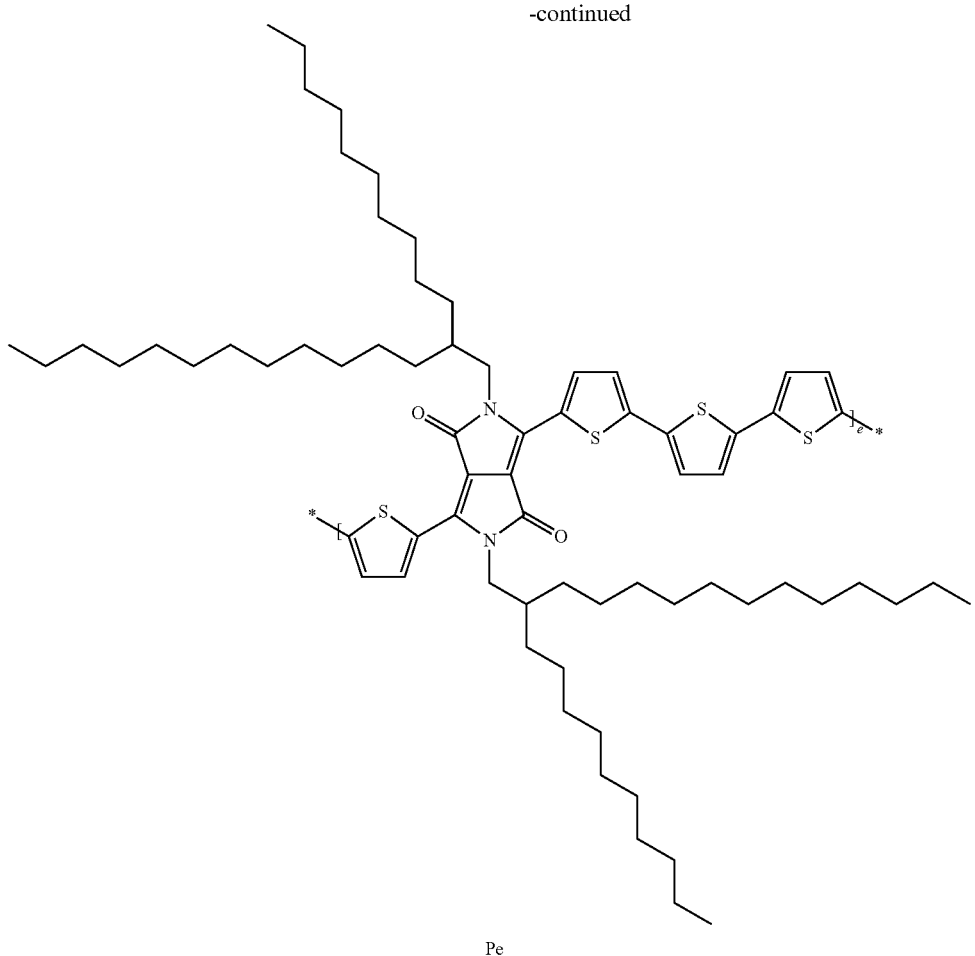

Pe

Polymer Pe is prepared in analogy to Polymer Pa in example 2, except that 739 mg (1.768 mmol) of compound 2b and 1995 mg (1.768 mmol) of compound 3c are used. GPC (1,2,4-trichlorobenzene, 150° C., polystyrene standard): $M_n$=63.8 kDa, $M_w$=64.9 kDa, PDI=1.76.

Example 6

Preparation of compositions comprising semiconducting SWNTs and polymer Pa, Pb, Pc, respectively, Pd 5 mg of polymer Pa, Pb, Pc, respectively, Pd and 3 mg of arc-discharged SWNTs (tradename "P2 SWNT" from Carbon Solutions Inc, Riverside, Calif.; 90% purity for SWNTs, diameters in the range of about 1.1-1.8 nm, amount of metallic SWNT about 30%) were mixed in 25 mL of toluene and ultrasonicated for 30 min at an amplitude level of 70% (Cole Parmer ultrasonicator 750 W). The dispersion was then centrifuged at 17 000 rpm for 30 min at 16° C. (Sorvall RCSC-plus). The supernatants were collected and represent composition A-1, A-2, A-3, respectively, A-4.

Composition A-1 comprises semiconducting SWNTs and polymer Pa.

Composition A-2 comprises semiconducting SWNTs and polymer Pb.

Composition A-3 comprises semiconducting SWNTs and polymer Pc.

Composition A-4 comprises semiconducting SWNTs and polymer Pd.

Compositions A-1, A-2, A-3 and A-4 were drop-casted on a glass substrate and annealed at 500° C. under Argon for 1 h in order to yield polymer-removed compositions A-1', A-2', A-3' and A-4'.

Composition A-1' comprises semiconducting SWNTs and is derived from composition A-1.

Composition A-2' comprises semiconducting SWNTs and is derived from composition A-2.

Composition A-3' comprises semiconducting SWNTs and is derived from composition A-3.

Composition A-4' comprises semiconducting SWNTs and is derived from composition A-4.

For comparison, arc-discharged SWNTs (tradename "P2 SWNT" from Carbon Solutions Inc, Riverside, Calif.; 90% purity for SWNTs) dispersed in 1% sodium dodecylbenzenesulfonate (SDBS) aqueous solution was drop-casted on a glass substrate and annealed at 500° C. under Ar for 1 h in order to yield SDBS-removed arc-discharged SWNTs.

FIG. 1 shows the normalized UV-VIS spectra of compositions A-1', A-2', A-3', A-4' and SDBS-removed arc-discharged SWNTs in solid state.

Metallic SWNTs absorb in the range of 600 to 850 nm. Semiconducting SWNTs absorb in the range of 900 to 1330 nm. FIG. 1 clearly shows that the absorption of compositions A-1', A-2', A-3', A-4' in the range of 600 to 850 nm is decreased compared to the absorption of SDS-removed arc-discharged SWNTs in this wavelength range. Thus, the ratio of semiconducting SWNT/metallic SWNT is higher in A-1', A-2', A-3', A-4' compositions than in SDBS-removed arc-discharged SWNTs. Composition A-4' shows the highest ratio of semiconducting SWNT/metallic SWNT.

Example 7

Preparation of compositions comprising semiconducting SWNTs and polymer Pc 5 mg of polymer Pc and 3 mg, 5 mg, 7 mg, respectively, 10 mg of arc-discharged SWNTs (tradename "P2 SWNT" from Carbon Solutions Inc, Riverside, Calif.; 90% purity for SWNTs) were mixed in 25 mL of toluene and ultrasonicated for 30 min at an amplitude level of 70% (Cole Parmer ultrasonicator 750 W). The dispersion was then centrifuged at 17 000 rpm for 30 min at 16° C. (Sorvall RCSC-plus). The supernatants were collected and represent composition A-3, A-5, A-6 and A-7.

Composition A-3 comprises semiconducting SWNTs and polymer Pc, and is derived from the dispersion of 5 mg Pc and 3 mg arc-discharged SWNTs.

Composition A-5 comprises semiconducting SWNTs and polymer Pc, and is derived from the dispersion of 5 mg Pc and 5 mg arc-discharged SWNTs.

Composition A-6 comprises semiconducting SWNTs and polymer Pc, and is derived from the dispersion of 5 mg Pc and 7 mg arc-discharged SWNTs.

Composition A-7 comprises semiconducting SWNTs and polymer Pc, and is derived from the dispersion of 5 mg Pc and 10 mg arc-discharged SWNTs.

Compositions A-3, A-5, A-6 and A-7 were drop-casted on a glass substrate and annealed at 500° C. under Argon for 1 h in order to yield polymer-removed composition A-3', A-5', A-6' and A-7'.

Composition A-3' comprises semiconducting SWNTs and is derived from composition A-3.

Composition A-5' comprises semiconducting SWNTs and is derived from composition A-5.

Composition A-6' comprises semiconducting SWNTs and is derived from composition A-6.

Composition A-7' comprises semiconducting SWNTs and is derived from composition A-7.

Figure 2:
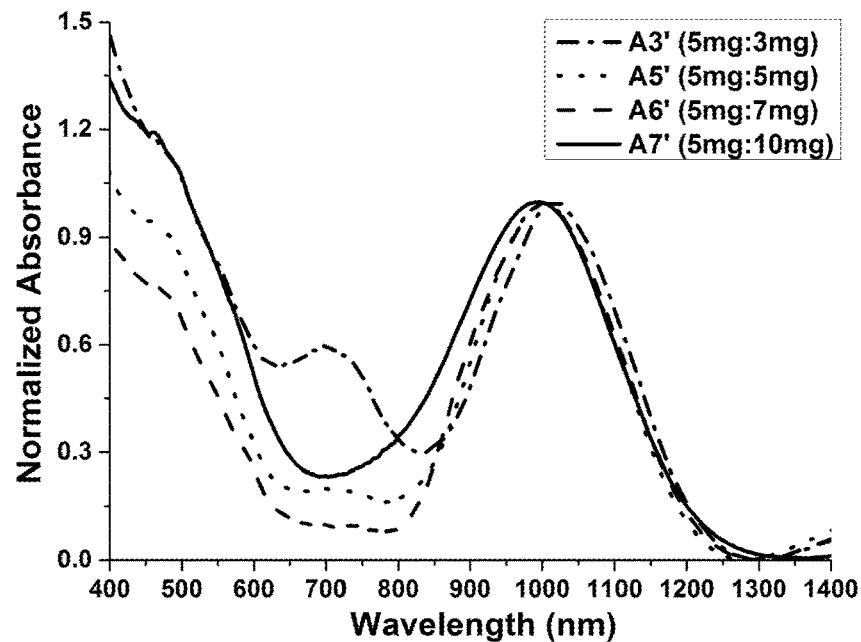
FIG. 2 shows the normalized UV-VIS spectra of compositions A-3', A-5', A-6' and A-7', all comprising semiconducting polymer removed semiconducting SWNTs, in solid state.

FIG. 2 shows the normalized UV-VIS spectra of compositions A-3', A-5', A-6', A-7' in solid state.

Metallic SWNTs absorb in the range of 600 to 850 nm. Semiconducting SWNTs absorb in the range of 900 to 1330 nm. FIG. 2 shows that that the absorption of compositions A-6' in the range of 600 to 850 nm is more decreased than to the absorption of A-3', A-5' and A-7' in this wavelength range. Thus, the dispersion of 5 mg of polymer Pc and 7 mg of arc-discharged SWNTs in 25 mL toluene yields the highest semiconducting SWNT/metallic SWNT ratio in the supernatant.

Raman spectra (Model: LabRam Aramis from Horiba Jobin Yvon) of composition A-6 (comprising semiconducting SWNTs and polymer Pc was carried out at 1.58 eV (785 nm) excitation at ×100 magnification and 1-μm spot size. The peak positions were calibrated with the Si line at 521 $cm^{-1}$.

For comparison, Raman spectra of pristine arc-discharged SWNTs (tradename "P2 SWNT" from Carbon Solutions Inc, Riverside, Calif.; 90% purity for SWNTs) and of polymer Pc were also recorded.

Figure 3:
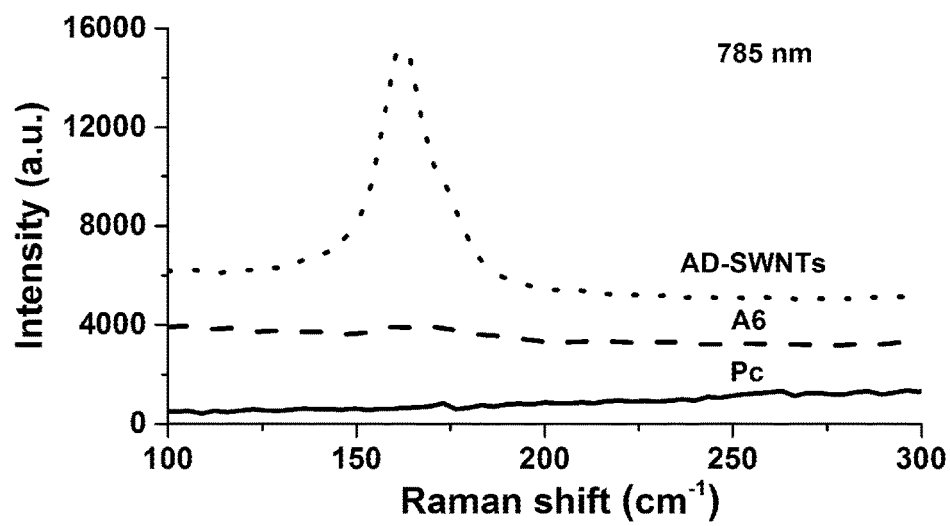
FIG. 3 shows the Raman spectra of composition A-6 comprising semiconducting SWNTs and polymer Pc., of pristine arc-discharged SWNTs (tradename "P2 SWNT" from Carbon Solutions Inc, Riverside, Calif.; 90% purity for SWNTs) and of polymer Pc at 785 nm excitation and 100 to 300 $cm^{-1}$ Raman shift.

FIG. 3 shows the Raman spectra of composition A-6, of pristine arc-discharged SWNTs (tradename "P2 SWNT" from Carbon Solutions Inc, Riverside, Calif.; 90% purity for SWNTs) and of polymer Pc at 785 nm excitation and 100 to 300 $cm^{-1}$ Raman shift.

FIG. 3 shows that under 785 nm excitation, a strong peak at 162 $cm^{-1}$ corresponding to radial breathing modes of metallic SWNTs was observed in pristine arc-discharged SWNTs, and that composition A-6 only shows a very, very weak peak at 162 $cm^{-1}$. The polymer Pc does not show any peak at 162 $cm^{-1}$. Thus, the ratio of semiconducting SWNT/metallic SWNT is higher in A-6 composition than in pristine arc-discharged SWNTs.

The Phospholuminescence excitation/emission (PLE) spectra on composition A-6 comprising semiconducting SWNTs and polymer Pc were taken on a home-built NIR-II spectroscopy setup with measured range of 1100-2100 nm. The excitation in the 700-1080 nm range was provided by a white-light source of an ozone-free Hg/Xe lamp (Oriel) with a total output power of 200 W. The lamp illumination was filtered by a UV filter (Thorlabs) to remove the ultraviolet light, and an 1100 nm short-pass filter (Omega) to remove the NIR-II light with wavelengths longer than 1100 nm. The excitation light cleaned by these filters was dispersed by a grating-based monochromator (Oriel), generating excitation lines at a single, user-designated wavelength with a bandwidth of 15 nm. The monochromatic excitation light was then focused onto a 1 mm path quartz cuvette (Starna Cells) with the SWNT solution loaded inside. The emitted fluorescence from the SWNT solution was collected in the transmission geometry, where the transmitted excitation light was rejected by an 1100-nm long-pass filter (Thorlabs). Fluorescence in the range of 1100-2100 nm was allowed to pass through the emission filter and was collected by a grating-based triple-turret spectrometer (Acton SP2300i) equipped with a one-dimensional (1D) indium-gallium-arsenide (InGaAs) linear array detector (Princeton Instruments 1D OMA-V). The raw PLE spectra were corrected after data acquisition, in order to account for the difference of excitation power at different wavelengths, the extinction profile of the emission filter, and the sensitivity profile of the 1D detector, using the MATLAB software.

Figure 4:
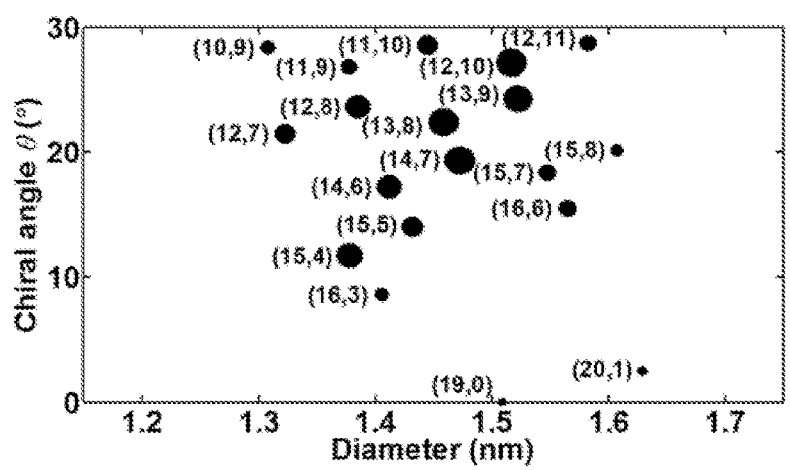
FIG. 4 shows a chiral angle (θ) versus diameter (d) map of the composition A-6 comprising semiconducting SWNTs and polymer Pc.
Figure 5:
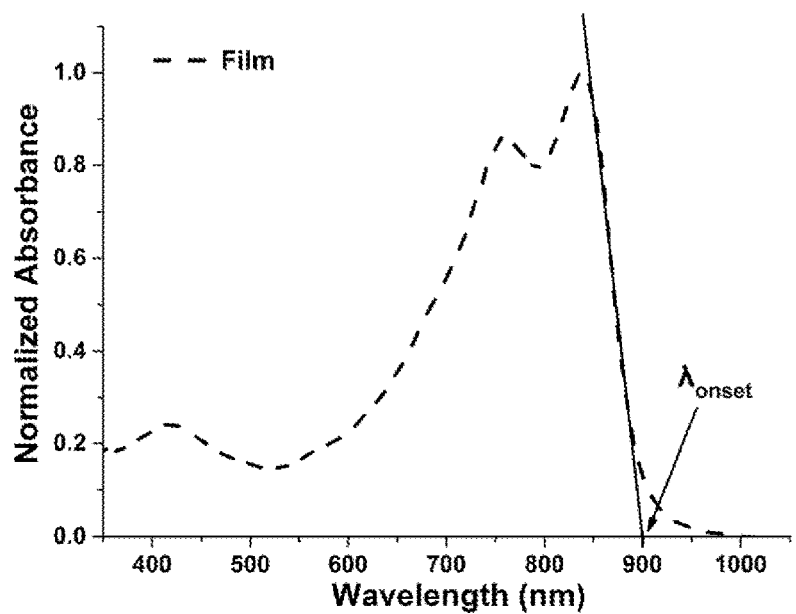
FIG. 5 illustrates how to determine the absorption onset (λ onset) of the semiconducting polymer from the thin film UV-Vis-NIR spectra of the semiconducting polymer at 25° C.

According to the PLE results, a chiral angle (θ) versus diameter (d) map is generated from the data. The map is shown in FIG. 4. Within the map, the circle areas are proportional to the concentration of the single semiconducting SWNT in the dispersion. FIG. 4 shows that the semiconducting SWNTs dispersed by polymer Pc have diameters in the range from 1.3 to 1.6 nm, with the majority of the semiconducting SWNTs dispersed by polymer Pc have diameters in the range of 1.4 to 1.5 nm.

Example 8

Preparation of an organic field effect transistor (OFET), wherein the semiconducting layer is formed from composition A-6 comprising semiconducting SWNTs and polymer Pc The drain and source electrodes for bottom-contact device electrodes were fabricated on a highly doped 4 inch silicon wafer with 300 nm $SiO_2$ by photolithography. A bilayer of Cr (3 nm) and Au (25 nm) was deposited by thermal evaporation as the source-drain electrodes, followed by a lift-off process in acetone. The substrate was then soaked in a diluted solution of composition A-6 comprising semiconducting SWNTs and polymer Pc prepared as described in example 7 (1:5 ratio is toluene) for 5 h, and then substrate was rinsed with toluene and annealed at 200° C. for 30 min under ambient conditions.

The evaluations of the OFET (L=100 µm, W=2000 µm) were carried out in atmosphere on a probe stage using a Keithley 4200 SCS as parameter analyzer. The carrier mobility, p, was calculated from the data in the saturated regime ($V_{DS}$=−40V). The OFET simultaneously demonstrate a high hole mobility of 41.2 $cm^2 V^{-1} s^{-1}$ and an on/off ratio of $3.6 \times 10^4$.

Example 9

Preparation of compositions comprising semiconducting SWNTs and polymer Pe 5 mg of polymer Pe and 5 mg, 7 mg, 8 mg, 10 mg, respectively, 12 mg of arc-discharged SWNTs (tradename "P2 SWNT" from Carbon Solutions Inc, Riverside, Calif.; 90% purity for SWNTs) were mixed in 25 mL of toluene and ultrasonicated for 30 min at an amplitude level of 70% (Cole Parmer ultrasonicator 750 W). The dispersion was then centrifuged at 17 000 rpm for 30 min at 16° C. (Sorvall RCSC-plus). The supernatants were collected and represent composition A-8, A-9, A-10, A-11 and A-12.

Composition A-8 comprises semiconducting SWNTs and polymer Pe, and is derived from the dispersion of 5 mg Pe and 5 mg arc-discharged SWNTs.

Composition A-9 comprises semiconducting SWNTs and polymer Pe, and is derived from the dispersion of 5 mg Pe and 7 mg arc-discharged SWNTs.

Composition A-10 comprises semiconducting SWNTs and polymer Pe, and is derived from the dispersion of 5 mg Pe and 8 mg arc-discharged SWNTs.

Composition A-11 comprises semiconducting SWNTs and polymer Pe, and is derived from the dispersion of 5 mg Pe and 10 mg arc-discharged SWNTs.

Composition A-12 comprises semiconducting SWNTs and polymer Pe, and is derived from the dispersion of 5 mg Pe and 12 mg arc-discharged SWNTs.

Compositions A-8, A-9, A-10, A-11 and A-12 were drop-casted on a glass substrate and annealed at 500° C. under Argon for 1 h in order to yield polymer-removed compositions A-8', A-9', A-10', A-11' and A-12'.

Composition A-8' comprises semiconducting SWNTs and is derived from composition A-8.

Composition A-9' comprises semiconducting SWNTs and is derived from composition A-9.

Composition A-10' comprises semiconducting SWNTs and is derived from composition A-10.

Composition A-11' comprises semiconducting SWNTs and is derived from composition A-11.

Composition A-12' comprises semiconducting SWNTs and is derived from composition A-12.

Figure 6:
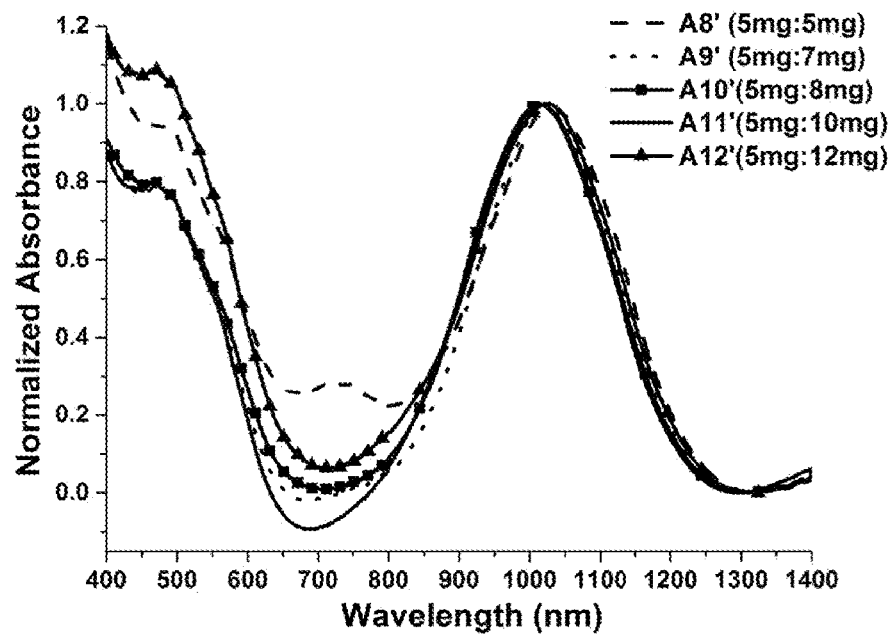
FIG. 6 shows the normalized UV-VIS spectra of compositions A-8', A-9', A-10', A-11' and A-12', all comprising semiconducting polymer removed semiconducting SWNTs, in solid state.

FIG. 6 shows the normalized UV-VIS spectra of compositions A-8', A-9', A-10', A-11' and A-12' in solid state.

Metallic SWNTs absorb in the range of 600 to 850 nm. Semiconducting SWNTs absorb in the range of 900 to 1330 nm. FIG. 6 shows that that the absorption of compositions A-11' in the range of 600 to 850 nm is more decreased than to the absorption of A-8', A-9', A-10' and A-12' in this wavelength range. Thus, the dispersion of 5 mg of polymer Pe and 10 mg of arc-discharged SWNTs in 25 mL toluene yields the highest semiconducting SWNT/metallic SWNT ratio in the supernatant.

Example 10

Preparation of an organic field effect transistor (OFET), wherein the semiconducting layer is formed from compositions A-8, A-9, A-10, A-11, respectively, A-12 comprising semiconducting SWNTs and polymer Pe The drain and source electrodes for bottom-contact device electrodes were fabricated on a highly doped 4 inch silicon wafer with 300 nm $SiO_2$ by photolithography. A bilayer of Cr (3 nm) and Au (25 nm) was deposited by thermal evaporation as the source-drain electrodes, followed by a lift-off process in acetone. Then, composition A-8, A-9, A-10, A-11, respectively, A-12 comprising semiconducting SWNTs and polymer Pe prepared as described in example 9 was deposited by solution shearing (slot-die coating) under ambient conditions. The composition (15 µL) was first sheared on the substrate at a speed of 0.05 mm/s. Then toluene (20 µL) was sheared on the substrate at a speed of 0.05 mm/s to remove most of the wrapped polymers. The two shearing processes were repeated for 5 times to achieve a dense SWNT. Finally, the substrate was rinsed with toluene, dried with nitrogen flow, and annealed at 150° C. for 30 min under ambient conditions.

The evaluations of the OFETs (L=20 µm or 30 µm) were carried out in atmosphere on a probe stage using a Keithley 4200 SCS as parameter analyzer. The carrier mobility, µ, was calculated from the data in the saturated regime ($V_{DS}$=−40V). The OFET simultaneously demonstrate high hole mobilities of about 41 to 57 $cm^2 V^{-1} s^{-1}$ and on/off ratios of about $10^3$ to $10^4$.

The device with the highest mobility of 57 $cm^2/Vs$ was obtained with composition A-11. The device had a channel length of 30 µm and a channel width of 600 µm, and the on/off ratio was $1.5 \times 10^3$.

Example 11
Preparation of Polymer Pf
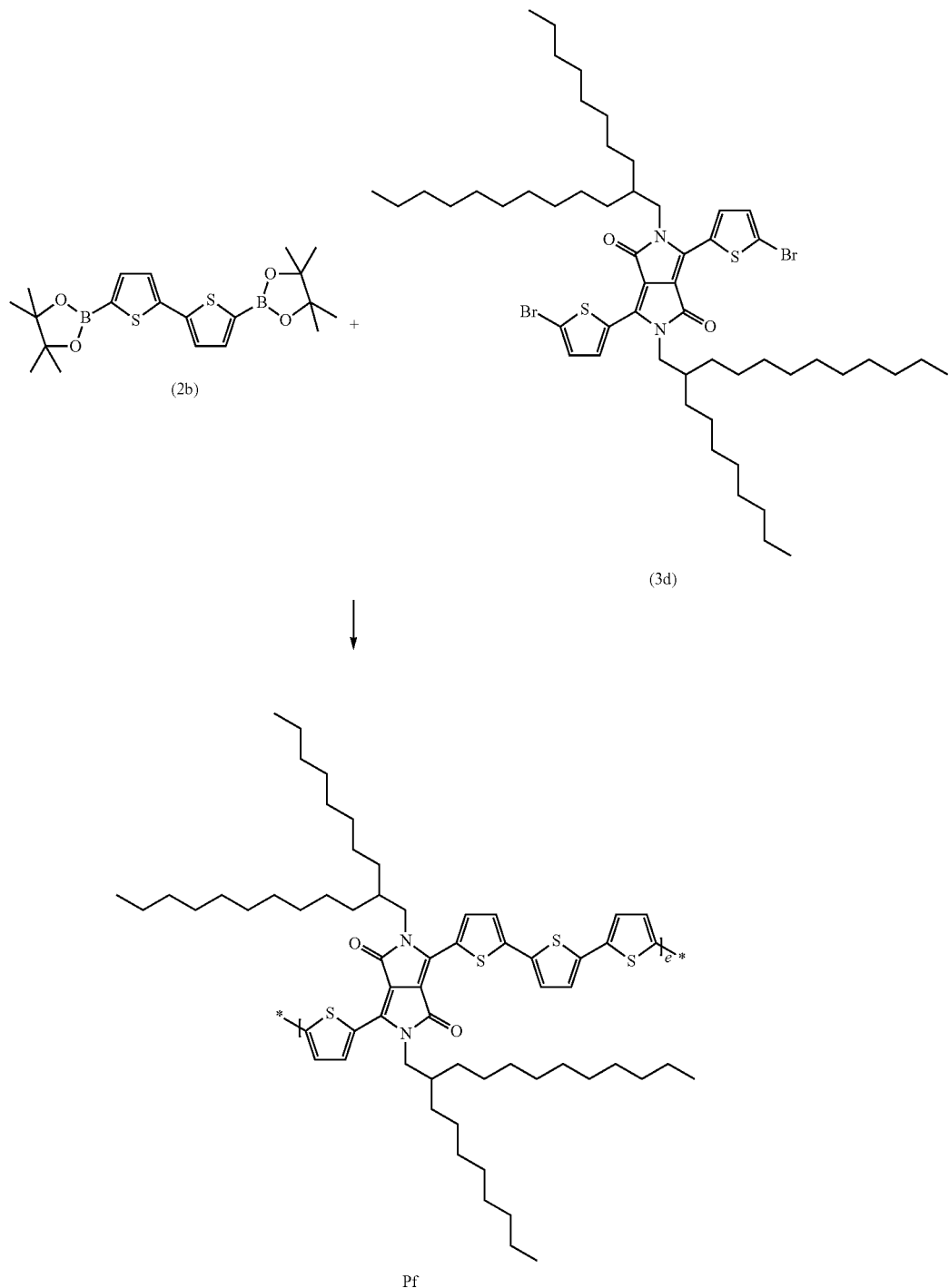
Polymer Pf was prepared in analogy to Polymer Pe in example 5, except that 821 mg (1.962 mmol) of compound 2b and 2000 mg (1.962 mmol) of compound 3d are used. GPC (1,2,4-trichlorobenzene, 150° C., polystyrene standard): $M_n$=13.2 kDa, $M_w$=26.7 kDa, PDI=2.03.

Example 12

Preparation of Polymer Pg

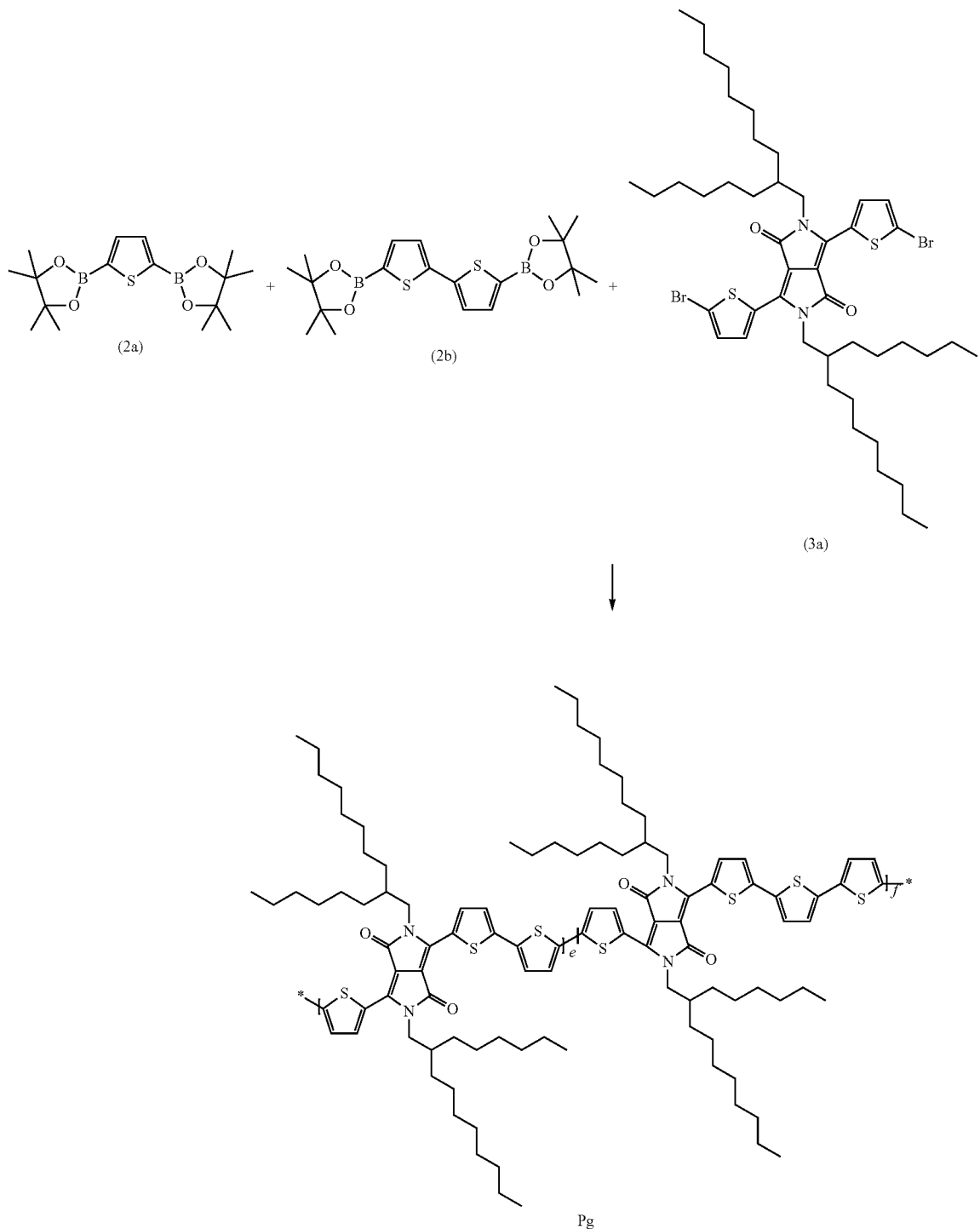

Polymer Pg was prepared in analogy to Polymer Pc in example 1, except that 1006 mg (2.9 mmol) of compound 2a and 137 mg (0.3 mmol) of compound 2b, and 2989 mg (3.2 mmol) of compound 3a are used. Polymer Pg is a random polymer. GPC (1,2,4-trichlorobenzene, 150° C., polystyrene standard): $M_n$=18.4 kDa, $M_w$=35.8 kDa, PDI=1.94.

Example 13

Preparation of Polymer pH

Polymer Ph was prepared in analogy to Polymer Pc in example 1, except that 602 mg (1.75 mmol) of compound 2a and 184 mg (0.4 mmol) of compound 2b, and 2011 mg (2.15 mmol) of compound 3a are used. Polymer Ph is a random polymer. GPC (1,2,4-trichlorobenzene, 150° C., polystyrene standard): $M_n$=24.5 kDa, $M_w$=54.7 kDa, PDI=1.99.

Example 14

Preparation of Polymer Pi

Polymer Pi was prepared in analogy to Polymer Pc in example 1, except that 465 mg (1.3 mmol) of compound 2a and 379 mg (0.9 mmol) of compound 2b, and 2067 mg (2.2 mmol) of compound 3a are used. Polymer Pi is a random polymer. GPC (1,2,4-trichlorobenzene, 150° C., polystyrene standard): $M_n$=16.4 kDa, $M_w$=31.1 kDa, PDI=1.90.

Example 15

Preparation of compositions comprising semiconducting SWNTs and Polymer Pf, Pg, pH, Respectively, Pi 5 mg of polymer Pf, Pg, Ph, Pi and 5 mg of arc-discharged SWNTs (tradename "P2-SWNT" from Carbon Solutions Inc, Riverside, Calif.; 90% purity for SWNTs) were mixed in 25 mL of toluene and ultrasonicated for 30 min at an amplitude level of 70% (Cole Parmer ultrasonicator 750 W). The dispersion was then centrifuged at 17 000 rpm for 30 min at 16° C. (Sorvall RCSC-plus). The supernatants were collected and represent composition A-13, A-14, A-15, respectively, A-16.

Composition A-13 comprises semiconducting SWNTs and polymer Pf.

Composition A-14 comprises semiconducting SWNTs and polymer Pg.

Composition A-15 comprises semiconducting SWNTs and polymer Ph.

Composition A-16 comprises semiconducting SWNTs and polymer Pi.

Compositions A-13, A-14, A-15 and A-16 were dropcasted on a glass substrate and annealed at 500° C. under Argon for 1 h in order to yield polymer-removed compositions A-13', A-14', A15' and A-16'.

Composition A-13' comprises semiconducting SWNTs and is derived from composition A-13.

Composition A-14' comprises semiconducting SWNTs and is derived from composition A-14.

Composition A-15' comprises semiconducting SWNTs and is derived from composition A-15.

Composition A-16' comprises semiconducting SWNTs and is derived from composition A-16.

For comparison, arc-discharged SWNTs (tradename "P2 SWNT" from Carbon Solutions Inc, Riverside, Calif.; 90% purity for SWNTs) dispersed in 1% sodium dodecylbenzenesulfonate (SDBS) aqueous solution was drop-casted on a glass substrate and annealed at 500° C. under Ar for 1 h in order to yield SDBS-removed arc-discharged SWNTs.

Figure 7:
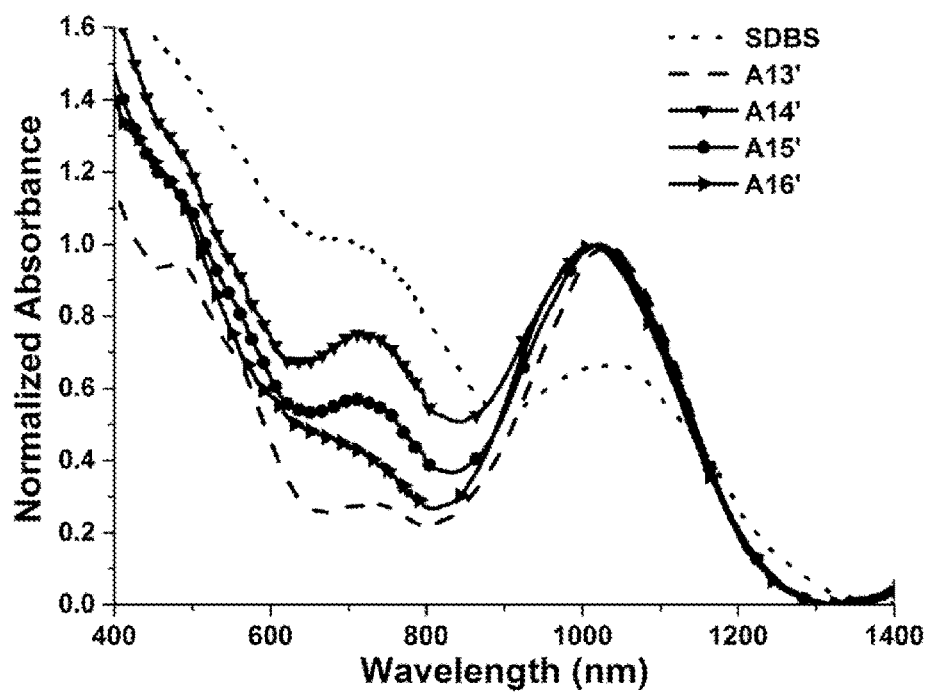
FIG. 7 shows the normalized UV-VIS spectra of compositions A-13', A-14', A-15' and A-16', all comprising semiconducting polymer removed semiconducting SWNTs, and the normalized UV-VIS spectra of SDBS-removed arc-discharged SWNTs in solid state.

FIG. 7 shows the normalized UV-VIS spectra of compositions A-13', A-14', A-15', A-16' and SDBS-removed arc-discharged SWNTs in solid state Metallic SWNTs absorb in the range of 600 to 850 nm. Semiconducting SWNTs absorb in the range of 900 to 1330 nm. FIG. 7 clearly shows that the absorption of compositions A-13', A14', A-15', A-16' in the range of 600 to 850 nm is decreased compared to the absorption of SDS-removed arc-discharged SWNTs in this wavelength range. FIG. 7 also shows that the absorption of compositions A-13', A-14', A-15', A-16' in the range of 900 to 1330 nm is increased compared to the absorption of SDS-removed arc-discharged SWNTs in this wavelength range. Thus, the ratio of semiconducting SWNT/metallic SWNT is higher in A-13', A-14', A-15', A-16' compositions than in SDBS-removed arc-discharged SWNTs. Composition A-13' shows the highest ratio of semiconducting SWNT/metallic SWNT.

The invention claimed is:

1. A process for preparing a composition A, the composition A comprising semiconducting single-walled carbon nanotubes, a semiconducting polymer, and solvent A, the process comprising:
    separating composition A from a composition B, the composition B comprising semiconducting and metallic single-walled carbon nanotubes, the semiconducting polymer, and solvent B,
    wherein the semiconducting polymer has a band gap in the range of 0.5 to 1.8 eV and solvent A and solvent B comprise an aromatic or heteroaromatic solvent,
    wherein the composition A comprises either essentially no metallic single-walled carbon nanotubes or, if metallic single-walled carbon nanotubes are present in the composition A, a weight ratio of the semiconducting single-walled carbon nanotubes to the metallic single-walled carbon nanotubes of the composition A is larger than a weight ratio of the semiconducting single-walled carbon nanotubes to the metallic single-walled carbon nanotubes of the composition B, and
    wherein a weight ratio of a sum of the semiconducting single-walled carbon nanotubes and the metallic single-walled carbon nanotubes to the semiconducting polymer in the composition B is in a range from 0.25:1 to 3:1.

2. The process of claim 1, wherein the semiconducting polymer has a hand gap in the range of 0.6 to 1.7 eV.

3. The process of claim 1, wherein the semiconducting polymer is a polymer comprising at least one unit of formula (1) or formula (5):

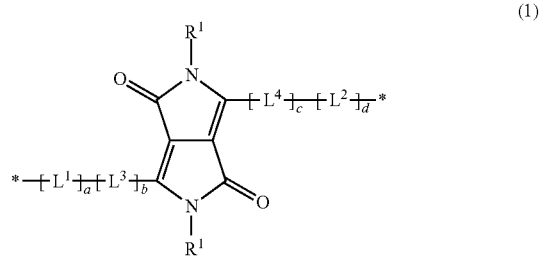

(1)

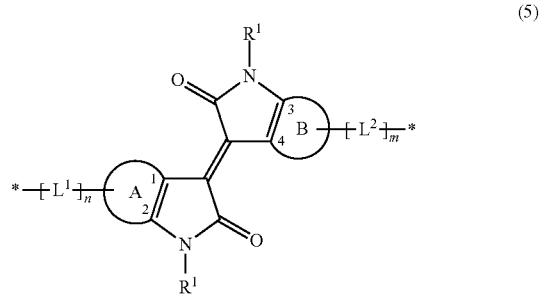

(5)

wherein b and c are independently from each other 1, 2, 3, 4, 5 or 6, a and d are independently from each other 0, 1, 2, 3 or 4, n and m are independently from each other 0, 1, 2, 3 or 4, $R^1$ is at each occurrence selected from the group consisting of H, $C_{1-100}$-alkyl, $C_{2-100}$-alkenyl, $C_{2-100}$-alkynyl, $C_{5-12}$-cycloalkyl, $C_{6-18}$-aryl, a 5 to 20 membered heteroaryl, $C(O)—C_{1-100}$-alkyl, $C(O)—C_{5-12}$-cycloalkyl and $C(O)—OC_{1-100}$-alkyl, wherein $C_{1-100}$-alkyl, $C_{2-100}$-alkenyl and $C_{2-100}$-alkynyl can be substituted with one to fourty substituents independently selected from the group consisting of $C_{5-8}$-cycloalkyl, $C_{6-14}$-aryl, 5 to 14 membered heteroaryl, $OR^a$, $OC(O)—R^a$, $C(O)—OR^a$, $C(O)—R^a$, $NR^aR^b$, $NR^a—C(O)R^b$, $C(O)—NR^aR^b$, $N[C(O)R^a][C(O)R^b]$, $SR^a$, $Si(R^{Sia})(R^{Sib})(R^{Sic})$, $—O—Si(R^{Sia})(R^{Sib})(R^{Sic})$, halogen, CN, and $NO_2$; and one or two $CH_2$-groups, but not adjacent $CH_2$-groups, of $C_{1-100}$-alkyl, $C_{2-100}$-alkenyl and $C_{2-100}$-alkynyl can be replaced by O or S, $C_{5-12}$-cycloalkyl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)—R^a$, $C(O)—OR^a$, $C(O)—R^a$, $NR^aR^b$, $NR^a—C(O)R^b$, $C(O)—NR^aR^b$, $N[C(O)R^a][C(O)R^b]$, $SR^a$, $Si(R^{Sia})(R^{Sib})(R^{Sic})$, $—O—Si(R^{Sia})(R^{Sib})(R^{Sic})$, halogen, CN, and $NO_2$; and one or two $CH_2$-groups, but not adjacent $CH_2$-groups, of $C_{5-12}$-cycloalkyl can be replaced by O, S, OC(O), CO, $NR^a$ or $NR^a—CO$, $C_{6-18}$-aryl and 5 to 20 membered heteroaryl can be substituted with one to six substituents independently selected from the group consisting of $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $OR^a$, $OC(O)—R^a$, $C(O)—OR^a$, $C(O)—R^a$, $NR^aR^b$, $NR^a—C(O)R^b$, $C(O)—NR^aR^b$, $N[C(O)R^a][C(O)R^b]$, $SR^a$, $Si(R^{Sia})(R^{Sib})(R^{Sic})$, $—O—Si(R^{Sia})(R^{Sib})(R^{Sic})$ halogen, CN, and $NO_2$, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $O—C_{1-60}$-alkyl, $O—C_{2-60}$-alkenyl, $O—C_{2-60}$-alkynyl, $O—C_{5-8}$-cycloalkyl, $O—C_{6-14}$-aryl, O-5 to 14 membered heteroaryl, $—[O—SiR^{Sid}R^{Sie}]_o—R^{Sif}$, $NR^5R^6$, halogen and $O—C(O)—R^5$, wherein o is an integer from 1 to 50, $R^{Sid}$, $R^{Sie}$, $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, 5 to 14 membered heteroaryl, $O—C_{1-60}$-alkyl, $O—C_{2-60}$-alkenyl, $O—C_{2-60}$-alkynyl, $O—C_{5-8}$-cycloalkyl, $O—C_{6-14}$-aryl, O-5 to 14 membered heteroaryl, $—[O—SiR^{Sig}R^{Sih}]_p—R^{Sii}$, $NR^{50}R^{60}$, halogen and $O—C(O)—R^{50}$;

wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, $O—C_{1-30}$-alkyl, $O—C_{2-30}$-alkenyl, $O—C_{2-30}$-alkynyl, $O—C_{5-6}$-cycloalkyl, $O—C_{6-10}$-aryl, O-5 to 10 membered heteroaryl, $O—Si(CH_3)_3$, $NR^{500}R^{600}$, halogen and $O—C(O)—R^{500}$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, $OR^c$, $OC(O)—R^c$, $C(O)—OR^c$, $C(O)—R^c$, $NR^cR^d$, $NR^c—C(O)R^d$, $C(O)—NR^cR^d$, $N[C(O)R^c][C(O)R^d]$, $SR^c$, $Si(R^{Sij})(R^{Sik})(R^{Sil})$, $—O—Si(R^{Sij})(R^{Sik})(R^{Sil})$, halogen, CN, and $NO_2$; and at least two $CH_2$-groups, but not adjacent $CH_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)—R^c$, $C(O)—OR^c$, $C(O)—R^c$, $NR^cR^d$, $NR^c—C(O)R^d$, $C(O)—NR^cR^d$, $N[C(O)R^c][C(O)R^d]$, $SR^c$, $Si(R^{Sij})(R^{Sik})(R^{Sil})$, $—O—Si(R^{Sij})(R^{Sik})(R^{Sil})$, halogen, CN, and $NO_2$; and one or two $CH_2$-groups, but not adjacent $CH_2$-groups, of $C_{5-8}$-cycloalkyl can be replaced by O, S, OC(O), CO, $NR^c$ or $NR^c—CO$, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, $OR^c$, $OC(O)—R^c$, $C(O)—OR^c$, $C(O)—R^c$, $NR^cR^d$, $NR^c—C(O)R^d$, $C(O)—NR^cR^d$, $N[C(O)R^c][C(O)R^d]$, $SR^c$, $Si(R^{Sij})(R^{Sik})(R^{Sil})$, $—O—Si(R^{Sij})(R^{Sik})(R^{Sil})$, halogen, CN and $NO_2$;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, $O—C_{1-30}$-alkyl, $O—C_{2-30}$-alkenyl, $O—C_{2-30}$-alkynyl, $O—C_{5-6}$-cycloalkyl, $O—C_{6-10}$-aryl, O-5 to 10 membered heteroaryl, $—[O—SiR^{Sim}R^{Sin}]_q—R^{Sio}$, $NR^7R^8$, halogen, and $O—C(O)—R^7$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, $O—C_{1-30}$-alkyl, $O—C_{2-30}$-alkenyl, $O—C_{2-30}$-alkynyl, $O—C_{5-6}$-cycloalkyl, $O—C_{6-10}$-aryl, O-5 to 10 membered heteroaryl, $—[O—SiR^{Sip}R^{Siq}]_r—R^{Sir}$, $NR^{70}R^{80}$, halogen, and $O—C(O)—R^{70}$;

wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, 5 to 10 membered heteroaryl, $O—C_{1-30}$- alkyl, O—$C_{2-30}$-alkenyl, O—$C_{2-30}$-alkynyl, O—$C_{5-6}$-cycloalkyl, O—$C_{6-10}$-aryl, O-5 to 10 membered heteroaryl, O—$Si(CH_3)_3$, $NR^{700}R^{800}$, halogen and O—C(O)—$R^{700}$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen, CN and $NO_2$, $L^1$ and are $L^2$ are independently from each other and at each occurrence selected from the group consisting of $C_{6-18}$-arylene, 5 to 20 membered heteroarylene,

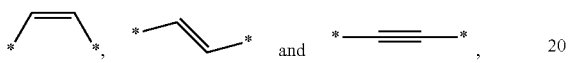

wherein $C_{6-18}$-arylene and 5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{31}$ OC(O)—$R^{31}$, C(O)—$OR^{31}$, C(O)—$R^{31}$, $NR^{31}R^{32}$, $NR^{31}$—C(O)$R^{32}$, C(O)—$NR^{31}R^{32}$, $N[C(O)R^{31}][C(O)R^{32}]$, $SR^{31}$, halogen, CN, $SiR^{Siv}R^{Siw}R^{Six}$ and OH, and wherein

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, C(O)—$R^{41}$, C(O)—$NR^{41}R^{42}$, C(O)—$OR^{41}$ and CN, wherein $R^{31}$, $R^{32}$, $R^{41}$ und $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and wherein $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^i$, OC(O)—$R^j$, C(O)—$OR^i$, C(O)—$R^i$, $NR^iR^j$, $NR^i$—C(O)$R^j$, C(O)—$NR^iR^j$, $N[C(O)R^i][C(O)R^j]$, $SR^i$, halogen, CN, $SiR^{Siv}R^{Siw}R^{Six}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^i$, OC(O)—$R^j$, C(O)—$OR^i$, C(O)—$R^i$, $NR^iR^j$, $NR^i$—C(O)$R^j$, C(O)—

$NR^iR^j$, $N[C(O)R^i][C(O)R^j]$, $SR^i$, halogen, CN, $SiR^{Siv}R^{Siw}R^{Six}$ and $NO_2$; and one or two $CH_2$-groups, but not adjacent $CH_2$-groups, of $C_{5-12}$-cycloalkyl can be replaced by O, S, OC(O), CO, $NR^i$ or $NR^i$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^i$, OC(O)—$R^j$, C(O)—$OR^i$, C(O)—$R^i$, $NR^iR^j$, $NR^i$—C(O)$R^j$, C(O)—$NR^iR^j$, $N[C(O)R^i][C(O)R^j]$, $SR^i$, halogen, CN, $SiR^{Siv}R^{Siw}R^{Six}$ and $NO_2$, wherein $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, wherein $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^k$, OC(O)—$R^l$, C(O)—$OR^k$, C(O)—$R^k$, $NR^kR^l$, $NR^k$—C(O)$R^l$, C(O)—$NR^kR^l$, $N[C(O)R^k][C(O)R^l]$, $SR^k$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, OC(O)—$R^l$, C(O)—$OR^k$, C(O)—$R^k$, $NR^kR^l$, $NR^k$—C(O)$R^l$, C(O)—$NR^kR^l$, $N[C(O)R^k][C(O)R^l]$, $SR^k$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^k$, OC(O)—$R^l$, C(O)—$OR^k$, C(O)—$R^k$, $NR^kR^l$, $NR^k$—C(O)$R^l$, C(O)—$NR^kR^l$, $N[C(O)R^k][C(O)R^l]$, $SR^k$, halogen, CN, and $NO_2$;

wherein $R^k$ and $R^l$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$, $L^3$ and are $L^4$ are independently from each other and at each occurrence selected from the group consisting of $C_{6-18}$-arylene and 5 to 20 membered heteroarylene wherein $C_{6-18}$-arylene and 5 to 20 membered heteroarylene can be substituted with one to six substituents $R^9$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{91}$, OC(O)—$R^{91}$, C(O)—$OR^{91}$, C(O)—$R^{91}$, $NR^{91}R^{92}$, $NR^{91}$—C(O)$R^{92}$, C(O)—$NR^{91}R^{92}$, $N[C(O)R^{91}][C(O)R^{92}]$, $SR^{91}$, halogen, CN, $SiR^{Siy}R^{Siz}R^{Siaa}$ and OH, and wherein R$^{91}$ and R$^{92}$ are independently from each other and at each occurrence selected from the group consisting of H, C$_{1-30}$-alkyl, C$_{2-30}$-alkenyl, C$_{2-30}$-alkynyl, C$_{5-12}$-cycloalkyl, C$_{6-18}$-aryl and 5 to 20 membered heteroaryl, and wherein C$_{1-30}$-alkyl, C$_{2-30}$-alkenyl and C$_{2-30}$-alkynyl can be substituted with one to ten substituents independently selected from the group consisting of C$_{5-8}$-cycloalkyl, C$_{6-14}$-aryl, 5 to 14 membered heteroaryl, OR$^m$, OC(O)—R$^m$, C(O)—OR$^m$, C(O)—R$^m$, NR$^m$R$^n$, NR$^m$—C(O)R$^n$, C(O)—NR$^m$R$^n$, N[C(O)R$^n$][C(O)R$^m$], SR$^n$, halogen, CN, SiR$^{Siy}$R$^{Siz}$R$^{Siaa}$ and NO$_2$; and at least two CH$_2$-groups, but not adjacent CH$_2$-groups of C$_{1-30}$-alkyl, C$_{2-30}$-alkenyl and C$_{2-30}$-alkynyl can be replaced by O or S, C$_{5-12}$-cycloalkyl can be substituted with one to six substituents independently selected from the group consisting of C$_{1-20}$-alkyl, C$_{2-20}$-alkenyl and C$_{2-20}$-alkynyl, C$_{5-8}$-cycloalkyl, C$_{6-14}$-aryl, 5 to 14 membered heteroaryl, OR$^m$, OC(O)—R$^m$, C(O)—OR$^m$, C(O)—R$^m$, NR$^m$R$^n$, NR$^m$—C(O)R$^n$, C(O)—NR$^m$R$^n$, N[C(O)R$^m$][C(O)R$^n$], SR$^m$, halogen, CN, SiR$^{Siy}$R$^{Siz}$R$^{Siaa}$ and NO$_2$; and one or two CH$_2$-groups, but not adjacent CH$_2$-groups, of C$_{5-12}$-cycloalkyl can be replaced by O, S, OC(O), CO, NR$^m$ or NR$^m$—CO, C$_{6-18}$-aryl and 5 to 20 membered heteroaryl can be substituted with one to six substituents independently selected from the group consisting of C$_{1-20}$-alkyl, C$_{2-20}$-alkenyl, C$_{2-20}$-alkynyl, C$_{5-8}$-cycloalkyl, C$_{6-14}$-aryl, 5 to 14 membered heteroaryl, OR$^m$, OC(O)—R$^m$, C(O)—OR$^m$, C(O)—R$^m$, NR$^m$R$^n$, NR$^m$—C(O)R$^n$, C(O)—NR$^m$R$^n$, N[C(O)R$^m$][C(O)R$^n$], SR$^m$, halogen, CN, SiR$^{Siy}$R$^{Siz}$R$^{Siaa}$ and NO$_2$, R$^{Siy}$, R$^{Siz}$, R$^{Siaa}$ are independently from each other selected from the group consisting of H, C$_{1-20}$-alkyl, C$_{2-20}$-alkenyl, C$_{2-20}$-alkynyl, C$_{5-6}$-cycloalkyl, phenyl and O—Si(CH$_3$)$_3$, wherein R$^m$ and R$^n$ are independently selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^o$, OC(O)—R$^o$, C(O)—OR$^o$, C(O)—R$^o$, NR$^o$R$^p$, NR$^o$—C(O)R$^p$, C(O)—NR$^o$R$^p$, N[C(O)R$^o$][C(O)R$^p$], SR$^o$, halogen, CN, and NO$_2$;

C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^o$, OC(O)—R$^o$, C(O)—OR$^o$, C(O)—R$^o$, NR$^o$R$^p$, NR$^o$—C(O)R$^p$, C(O)—NR$^o$R$^p$, N[C(O)R$^o$][C(O)R$^p$], SR$^o$, halogen, CN, and NO$_2$;

C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^o$, OC(O)—R$^o$, C(O)—OR$^o$, C(O)—R$^o$, NR$^o$R$^p$, NR$^o$—C(O)R$^p$, C(O)—NR$^o$R$^p$, N[C(O)R$^o$][C(O)R$^p$], SR$^o$, halogen, CN, and NO$_2$;

wherein

R$^o$ and R$^p$ are independently selected from the group consisting of H, C$_{1-10}$-alkyl, C$_{2-10}$-alkenyl and C$_{2-10}$-alkynyl, wherein C$_{1-10}$-alkyl, C$_{2-10}$-alkenyl and C$_{2-10}$-alkynyl can be substituted with one to five substituents selected from the group consisting of halogen, CN and NO$_2$, A is selected from the group consisting of

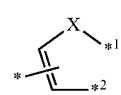
A1

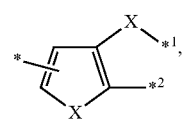
A2

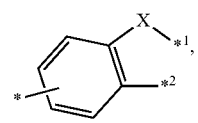
A3

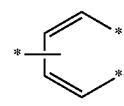
A4

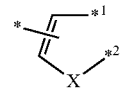
A5

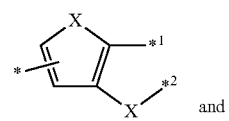
A6 and

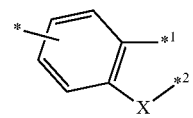
A7 and

B is selected from the group consisting of

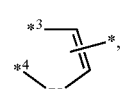
B1

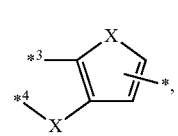
B2

-continued

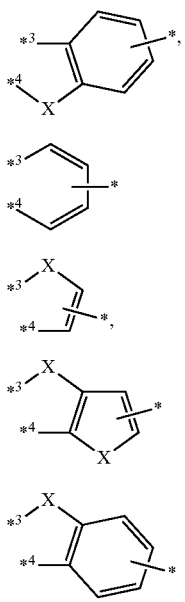

B3

B4

B5

B6

B7 wherein

X is at each occurrence O, S or $NR^1$,

A1, A2, A3, A4, A5, A6, A7, B1, B2, B3, B4, B5, B6 or B7 can be substituted with one to three substituents $R^2$, $R^2$ is at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl, 5 to 20 membered heteroaryl, $OR^{21}$, $OC(O)$—$R^{21}$, $C(O)$—$OR^{21}$, $C(O)$—$R^{21}$, $NR^{21}R^{22}$, $NR^{21}$—$C(O)R^{22}$, $C(O)$—$NR^{21}R^{22}$, $N[C(O)R^{21}][C(O)R^{22}]$, $SR^{21}$, halogen, CN, $SiR^{Sis}R^{Sit}R^{Siu}$ and OH, wherein $R^{21}$ and $R^{22}$ and are independently selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and one or two $CH_2$-groups, but not adjacent $CH_2$-groups, of $C_{5-12}$-cycloalkyl can be replaced by O, S, OC(O), CO, $NR^e$ or $NR^e$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$, $R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$, wherein $R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;

wherein $R^g$ and $R^h$ are independently selected from the group consisting of H, $C_{1-10}$-alkyl, $C_{2-10}$-alkenyl and $C_{2-10}$-alkynyl, wherein $C_{1-10}$-alkyl, $C_{2-10}$-alkenyl and $C_{2-10}$-alkynyl can be substituted with one to five substituents selected from the group consisting of halogen, CN and $NO_2$.

4. The process of claim 3, wherein $R^1$ is at each occurrence selected from the group consisting of $C_{1-100}$-alkyl, $C_{2-100}$-alkenyl and $C_{2-100}$-alkynyl, wherein $C_{1-100}$-alkyl, $C_{2-100}$-alkenyl and $C_{2-100}$-alkynyl can be substituted with one to forty substituents independently selected from the group consisting of $C_{5-8}$-cycloalkyl, $C_{6-14}$-aryl, 5 to 14 membered heteroaryl, $OR^a$, $OC(O)$—$R^a$, $C(O)$—$OR^a$, $C(O)$—$R^a$, $NR^a$—$C(O)R^b$, $C(O)$—$NR^aR^b$, $SR^a$, $Si(R^{Sia})(R^{Sib})(R^{Sic})$, —O—Si$(R^{Sia})(R^{Sib})(R^{Sic})$, halogen, and CN; and at least two $CH_2$-groups, but not adjacent $CH_2$-groups, of $C_{1-100}$-alkyl, $C_{2-100}$-alkenyl and $C_{2-100}$-alkynyl can be replaced by O or S, wherein $R^a$ and $R^b$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl and 5 to 14 membered heteroaryl, $R^{Sia}$, $R^{Sib}$ and $R^{Sic}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sid}$R$^{Sie}$]$_o$—R$^{Sif}$, wherein o is an integer from 1 to 50, $R^{Sid}$, $R^{Sie}$ and $R^{Sif}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, —[O—SiR$^{Sig}$R$^{Sih}$]$_p$—R$^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^5$, $R^6$, $R^{50}$, $R^{60}$, $R^{500}$ and $R^{600}$ are independently selected from the group consisting of H, $C_{1-60}$-alkyl, $C_{2-60}$-alkenyl, $C_{2-60}$-alkynyl, $C_{5-8}$-cycloalkyl, $C_{6-14}$-aryl, and 5 to 14 membered heteroaryl, $C_{1-60}$-alkyl, $C_{2-60}$-alkenyl and $C_{2-60}$-alkynyl can be substituted with one to twenty substituents selected from the group consisting of $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN; and at least two CH$_2$-groups, but not adjacent CH$_2$-groups, of $C_{1-60}$-alkyl, $C_{2-60}$-alkenyl and $C_{2-60}$-alkynyl can be replaced by O or S, $C_{5-8}$-cycloalkyl can be substituted with one to five substituents selected from the group consisting of $C_{1-30}$-alkyl, $C_{2-30}$-alkenyl, $C_{2-30}$-alkynyl, $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN; and one or two CH$_2$-groups, but not adjacent CH$_2$-groups, of $C_{5-8}$-cycloalkyl can be replaced by O, S, OC(O), CO, NR$^c$ or NR$^c$—CO, $C_{6-14}$-aryl and 5 to 14 membered heteroaryl can be substituted with one to five substituents independently selected from the group consisting of $C_{1-30}$-alkyl, $C_{2-30}$-alkenyl, $C_{2-30}$-alkynyl, $C_{5-6}$-cycloalkyl, $C_{6-10}$-aryl, OR$^c$, OC(O)—R$^c$, C(O)—OR$^c$, C(O)—R$^c$, NR$^c$—C(O)R$^d$, C(O)—NR$^c$R$^d$, SR$^c$, Si(R$^{Sij}$)(R$^{Sik}$)(R$^{Sil}$), —O—Si(R$^{Sij}$)(R$^{Sik}$)(R$^{Sil}$), halogen, and CN;

wherein $R^c$ and $R^d$ are independently selected from the group consisting of H, $C_{1-30}$-alkyl, $C_{2-30}$-alkenyl and $C_{2-30}$-alkynyl, $R^{Sij}$, $R^{Sik}$ and $R^{Sil}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sim}$R$^{Sin}$]$_q$—R$^{Sio}$, wherein q is an integer from 1 to 50, $R^{Sim}$, $R^{Sin}$, $R^{Sio}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sip}$R$^{Siq}$]$_r$—R$^{Sir}$, wherein r is an integer from 1 to 50, $R^{Sip}$, $R^{Siq}$, $R^{Sir}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^7$, $R^8$, $R^{70}$, $R^{80}$, $R^{700}$ and $R^{800}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

5. The process of claim 3, wherein $R^1$ is at each occurrence selected from the group consisting of $C_{1-50}$-alkyl, $C_{2-50}$-alkenyl and $C_{2-50}$-alkynyl, wherein $C_{1-50}$-alkyl, $C_{2-50}$-alkenyl and $C_{2-50}$-alkynyl can be substituted with one to twenty substituents independently selected from the group consisting of $C_{5-6}$-cycloalkyl, $C_{6-10}$-aryl, 5 to 10 membered heteroaryl, OR$^a$, SR$^a$, Si(R$^{Sia}$)(R$^{Sib}$)(R$^{Sic}$), —O—Si(R$^{Sia}$)(R$^{Sib}$)(R$^{Sic}$), halogen, and CN; and at least two CH$_2$-groups, but not adjacent CH$_2$-groups, of $C_{1-50}$-alkyl, $C_{2-50}$-alkenyl and $C_{2-50}$-alkynyl can be replaced by O or S, wherein $R^a$ and $R^b$ are independently selected from the group consisting of H, $C_{1-30}$-alkyl, $C_{2-30}$-alkenyl, $C_{2-30}$-alkynyl, $C_{5-6}$-cycloalkyl and $C_{6-10}$-aryl, $R^{Sia}$, $R^{Sib}$ and $R^{Sic}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sid}$R$^{Sie}$]$_o$—R$^{Sif}$, wherein o is an integer from 1 to 50, $R^{Sid}$, $R^{Sie}$, $R^{Sif}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, —[O—SiR$^{Sig}$R$^{Sih}$]$_p$—R$^{Sii}$, wherein p is an integer from 1 to 50, $R^{Sig}$ $R^{Sih}$, $R^{Sii}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, O—Si(CH$_3$)$_3$, $R^5$, $R^6$, $R^{50}$, $R^{60}$, $R^{500}$ and $R^{600}$ are independently selected from the group consisting of H, $C_{1-30}$-alkyl, $C_{2-30}$-alkenyl, $C_{2-30}$-alkynyl, $C_{5-6}$-cycloalkyl, $C_{6-10}$-aryl, and 5 to 10 membered heteroaryl, $C_{1-30}$-alkyl, $C_{2-30}$-alkenyl and $C_{2-30}$-alkynyl can be substituted with one to ten substituents selected from the group consisting of halogen and CN.

6. The process of claim 3, wherein $R^1$ is at each occurrence selected from the group consisting of $C_{1-36}$-alkyl, $C_{2-36}$-alkenyl and $C_{2-36}$-alkynyl, wherein $C_{1-36}$-alkyl, $C_{2-36}$-alkenyl and $C_{2-36}$-alkynyl can be substituted with one to twenty substituents independently selected from the group consisting of $C_{5-6}$-cycloalkyl, $C_{6-10}$-aryl, 5 to 10 membered heteroaryl, OR$^a$, SR$^a$, Si(R$^{Sia}$)(R$^{Sib}$)(R$^{Sic}$), —O—Si(R$^{Sia}$)(R$^{Sib}$)(R$^{Sic}$), halogen, and CN; and at least two CH$_2$-groups, but not adjacent CH$_2$-groups, of $C_{1-36}$-alkyl, $C_{2-36}$-alkenyl and $C_{2-36}$-alkynyl can be replaced by O or S, wherein $R^a$ and $R^b$ are independently selected from the group consisting of H, $C_{1-20}$-alkyl, $C_{2-20}$-alkenyl, $C_{2-20}$-alkynyl, $C_{5-6}$-cycloalkyl and $C_{6-10}$-aryl $R^{Sia}$, $R^{Sib}$ and $R^{Sic}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, —[O—SiR$^{Sid}$R$^{Sie}$]$_o$—R$^{Sif}$ wherein
  o is an integer from 1 to 50,
  $R^{Sid}$, $R^{Sie}$, $R^{Sif}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, —[O—SiR$^{Sig}$R$^{Sih}$]$_p$—R$^{Sii}$, wherein
  p is an integer from 1 to 50,
  $R^{Sig}$ $R^{Sih}$, $R^{Sii}$ are independently selected from the group consisting of H, $C_{1-30}$-alkyl, $C_{2-20}$-alkenyl, $C_{2-20}$-alkynyl, $C_{5-6}$-cycloalkyl, $C_{6-10}$-aryl, O—Si(CH$_3$)$_3$,
$R^5$, $R^6$, $R^{50}$, $R^{60}$, $R^{500}$ and $R^{600}$ are independently selected from the group consisting of H, $C_{1-20}$-alkyl, $C_{2-20}$-alkenyl, $C_{2-20}$-alkynyl, $C_{5-6}$-cycloalkyl, $C_{6-10}$-aryl, and 5 to 10 membered heteroaryl,
$C_{1-20}$-alkyl, $C_{2-20}$-alkenyl and $C_{2-20}$-alkynyl can be substituted with one to ten substituents selected from the group consisting of halogen and CN.

7. The process of claim 3, wherein
$L^1$ and $L^2$ are independently from each other and at each occurrence selected from the group consisting of 5 to 20 membered heteroarylene, and

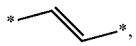, wherein
5 to 20 membered heteroarylene can be substituted with one to six substituents $R^3$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, OR$^{31}$, OC(O)—R$^{31}$, C(O)—OR$^{31}$, C(O)—R$^{31}$, NR$^{31}$R$^{32}$, NR$^{31}$—C(O)R$^{32}$, C(O)—NR$^{31}$R$^{32}$, SR$^{31}$, halogen, CN, SiR$^{Siv}$R$^{Siw}$R$^{Six}$ and OH, and
wherein

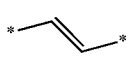

can be substituted with one or two substituents $R^4$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, C(O)—R$^{41}$, C(O)—NR$^{41}$R$^{42}$, C(O)—OR$^{41}$ and CN,
wherein
  $R^{31}$, $R^{32}$, $R^{41}$ und $R^{42}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and
  wherein
  $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, OR$^i$, OC(O)—R$^i$, C(O)—OR$^i$, C(O)—R$^j$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and at least two CH$_2$-groups, but not adjacent CH$_2$-groups of $C_{1-30}$-alkyl, $C_{2-30}$-alkenyl and $C_{2-30}$-alkynyl can be replaced by O or S,
  $C_{5-12}$-cycloalkyl can be substituted with one to six substituents independently selected from the group consisting of $C_{1-20}$-alkyl, $C_{2-20}$-alkenyl and $C_{2-20}$-alkynyl, $C_{5-8}$-cycloalkyl, $C_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$; and one or two CH$_2$-groups, but not adjacent CH$_2$-groups, of $C_{5-12}$-cycloalkyl can be replaced by O, S, OC(O), CO, NR$^i$ or NR$^i$—CO,
  $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, OR$^i$, OC(O)—R$^j$, C(O)—OR$^i$, C(O)—R$^i$, NR$^i$R$^j$, NR$^i$—C(O)R$^j$, C(O)—NR$^i$R$^j$, N[C(O)R$^i$][C(O)R$^j$], SR$^i$, halogen, CN, SiR$^{Siv}$R$^{Siw}$R$^{Six}$ and NO$_2$,
  wherein
  $R^{Siv}$, $R^{Siw}$, $R^{Six}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—Si(CH$_3$)$_3$,
  $R^i$ and $R^j$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
  wherein
    $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;
    $C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;
    $C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, OR$^k$, OC(O)—R$^l$, C(O)—OR$^k$, C(O)—R$^k$, NR$^k$R$^l$, NR$^k$—C(O)R$^l$, C(O)—NR$^k$R$^l$, N[C(O)R$^k$][C(O)R$^l$], SR$^k$, halogen, CN, and NO$_2$;
    wherein
    $R^k$ and $R^l$ are independently selected from the group consisting of H, $C_{1-10}$-alkyl, $C_{2-10}$-alkenyl and $C_{2-10}$-alkynyl,
    wherein
    $C_{1-10}$-alkyl, $C_{2-10}$-alkenyl and $C_{2-10}$-alkynyl can be substituted with one to five substituents selected from the group consisting of halogen, CN and NO$_2$, and
$L^3$ and are $L^4$ are independently from each other and at each occurrence 5 to 20 membered heteroarylene wherein
5 to 20 membered heteroarylene can be substituted with one to six substituents $R^9$ at each occurrence selected from the group consisting of $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, $OR^{91}$, $OC(O)$—$R^{91}$, $C(O)$—$OR^{91}$, $C(O)$—$R^{91}$, $NR^{91}R^{92}$, $NR^{91}$—$C(O)R^{92}$, $C(O)$—$NR^{91}R^{92}$, $SR^{91}$, halogen, CN, $SiR^{Siy}R^{Siz}R^{Siaa}$ and OH, and
wherein
$R^{91}$ and $R^{92}$ are independently from each other and at each occurrence selected from the group consisting of H, $C_{1-30}$-alkyl, $C_{2-30}$-alkenyl, $C_{2-30}$-alkynyl, $C_{5-12}$-cycloalkyl, $C_{6-18}$-aryl and 5 to 20 membered heteroaryl, and $C_{1-30}$-alkyl, $C_{2-30}$-alkenyl and $C_{2-30}$-alkynyl can be substituted with one to ten substituents independently selected from the group consisting of $C_{5-8}$-cycloalkyl, $C_{6-14}$-aryl, 5 to 14 membered heteroaryl, $OR'''$, $OC(O)$—$R'''$, $C(O)$—$OR'''$, $C(O)$—$R'''$, $NR'''R''$, $NR'''$—$C(O)R''$, $C(O)$—$NR'''R''$, $N[C(O)R''][C(O)R''']$, $SR'''$, halogen, CN, $SiR^{Siy}R^{Siz}R^{Siaa}$ and $NO_2$; and at least two $CH_2$-groups, but not adjacent $CH_2$-groups of $C_{1-30}$-alkyl, $C_{2-30}$-alkenyl and $C_{2-30}$-alkynyl can be replaced by O or S, $C_{5-12}$-cycloalkyl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR'''$, $OC(O)$—$R'''$, $C(O)$—$OR'''$, $C(O)$—$R'''$, $NR'''R''$, $NR'''$—$C(O)R''$, $C(O)$—$NR'''R''$, $N[C(O)R'''][C(O)R'']$, $SR'''$, halogen, CN, $SiR^{Siy}R^{Siz}R^{Siaa}$ and $NO_2$; and one or two $CH_2$-groups, but not adjacent $CH_2$-groups, of $C_{5-12}$-cycloalkyl can be replaced by O, S, OC(O), CO, $NR'''$ or $NR'''$—CO, $C_{6-18}$-aryl and 5 to 20 membered heteroaryl can be substituted with one to six substituents independently selected from the group consisting of $C_{1-20}$-alkyl, $C_{2-20}$-alkenyl, $C_{2-20}$-alkynyl, $C_{5-8}$-cycloalkyl, $C_{6-14}$-aryl, 5 to 14 membered heteroaryl, $OR'''$, $OC(O)$—$R'''$, $C(O)$—$OR'''$, $C(O)$—$R'''$, $NR'''R''$, $NR'''$—$C(O)R''$, $C(O)$—$NR'''R''$, $N[C(O)R'''][C(O)R'']$, $SR'''$, halogen, CN, $SiR^{Siy}R^{Siz}R^{Siaa}$ and $NO_2$, $R^{Siy}$, $R^{Siz}$, $R^{Siaa}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—$Si(CH_3)_3$,
wherein
$R'''$ and $R''$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl, $C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^o$, $OC(O)$—$R^o$, $C(O)$—$OR^o$, $C(O)$—$R^o$, $NR^oR^p$, $NR^o$—$C(O)R^p$, $C(O)$—$NR^oR^p$, $N[C(O)R^o][C(O)R^p]$, $SR^o$, halogen, CN, and $NO_2$;

$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, $OC(O)$—$R^o$, $C(O)$—$OR^o$, $C(O)$—$R^o$, $NR^oR^p$, $NR^o$—$C(O)R^p$, $C(O)$—$NR^oR^p$, $N[C(O)R^o][C(O)R^p]$, $SR^o$, halogen, CN, and $NO_2$;

$C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^o$, $OC(O)$—$R^o$, $C(O)$—$OR^o$, $C(O)$—$R^o$, $NR^oR^p$, $NR^o$—$C(O)R^p$, $C(O)$—$NR^oR^p$, $N[C(O)R^o][C(O)R^p]$, $SR^o$, halogen, CN, and $NO_2$;
wherein
$R^o$ and $R^p$ are independently selected from the group consisting of H, $C_{1-10}$-alkyl, $C_{2-10}$-alkenyl and $C_{2-10}$-alkynyl,
wherein
$C_{1-10}$-alkyl, $C_{2-10}$-alkenyl and $C_{2-10}$-alkynyl can be substituted with one to five substituents selected from the group consisting of halogen, CN and $NO_2$.

8. The process of claim 3, wherein
$L^1$ and $L^2$ are independently from each other and at each occurrence selected from the group consisting of 5 to 20 membered heteroarylene,
and

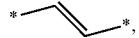

wherein 5 to 20 membered heteroarylene is selected from the group consisting of

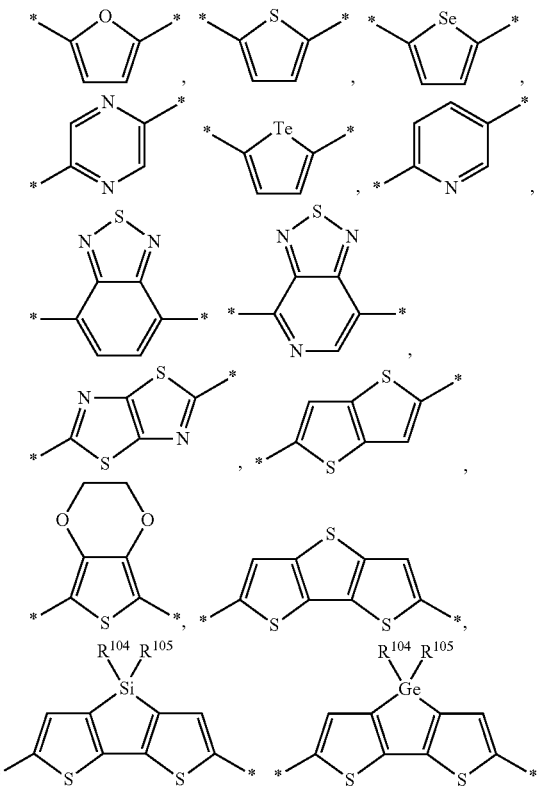

-continued

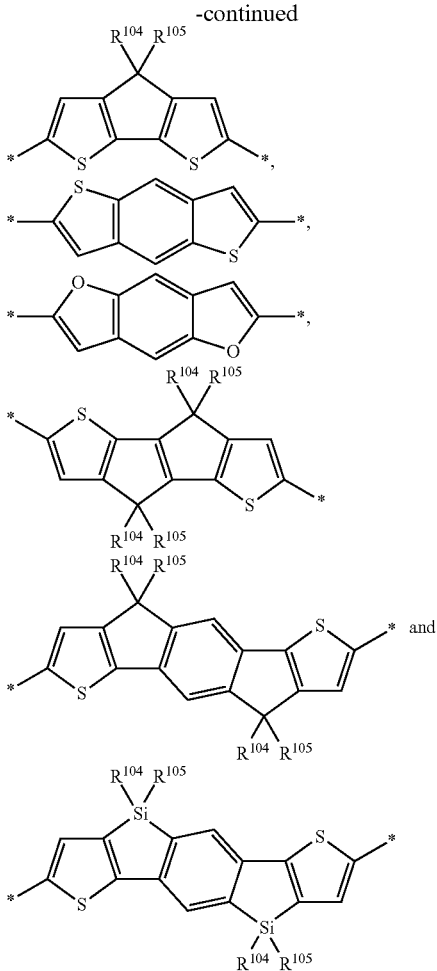

wherein
R$^{104}$ and R$^{105}$ are independently and at each occurrence selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, or R$^{104}$ and R$^{105}$, if attached to the same atom, together with the atom, to which they are attached, form a 5 to 12 membered ring system,
wherein
C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;
C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;
C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;
5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^o$, C(O)—NR$^u$R$^v$, N[C(O)R$^u$][C(O)R$^v$], SR$^u$, halogen, CN, and NO$_2$;
wherein
R$^u$ and R$^v$ are independently selected from the group consisting of H, C$_{1-10}$-alkyl, C$_{2-10}$-alkenyl and C$_{2-10}$-alkynyl,
wherein
C$_{1-10}$-alkyl, C$_{2-10}$-alkenyl and C$_{2-10}$-alkynyl can be substituted with one to five substituents selected from the group consisting of halogen, CN and NO$_2$,
wherein
5 to 20 membered heteroarylene can be substituted with one to four substituents R$^3$ at each occurrence selected from the group consisting of C$_{1-30}$-alkyl and halogen, and
wherein

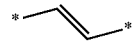

can be substituted with one or two substituents R$^4$ at each occurrence selected from the group consisting of C$_{1-30}$-alkyl, C(O)—R$^{41}$, C(O)—OR$^{41}$ and CN,
wherein
R$^{41}$ is at each occurrence C$_{1-30}$-alkyl, and
L$^3$ and are L$^4$ are independently from each other and at each occurrence 5 to 20 membered heteroarylene, wherein 5 to 20 membered heteroarylene is selected from the group consisting of

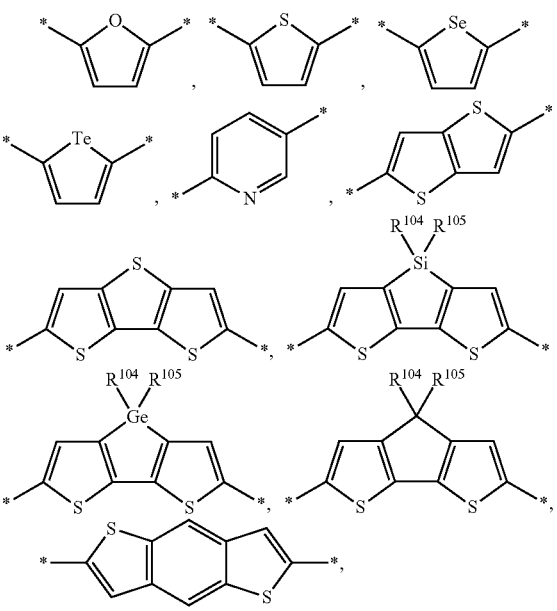

-continued

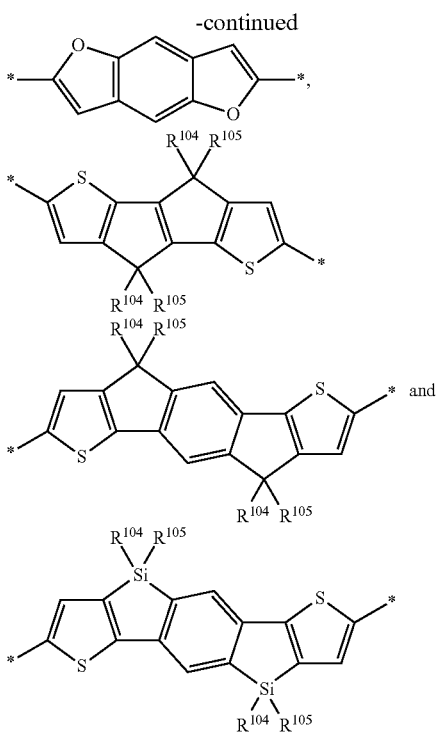

wherein
R$^{104}$ and R$^{105}$ are independently and at each occurrence selected from the group consisting of H, C$_{1-20}$-alkyl, C$_{2-20}$-alkenyl, C$_{2-20}$-alkynyl, C$_{5-8}$-cycloalkyl, C$_{6-14}$-aryl, and 5 to 14 membered heteroaryl, or R$^{104}$ and R$^{105}$, if attached to the same atom, together with the atom, to which they are attached, form a 5 to 12 membered ring system,
wherein
C$_{1-20}$-alkyl, C$_{2-20}$-alkenyl and C$_{2-20}$-alkynyl can be substituted with one to five substituents selected from the group consisting of C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;
C$_{5-8}$-cycloalkyl can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;
C$_{6-14}$-aryl and 5 to 14 membered heteroaryl can be substituted with one to five substituents independently selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;
5 to 12 membered ring system can be substituted with one to five substituents selected from the group consisting of C$_{1-10}$-alkyl, C$_{2-10}$-alkenyl, C$_{2-10}$-alkynyl, C$_{5-6}$-cycloalkyl, C$_{6-10}$-aryl, 5 to 10 membered heteroaryl, OR$^u$, OC(O)—R$^u$, C(O)—OR$^u$, C(O)—R$^u$, NR$^u$R$^v$, NR$^u$—C(O)R$^v$, C(O)—NR$^u$R$^v$, N[C(O)R$^u$][C(O)R$^v$], SR$^u$, halogen, CN, and NO$_2$;

wherein
R$^u$ and R$^v$ are independently selected from the group consisting of H, C$_{1-10}$-alkyl, C$_{2-10}$-alkenyl and C$_{2-10}$-alkynyl,
wherein
C$_{1-10}$-alkyl, C$_{2-10}$-alkenyl and C$_{2-10}$-alkynyl can be substituted with one to five substituents selected from the group consisting of halogen, CN and NO$_2$,
wherein
5 to 20 membered heteroarylene can be substituted with one to three substituents R$^9$ at each occurrence selected from the group consisting of C$_{1-30}$-alkyl and halogen.

9. The process of claim 3, wherein
L$^1$ and L$^2$ are independently from each other and at each occurrence selected from the group consisting of 5 to 20 membered heteroarylene,
and

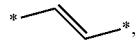

wherein 5 to 20 membered heteroarylene is selected from the group consisting of

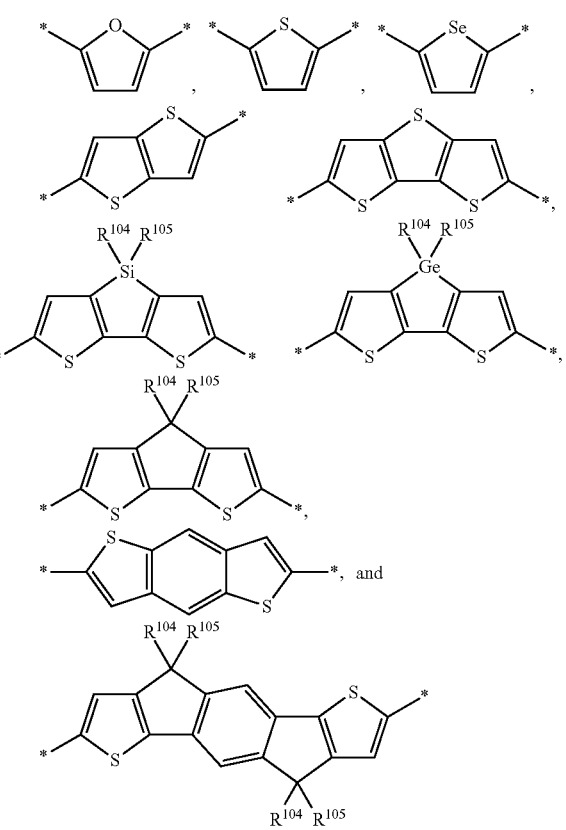

wherein
R$^{104}$ and R$^{105}$ are independently and at each occurrence selected from the group consisting of H and C$_{1-20}$-alkyl, wherein
5 to 20 membered heteroarylene can be substituted with one to four substituents $R^3$ at each occurrence selected from the group consisting of $C_{1-30}$-alkyl and halogen, and wherein

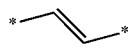

is unsubstituted, and $L^3$ and $L^4$ are independently from each other and at each occurrence 5 to 20 membered heteroarylene,
  wherein 5 to 20 membered heteroarylene is selected from the group consisting of

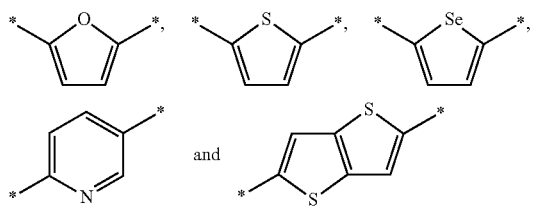

wherein
5 to 20 membered heteroarylene can be substituted with one substituent $R^9$ at each occurrence selected from the group consisting of $C_{1-30}$-alkyl and halogen.

10. The process of claim 3, wherein the semiconducting polymer is a polymer comprising at least one unit formula (5), wherein A is selected from the group consisting of

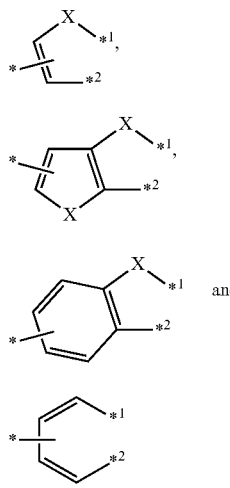

wherein
X is at each occurrence O, S or $NR^1$, and
A1, A2, A3 and A4 can be substituted with one to three substituents $R^2$, and B is selected from the group consisting of

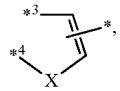
B1

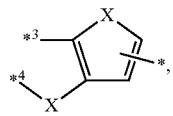
B2

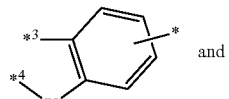
B3 and

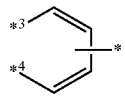
B4 wherein
X is at each occurrence O, S or $NR^1$, and
B1, B2, B3 and B4 can be substituted with one to three substituents $R^2$, and
$R^2$ is at each occurrence selected from the group consisting of $C_{1-30}$-alkyl and halogen,
wherein
$C_{1-30}$-alkyl can be substituted with one to ten substituents independently selected from the group consisting of $C_{5-8}$-cycloalkyl, $C_{6-14}$-aryl, 5 to 14 membered heteroaryl, $OR^e$, $OC(O)$—$R^e$, $C(O)$—$OR^e$, $C(O)$—$R^e$, $NR^eR^f$, $NR^e$—$C(O)R^f$, $C(O)$—$NR^eR^f$, $N[C(O)R^e][C(O)R^f]$, $SR^e$, halogen, CN, $SiR^{Sis}R^{Sit}R^{Siu}$ and $NO_2$; and at least two $CH_2$-groups, but not adjacent $CH_2$-groups, of $C_{1-30}$-alkyl can be replaced by O or S,
wherein
$R^{Sis}$, $R^{Sit}$ and $R^{Siu}$ are independently from each other selected from the group consisting of H, $C_{1-20}$-alkyl, $C_{2-20}$-alkenyl, $C_{2-20}$-alkynyl, $C_{5-6}$-cycloalkyl, phenyl and O—Si(CH$_3$)$_3$,
$R^e$ and $R^f$ are independently selected from the group consisting of H, $C_{1-20}$-alkyl, $C_{2-20}$-alkenyl, $C_{2-20}$-alkynyl, $C_{5-8}$-cycloalkyl, $C_{6-14}$-aryl, and 5 to 14 membered heteroaryl,
$C_{1-20}$-alkyl, $C_{2-20}$-alkenyl and $C_{2-20}$-alkynyl can be substituted with one to five substituents selected from the group consisting of $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$;
$C_{5-8}$-cycloalkyl can be substituted with one to five substituents selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, $NR^gR^h$, $NR^g$—$C(O)R^h$, $C(O)$—$NR^gR^h$, $N[C(O)R^g][C(O)R^h]$, $SR^g$, halogen, CN, and $NO_2$; $C_{6-14}$-aryl and 5 to 14 membered heteroaryl can be substituted with one to five substituents independently selected from the group consisting of $C_{1-10}$-alkyl, $C_{2-10}$-alkenyl, $C_{2-10}$-alkynyl, $C_{5-6}$-cycloalkyl, $C_{6-10}$-aryl, 5 to 10 membered heteroaryl, $OR^g$, $OC(O)$—$R^g$, $C(O)$—$OR^g$, $C(O)$—$R^g$, NR$^g$R$^h$, NR$^g$—C(O)R$^h$, C(O)—NR$^g$R$^h$, N[C(O)R$^g$][C(O)R$^h$], SR$^g$, halogen, CN, and NO$_2$;
wherein
R$^g$ and R$^h$ are independently selected from the group consisting of H, C$_{1-10}$-alkyl, C$_{2-10}$-alkenyl and C$_{2-10}$-alkynyl,
wherein
C$_{1-10}$-alkyl, C$_{2-10}$-alkenyl and C$_{2-10}$-alkynyl can be substituted with one to five substituents selected from the group consisting of halogen, CN and NO$_2$.

11. The process of claim 3, wherein the semiconducting polymer is a polymer comprising at least one unit formula (5), wherein
A is

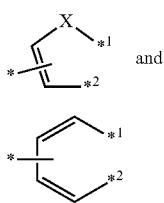

A1 and

A4 wherein
X is at each occurrence S or NR$^1$, and
A1 and A4 can be substituted with one to three substituents R$^2$, and
B is

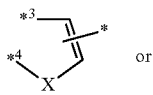

B1 or

-continued

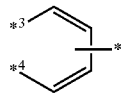

B4 wherein
X is at each occurrence S or NR$^1$, and
B1 and B4 can be substituted with one to three substituents R$^2$, and
R$^2$ is at each occurrence selected from the group consisting of unsubstituted C$_{1-30}$-alkyl and halogen.

12. The process of claim 3, wherein
b and c are independently from each other 1, 2, 3 or 4,
a and d are independently from each other 0, 1 or 2, and
n and m are independently from each other 0, 1 or 2.

13. The process of claim 3, wherein
b and c are independently from each other 1, 2 or 3,
a and d are independently from each other 0 or 1,
n is 0 or 1, and m is 0, 1 or 2.

14. A composition obtained by the process of claim 1.

15. A process for forming an electronic device, which process comprises
forming a layer by applying a composition A obtained by the process of claim 1 to a precursor of the electronic device.

16. An electronic device obtained by the process of claim 15.

17. The electronic device of claim 16, wherein the electronic device is an organic field-effect transistor (OFET).

18. A method of making a semiconducting layer, the method comprising:
depositing a composition A obtained by the process of claim 1 to a substrate; and
drying the composition.

* * * * *

UNITED STATES PATENT AND TRADEMARK OFFICE
CERTIFICATE OF CORRECTION

PATENT NO. : 10,388,881 B2
APPLICATION NO. : 15/503242
DATED : August 20, 2019
INVENTOR(S) : Zhenan Bao et al.

It is certified that error appears in the above-identified patent and that said Letters Patent is hereby corrected as shown below:

On the Title Page

Item (72), Inventors, Line 3, delete "Taipeh" and insert -- Taipei --;

Page 2, Column 1, item (56), Other Publications, Line 14, delete "quarterthiophene" and insert -- quaterthiophenes --;

In the Specification

Column 1, Line 20, delete "arc discharge" and insert -- arc-discharge --;

Column 1, Line 30, delete "diocylfluorenyl" and insert -- dioctylfluorenyl --;

Column 1, Line 39, delete "diocylfluorene" and insert -- dioctylfluorene --;

Column 1, Line 52, delete "dioctylfluoreneco-" and insert -- dioctylfluorene-co --;

Column 1, Line 54, delete "Misty," and insert -- Mistry, --;

Column 1, Line 58, delete "SNWTs" and insert -- SWNTs --;

Column 1, Line 61, delete "$C_{117,\ 18243}$-18250" and insert -- C117, 18243-18250 --;

Column 1, Line 64, delete "arc discharge" and insert -- arc-discharge --;

Column 2, Line 2, delete "fluorene-co-m-thiophene)" and insert -- fluorene-co-n-thiophene) --;

Column 2, Line 18, delete "transitors" and insert -- transistors --;

Signed and Sealed this
Thirteenth Day of October, 2020

Andrei Iancu
*Director of the United States Patent and Trademark Office*

CERTIFICATE OF CORRECTION (continued)
U.S. Pat. No. 10,388,881 B2

Column 2, Lines 37-38, delete "diketppyrrolopyrrole-quarterthiophene" and insert -- diketopyrrolopyrrole-quaterthiophene --;

Column 3, Line 15 (approx.), delete "1.5 eV" and insert -- 1.5 eV. --;

Column 3, Line 20, delete "substitutents" and insert -- substituents --;

Column 3, Line 42, delete "(anisol)," and insert -- (anisole), --;

Column 3, Line 51, delete "substitutents" and insert -- substituents --;

Column 4, Line 11 (approx.), delete "(anisol)," and insert -- (anisole), --;

Column 4, Line 12 (approx.), delete "isopropylbenzen" and insert -- isopropylbenzene --;

Column 4, Line 19, delete "(anisol)" and insert -- (anisole) --;

Column 4, Line 24, delete "(ansiol)" and insert -- (anisole) --;

Column 5, Line 11, delete "arc discharge," and insert -- arc-discharge, --;

Column 5, Lines 15-16, delete "arc discharge." and insert -- arc-discharge. --;

Column 5, Line 49, delete "(anisol)," and insert -- (anisole) --;

Column 5, Line 50, delete "isopropylbenzen" and insert -- isopropylbenzene --;

Column 5, Line 57, delete "(anisol)" and insert -- (anisole) --;

Column 5, Line 62, delete "(anisol)" and insert -- (anisole) --;

Column 6, Line 43, delete "$C_{6-15}$-aryl," and insert -- $C_{6-18}$-aryl, --;

Column 7, Line 35, delete "$R^{Sig}\ R^{Sih}$," and insert -- $R^{Sig}$, $R^{Sih}$, --;

Column 7, Line 38, after "heteroaryl," insert -- O-$C_{1-30}$-alkyl, --;

Column 7, Line 54, delete "($R^{Sil}$)halogen," and insert -- ($R^{Sil}$), halogen, --;

Column 7, Line 64, delete "($R^{Sil}$)halogen)," and insert -- ($R^{Sil}$), halogen, --;

Column 8, Line 11 (approx.), delete "$C_{1-30}$ -alkyl," and insert -- $C_{1-30}$-alkyl, --;

Column 8, Line 16 (approx.), delete "$C_{6-6}$" and insert -- $C_{5-6}$ --;

Column 8, Line 19, delete "O—$C_{6-6}$" and insert -- O—$C_{5-6}$ --;

Column 8, Line 20, after "heteroaryl," insert -- -[O-SiR$^{Sim}$R$^{Sin}$]$_q$-R$^{Sio}$ --;

Column 8, Line 26 (approx.), delete "C$_{6-6}$" and insert -- C$_{5-6}$ --;

Column 8, Line 29, delete "O—C$_{6-6}$" and insert -- O—C$_{5-6}$ --;

Column 8, Line 36 (approx.), delete "C$_{6-6}$" and insert -- C$_{5-6}$ --;

Column 8, Line 39, delete "O—C$_{6-6}$" and insert -- O—C$_{5-6}$ --;

Column 8, Line 44 (approx.), delete "C$_{6-6}$" and insert -- C$_{5-6}$ --;

Column 8, Line 51, delete "and are" and insert -- and --;

Column 9, Line 24, delete "R$^i$," and insert -- R$^j$, --;

Column 9, Line 34, delete "R$^i$," and insert -- R$^j$, --;

Column 10, Line 8, delete "C$_{2-10}$ alkenyl," and insert -- C$_{2-10}$-alkenyl, --;

Column 10, Line 15, after "H," insert -- C$_{1-10}$-alkyl --;

Column 10, Line 22, delete "and are" and insert -- and --;

Column 11, Line 2, delete "SiR$^{Siy}$,R$^{Siz}$, S$^{Siaa}$" and insert -- SiR$^{Siy}$R$^{Siz}$S$^{Siaa}$ --;

Column 11, Lines 59-62, structure Ar, delete " 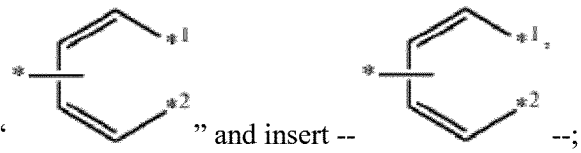 " and insert -- --;

Column 12, Lines 3-6 (approx.), structure A64, delete " 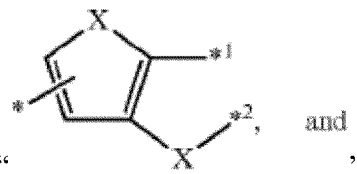 " and insert -- 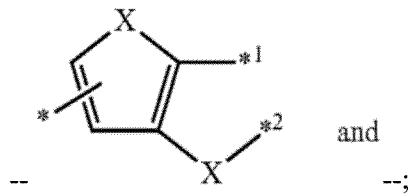 --;

Column 12, Lines 18-21 (approx.), structure B1, delete " 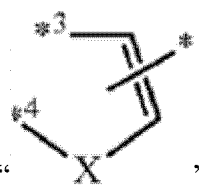 " and insert
-- 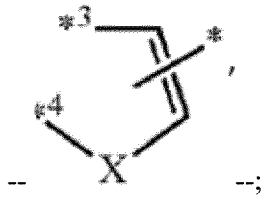 --;
Column 12, Lines 22-26 (approx.), structure B2, delete " 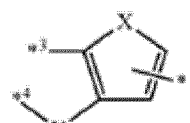 " and insert
-- 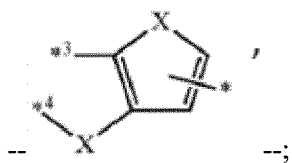 --;
Column 12, Lines 27-32 (approx.), structure B3, delete " 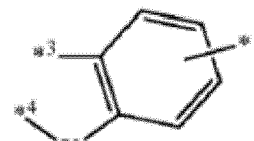 " and insert
-- 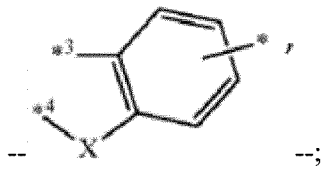 --;
Column 12, Lines 33-35 (approx.), structure B4, delete " 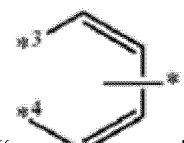 " and insert
-- 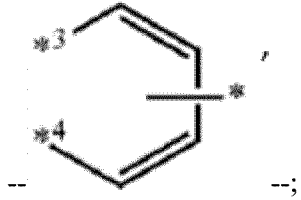 --;
Column 12, Lines 36-40 (approx.), delete "  " and insert -- --;

CERTIFICATE OF CORRECTION (continued)
U.S. Pat. No. 10,388,881 B2

Page 5 of 6

Column 12, Line 36 (approx.), delete "B45" and insert -- B5 --;

Column 12, Line 53 (approx.), delete "0," and insert -- O, --;

Column 12, Line 64, delete "and are" and insert -- and --;

Column 13, Line 62, delete "$C_{2-10}$ -alkenyl," and insert -- $C_{2-10}$-alkenyl, --;

Column 14, Line 21, delete "$C_{1-60}$" and insert -- $C_{1-50}$ --;

Column 14, Line 31, delete "docenyl." and insert -- dodecenyl. --;

Column 16, Lines 30-35 (approx.), delete " 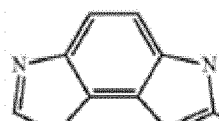 " and insert -- 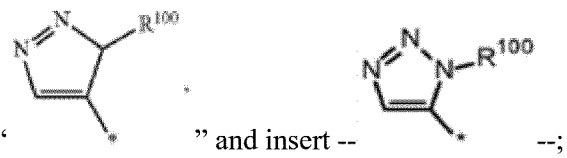 --;

Column 17, Lines 36-42 (approx.), delete " 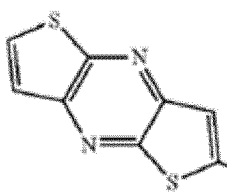 " and insert -- 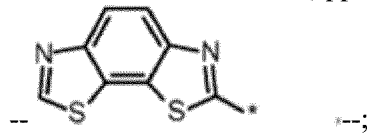 --;

Column 18, Lines 7-12 (approx.), delete " 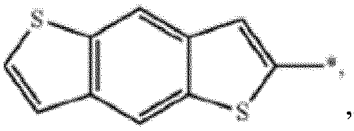 " and insert -- 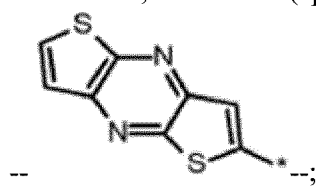 --;

Column 18, Lines 8-11 (approx.), delete " 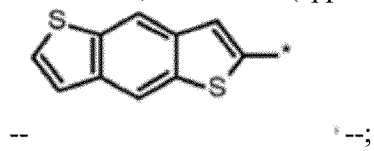 " and insert -- 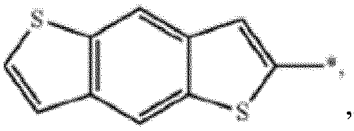 --;

Column 18, Lines 18-22 (approx.), delete " 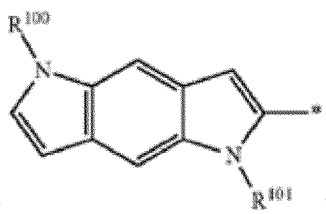 " and insert

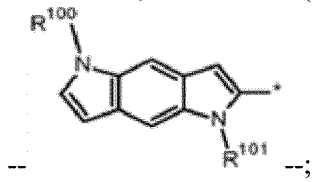 -- --;

Column 19, Lines 36-42 (approx.), delete " 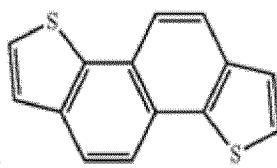 " and insert

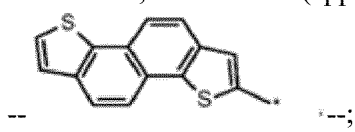 -- --;

Column 20, Lines 25-35, delete " 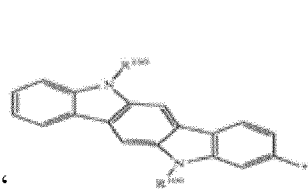 " and insert -- 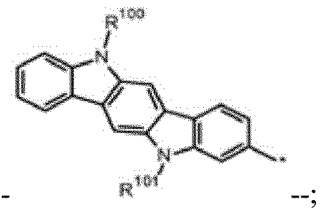 --;

Column 21, Line 19, delete "$C_{6-10}$ -aryl," and insert -- $C_{6-10}$-aryl, --;

Column 23, Line 10, delete "$C_{6-10}$ -aryl," and insert -- $C_{6-10}$-aryl, --;

Column 27, Lines 60-66, delete " 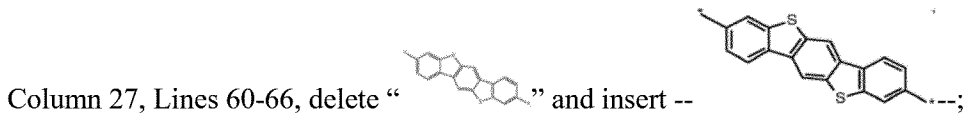 --;

Column 29, Line 4, delete "$C_{6-10}$ -aryl," and insert -- $C_{6-10}$-aryl, --;

Column 29, Line 60, delete "($R^{Sic}$)halogen" and insert -- ($R^{Sic}$), halogen --;

Column 30, Line 35, delete "$R^{Sig} R^{Sih}$" and insert -- $R^{Sig}$, $R^{Sih}$ --;

Column 30, Line 49, delete ") halogen," and insert -- -O-Si($R^{Sij}$)($R^{Sik}$)($R^{Sil}$), halogen, --.